US007428058B2

(12) United States Patent
Hill

(10) Patent No.: US 7,428,058 B2
(45) Date of Patent: Sep. 23, 2008

(54) APPARATUS AND METHOD FOR IN SITU AND EX SITU MEASUREMENTS OF OPTICAL SYSTEM FLARE

(75) Inventor: Henry A. Hill, Tucson, AZ (US)

(73) Assignee: Zetetic Institute, Tucson, AZ (US)

( * ) Notice: Subject to any disclaimer, the term of this patent is extended or adjusted under 35 U.S.C. 154(b) by 142 days.

(21) Appl. No.: 11/383,328

(22) Filed: May 15, 2006

(65) Prior Publication Data

US 2006/0285124 A1   Dec. 21, 2006

Related U.S. Application Data

(60) Provisional application No. 60/792,895, filed on Apr. 18, 2006, provisional application No. 60/789,386, filed on Apr. 5, 2006, provisional application No. 60/737,102, filed on Nov. 15, 2005, provisional application No. 60/714,258, filed on Sep. 6, 2005, provisional application No. 60/711,020, filed on Aug. 24, 2005, provisional application No. 60/682,216, filed on May 18, 2005.

(51) Int. Cl.
*G01B 9/02* (2006.01)
(52) U.S. Cl. ....................... 356/515; 356/521
(58) Field of Classification Search ................ 356/515, 356/520, 521
See application file for complete search history.

(56) References Cited

U.S. PATENT DOCUMENTS

| 4,264,569 A | 4/1981 | Sinha |
| 4,575,248 A | 3/1986 | Horwitz et al. |
| 4,624,569 A | 11/1986 | Kwon |

(Continued)

FOREIGN PATENT DOCUMENTS

EP   0849638   6/1998

(Continued)

OTHER PUBLICATIONS

D'Ariano et al. "Lower Bounds On Phase Sensitivity In Ideal And Feasible Measurements," *Phys. Rev* A 49, pp. 3022-3036 (1994).

(Continued)

*Primary Examiner*—Hwa (Andrew) S Lee
(74) *Attorney, Agent, or Firm*—Wilmer Cutler Pickering Hale & Dorr LLP

(57) ABSTRACT

Apparatus and methods for in situ and ex situ measurements of spatial profiles of the modulus of the complex amplitude and intensity of flare generated by an optical system. The in situ and ex situ measurements comprise interferometric and non-interferometric measurements that use an array of diffraction sites simultaneously located in an object plane of the optical system to increase signals related to measured properties of flare in a conjugate image plane. The diffraction sites generate diffracted beams with randomized relative phases. In general, the interferometric profile measurements employ phase-shifting point-diffraction interferometry to generate a topographical interference signal and the non-interferometric measurements are based on flare related signals other than topographic interference signals. The topographical interference signal and flare related signals are generated by a detector either as an electrical interference signal or electrical flare related signals or as corresponding exposure induced changes in a recording medium.

35 Claims, 26 Drawing Sheets

U.S. PATENT DOCUMENTS

| | | |
|---|---|---|
| 5,076,695 A | 12/1991 | Ichihara |
| 5,155,363 A | 10/1992 | Steinbichler et al. |
| 5,217,831 A | 6/1993 | White |
| 5,357,341 A | 10/1994 | Kuchel et al. |
| 5,367,404 A | 11/1994 | Hayata |
| 5,392,116 A | 2/1995 | Makosch |
| 5,398,113 A | 3/1995 | de Groot |
| 5,412,474 A | 5/1995 | Reasenberg et al. |
| 5,548,403 A | 8/1996 | Sommargren |
| 5,589,938 A | 12/1996 | Deck |
| 5,663,793 A | 9/1997 | De Groot |
| 5,760,901 A | 6/1998 | Hill |
| 5,777,741 A | 7/1998 | Deck |
| 5,883,717 A | 3/1999 | DiMarzio et al. |
| 5,915,048 A | 6/1999 | Hill |
| 6,100,978 A | 8/2000 | Naulleau et al. |
| 6,118,535 A * | 9/2000 | Goldberg et al. ............ 356/521 |
| 6,233,056 B1 * | 5/2001 | Naulleau et al. ............ 356/520 |
| 6,239,878 B1 | 5/2001 | Goldberg |
| 6,271,923 B1 | 8/2001 | Hill |
| 6,304,303 B1 | 10/2001 | Yamanaka |
| 6,331,368 B2 | 12/2001 | Dirksen et al. |
| 6,445,453 B1 | 9/2002 | Hill |
| 6,480,285 B1 | 11/2002 | Hill |
| 6,552,804 B2 | 4/2003 | Hill |
| 6,643,024 B2 | 11/2003 | Deck et al. |
| 6,847,452 B2 | 1/2005 | Hill |
| 6,906,780 B1 | 6/2005 | Smith |
| 6,940,602 B2 | 9/2005 | Dubois et al. |
| 6,963,390 B1 | 11/2005 | Smith et al. |
| 7,023,560 B2 | 4/2006 | Hill |
| 7,046,372 B2 | 5/2006 | Hill |
| 7,057,738 B2 | 6/2006 | Millerd et al. |
| 7,084,983 B2 | 8/2006 | Hill |
| 7,084,984 B2 | 8/2006 | Hill |
| 7,099,014 B2 | 8/2006 | Hill |
| 7,133,139 B2 | 11/2006 | Hill |
| 7,145,663 B2 | 12/2006 | Hill |
| 7,161,680 B2 | 1/2007 | Hill |
| 7,180,604 B2 | 2/2007 | Hill |
| 7,298,496 B2 | 11/2007 | Hill |
| 7,312,877 B2 | 12/2007 | Hill |
| 2003/0030819 A1 | 2/2003 | Kuechel |
| 2004/0227951 A1 | 11/2004 | Hill |
| 2004/0246486 A1 | 12/2004 | Hill |
| 2004/0257577 A1 | 12/2004 | Hill |
| 2005/0046864 A1 | 3/2005 | Millerd et al. |
| 2005/0111006 A1 | 5/2005 | Hill |
| 2005/0111007 A1 | 5/2005 | Hill et al. |
| 2005/0195500 A1 | 9/2005 | Hill |
| 2005/0254063 A1 | 11/2005 | Hill |
| 2006/0033924 A1 | 2/2006 | Hill |
| 2006/0050283 A1 | 3/2006 | Hill |
| 2006/0203253 A1 * | 9/2006 | Kato ........................ 356/521 |
| 2007/0014319 A1 | 1/2007 | Hill |
| 2007/0058174 A1 | 3/2007 | Hill |
| 2007/0012115 A1 | 5/2007 | Hill |

FOREIGN PATENT DOCUMENTS

| | | |
|---|---|---|
| EP | 0779528 | 1/2006 |
| WO | WO-02/090880 A1 | 11/2002 |
| WO | WO-02/090882 | 11/2002 |

OTHER PUBLICATIONS

Dresel et al. "Three-Dimensional Sensing of Rough Surfaces by Coherence Radar," *Applied Optics* 31, p. 919 (1992).

Hariharan, P. et al, "Digital phase-shifting interferometry: a simple error-compensating phase calculation algorithm," *Appl. Opt* 26 pp. 2504-2506 (1987).

International Search Report, International Application No. PCT/US06/18606, mailed Nov. 23, 2007 (2 pages).

International Search Report, International Application No. PCT/US06/31066, mailed Nov. 19, 2007 (2 pgs.)

International Search Report, International Application No. PCT/US06/44416, mailed Sep. 25, 2007 (3 pages).

Malacara, D, Ed. "Zernike Test and Its Relation to the Smartt Interferometer," *Optical Shop Testing*, 2nd Edition, Wiley p. 299-306 (1992).

Moers et al. "Application of the Aberration Ring Test (ARTEMIS™) To Determine Less Quality and Predict Its Lithographic Performance," *Optical Microlithography XIV*, C.J. Progler, Ed. Proceedings of SPIE vol. 4346 (2001) p. 1379.

Zanoni, C. "Differential Interferometer Arrangements For Distane And Angle Measurements: Principles, Advantages and Applications" *VDI Berichte* NR. 749, pp. 93-106 (1989).

* cited by examiner

APPARATUS AND METHOD FOR IN SITU AND EX SITU MEASUREMENTS OF OPTICAL SYSTEM FLARE

This application claims the benefit of U.S. Provisional Application No. 60/682,216, filed May 18, 2005; U.S. Provisional Application No. 60/711,020, filed Aug. 24, 2005; U.S. Provisional Application No. 60/714,258, filed Sep. 6, 2005; U.S. Provisional Application No. 60/737,102, filed Nov. 15, 2005; U.S. Provisional Application No. 60/789,386, filed Apr. 5, 2006; and U.S. Provisional Application No. 60/792,895, filed Apr. 18, 2006, all of which are incorporated herein by reference.

TECHNICAL FIELD

The invention relates generally to optical imaging systems and in situ and ex situ measurement of optical system flare during for example the manufacture of optical systems and the processing of multi-layer structures such as semiconductor wafers and integrated circuits (ICs) by a respective lithographic tool. Information obtained about the optical system flare may be used in manufacturing of the optical systems and in advanced process control (APC) for the in processing of wafers by a lithography tool.

BACKGROUND OF THE INVENTION

An optical system comprising one or more optical elements such as a projection lens system having a large number of lens elements, i.e. a projection optic (PO), is used in optical photolithographic projection systems which are known as wafer steppers or as wafer step-and-scanners. Such projection systems are used, for example, for manufacturing integrated circuits, or ICs. In a photolithographic projection system, a mask pattern present in the mask is imaged a large number of times, each time on a different area (IC area) of the substrate by means of a PO with a projection beam having a wavelength of, for example, 365 nm in the UV range or 248 nm in the deep UV range.

One technique for measuring aberrations of an optical system is point diffraction interferometry (PDI). The PDI is presented and described in articles by R. N. Smartt and J. Strong entitled "Point Diffraction Interferometer" *J. Opt. Soc. Amer.* 62, p 737 (1972) and by R. N. Smartt and W. H. Steel entitled "Theory And Application Of Point-Diffraction Interferometers," *Japan J. Applied Physics* 14, p 351 (1975) as an interferometer belonging to a class of interferometers that measures the variations of phase across a wavefront, is a common-path interferometer, and has the usual advantages of that class. The fringes are very stable against vibration and a white-light source can be used. Although not required for its coherence, a laser is a very useful source for the PDI since it overcomes the rather large loss of light therein. In such interferometers a coherent reference wave, usually a spherical or plane wave, is made to interfere with the wave being examined. The interference shows the variations of phase difference across the wavefronts as variations of the fringe position. The PDI produces its reference wave by diffraction of some of the light at a point discontinuity placed in the path of the beam that is being measured.

The wave being examined by a PDI is brought to a focus to produce an image, usually with aberrations, of a point source from which it came. An absorbing film placed in the focal plane has in it a diffracting point which can be either a small pinhole or a small opaque disk. The wave is transmitted through the film with reduced amplitude and, in addition, some light is diffracted by the diffracting point into a spherical wave. The usual adjustments of an interferometer are possible. A tilt can be produced between the wavefronts, in order to introduce straight fringes, by displacing the diffracting point laterally from the center of the image. A longitudinal displacement out of the focal plane introduces circular fringes.

The PDI is closely related to the phase-contrast test of Zernike in which a small diffraction disk introduces a $\pi/2$ phase shift between the corresponding diffracted and non-diffracted beams [see Section 8.5.1 entitled "Zernike Test and Its Relation to the Smartt Interferometer" in *Optical Shop Testing*, $2^{nd}$ Edition, D. Malacara, Ed., Wiley (1992)]. The test is used with no tilt and the $\pi/2$ phase shift increases the sensitivity to small phase variations by moving the position of zero phase away from the interference maximum. The Zernike phase-contrast test detects changes in an interferogram relative to an interferogram of an aberration free optical system.

The principle of the PDI has been applied to other forms of interferometers to obtain PDIs that are not common path interferometers such as described in U.S. Pat. No. 5,076,695 entitled "Interferometer" by Y. Ichihara and in U.S. Pat. No. 5,548,403 entitled "Phase Shifting Diffraction Interferometer" by G. E. Sommargren. Phase shifting (PS) is introduced in the PDI to create a phase-shifting point-diffraction interferometer (PS/PDI) such as described by Sommargren, supra, to enable the measurement of the interference signal component of the resulting interferograms.

In prior art PDI and PS/PDI, the primary measured quantity is related to the pupil or frequency response function of the optical system and the spatial impulse response or transmission function is not obtained or determined. As a consequence, measurements of the pupil function are made on a surface comprising an image of the pupil function which is displaced from an image plane of the optical system being measured. This feature of the prior art PDI and PS/PDI represents a disadvantage in applications where it is not practical to introduce the diffracting point and subsequent detection system of a PDI or PS/PDI in the image plane of the optical system.

Another disadvantage of PDI and PS/PDI as practiced in prior art is a weak signal because of the high absorption in the mask in order to obtain high fringe visibility.

Other methods used in prior art for detecting effects of certain aberrations of an optical system are based on an intra-field error map for the optical system as described in U.S. Pat. No. 6,906,780 entitled "Method And Apparatus For Self-Referenced Dynamic Step And Scan Intra-Field Lens Distortion" by A. Smith or based on the measurement of relative displacements of images of artifacts formed by an imaging system such as described in U.S. Pat. No. 6,963,390 B1 entitled "In-Situ Interferometer Arrangement" by A. H. Smith and R. O. Hunter, Jr.

A yet another method used in prior art for detecting imaging properties of an optical system comprises the steps of:
  arranging a test object in the object plane of the optical system;
  providing a resist layer in the image plane of the optical system;
  imaging the test object by means of the optical system and an imaging beam;
  developing the resist layer; and
  detecting ex situ the developed image by means of a scanning detection device having a resolution which may be comparable to or considerably larger than that of the optical system.

When the resolution of the scanning detection device is considerably larger than that of the optical system, the detection device allows observation of details which are considerably smaller than the details generated by the optical system.

The method of the prior art described above is known for example from EP 0 849 638 A2 by K. Kaise, T. Tsukakoshi, and T. Hayashi and U.S. Pat. No. 6,331,368 B2 by P. Dirksen and C. A. H. Juffermans relating to methods for measuring the in situ aberrations of the optical system in lithographic projection apparatus.

The aim of the photolithographic projection systems is to integrate an ever-increasing number of electronic components in an IC. To realize this, it is desirable to increase the surface area of an IC and to decrease the size of the components. For the optical system, this means that both the image field and the resolution must be increased so that increasingly smaller details, or line widths, can be imaged in a well-defined way in an increasingly larger image field. This requires an optical system which must comply with very stringent quality requirements. Despite the great care with which such an optical system has been designed and the great extent of accuracy with which the system is manufactured, such a system may still exhibit aberrations such as spherical aberration, coma, and astigmatism and in particular flare which are not admissible for the envisaged application. In practice, a lithographic optical system is thus not an ideal, diffraction-limited system but an aberration-limited and background-limited system.

Flare, also called scattered light or stray light, refers to all unnecessary light that comes through non-prescribed paths through the optical system. The source of flare varies and a common characterization is made by its area of influence, i.e. mid-range flare (MRF) and long-range flare (LRF). MRF includes light that scatters from a few millimeters to 100 mm from the pattern in concern. The density of the transparent area in a device will change the amount of scattered light at a certain position of the optical system field. This can lead to degradation of image contrast and CD uniformity or a redesign of optical proximity correction (OPC).

It has also been proposed to use for the projection beam a beam of extreme UV (EUV) radiation, i.e. radiation at a wavelength in the range of several nm to several tens of nm. The resolution of the optical system can thereby be enhanced considerably without increasing the numerical aperture (NA) of the system. Since no suitable lens material is available for EUV radiation, a mirror projection system instead of a lens projection system must then be used. A lithographic mirror optical system is described in, for example, EP 0 779 528 by D. M. Williamson. For reasons analogous to those for the lens projection system, there is a need for an accurate and reliable method of measuring in situ flare for this EUV mirror optical system as well.

The speed or throughput of a method used to measure in situ aberrations and flare may also limit the utility of the method. Low throughputs are associated with methods based on the ex situ measurement of developed images of a test mask formed in the resist layer. Also low throughput is associated with ex situ measurements when the developed image is scanned with a scanning detection device, e.g. a SEM such as described in an article entitled "Application Of The Aberration Ring Test (ARTEMIS™) To Determine Lens Quality And Predict Its Lithographic Performance" by M. Moers, H. van der Laan, M. Zellenrath, Wim de Boeij, N. Beaudry, K. D. Cummings, A. van Zwol, A. Becht, and R. Willekers in *Optical Microlithography XIV*, C. J. Progler, Ed., Proceedings of SPIE Vol. 4346 (2001), p 1379 and in cited U.S. Pat. No. 6,331,368 B2.

In cited EP 0 849 638, it is proposed to detect ex situ the developed image with optical means to address the laborious work otherwise required by technology that uses a complicated microscope such as a SEM. To this end, a test mask having one or more patterns of strips which are alternately radiation-transmissive and radiation-obstructive, i.e. an amplitude structure, is used. The comatic aberration of a projection system can be detected with such a pattern. The detection is based on measuring the widths of the light or dark strips in the image formed and/or measuring the asymmetry between the strips at the ends of the image of the patterns.

Several flare evaluation methods in which the system exposes and develops resist are widely known. Examples include determination of "dose to clear" using a certain resist, defining flare amount as the ratio of amount of dose increment required to achieve a predefined resist pattern shrinkage to the dose to clear in the transparent area [see J. P. Kirk, "Scattered Light in Photolithographic Lenses", *Proc. SPIE*, 2197, p 566 (1994) and E. Luce, B. Minghetti, P. Schiavone, O. Toublan and A. P. Weill, "Flare Impact on the Intrafield CD Control for Sub-0.25-μm Patterning," *Proc. SPIE*, 3679, p 368 (1999)], and the definition of the modulation transfer function (MTF) of flare as the spatial frequency properties of contrasts, based on dose of a grating to appear and the dose of the grating to clear, obtained from relatively large lines and spaces of several dimensions [see B. M. La Fontaine et al., "Flare and its Impact on Low-$k_1$ KrF and ArF Lithography," *Proc. SPIE*, 4691, p 44 (2002)]. These methods use relatively large doses. Another proposed method to determine flare and its effects on CD uniformity is through CD change measurements after a second "flare" exposure [see A. Bourov, L. Litt, and L. Zavyalova, "Impact of Flare on CD Variation for 248-nm and 193-nm Lithography Systems," *Proc. SPIE*, 4346, p 1388 (2001)].

In prior art wherein measurements are made of developed images, it must be recognized that the development of "latent images" in resist is a highly nonlinear process which can limit the utility of a method based on ex situ measurement of in situ aberrations and flare. In particular, the nonlinear process converts three-dimensional topographic information and flare related information contained in a latent image in undeveloped resist into two-dimensional shapes in developed resist in the plane of the wafer.

It is evident from the considerations above that there is an increasing need for a reliable and accurate method with a high throughput for in situ and ex situ measurement of flare in an optical system such as used in a lithographic tool.

SUMMARY OF THE INVENTION

Various embodiments of the present invention generate in situ and ex situ measurements of the spatial profiles of the modulus of the complex amplitude and intensity of flare generated by an optical system. The in situ and ex situ measurements comprise interferometric and non-interferometric measurements that use an array of diffraction sites simultaneously located in an object plane of the optical system to increase the signals related to measured properties of flare in a conjugate image plane. The diffraction sites generate diffracted beams with randomized relative phases. For the interferometric profile measurements of the modulus of the complex amplitude and intensity of the flare, various embodiments of the present invention use PS/PDI to generate a topographical interference signal that is related to the conjugated quadratures of the complex flare amplitude. The non-interferometric profile measurements of the intensity of flare are based on flare related signals other than topographic interference signals. The acquisition of information about the conjugated quadratures of the complex amplitude of flare is based on an adaptation of PS/PDI to making measurements of interference signals in a conjugate image plane of the optical system.

In contrast to prior art PS/PDI techniques, interferometric profile measurements of flare used in various embodiments of the present invention use a test object comprising an array of one or more diffraction sites placed simultaneously in the object plane of an optical system under test to generate the in situ topographic interference signals. The topographic interference signals are related to the conjugated quadratures of the complex amplitude profile of the flare. The function of the optical system in certain embodiments of the present invention is to provide reference and measurement beam paths of an interferometer with either a detector such as a photon detector, e.g., a CCD, or exposure induced changes in properties of a recording medium, e.g. a photoresist, photorefractive medium or a photographic medium, serving as the detector. Reference and measurement beams are generated by a test object comprising the array of diffraction sites which serves as a beam-splitter in the interferometer. In certain other embodiments of the present invention wherein interferometric profile measurements of flare of an optical system are made, the optical system provides a measurement beam path of an interferometer. The source of the beam for the interferometers of the certain and of the certain other embodiments may be the same source used by a corresponding lithographic projection system in writing to wafers or a different source compatible with operation of the optical system where appropriate test objects can be generated.

For yet certain other embodiments of the present invention, an array of one or more diffraction sites placed in an object plane of an optical system under test is used to obtain non-interferometric profile measurements of the intensity of flare. The source of the beam for the yet certain other embodiments may be the same source used by a corresponding lithographic projection system in writing to wafers or a different source compatible with operation of the optical system where appropriate test objects can be generated. Flare related signals obtained in the non-interferometric profile measurements are recorded with either a detector such as a photon detector, e.g., a CCD, or exposure induced changes in properties of a recording medium, e.g. a photoresist, photorefractive medium or a photographic medium, serving as the detector.

Continuing with the description of the certain and certain other embodiments, reference and measurement beams are generated such that the complex amplitude of the reference beam at a detector plane is not sensitive to the aberrations and has a relatively small sensitivity to flare and displacements of the optic axis of the optical system while the complex amplitude of the image of the test object subsequently formed from the measurement beam by the optical system at the detector plane is sensitive to flare of the optical system. The topographic interference signal is generated by a detector either as an electrical interference signal or in one or more properties of a recording medium as a result of exposure induced changes in the recording medium that is substantially linear over a useful domain of the complex amplitude of the optical system generated flare.

Information about the conjugated quadratures of effects of the in situ complex amplitude profiles of the optical system flare is obtained from in situ or ex situ measurement of the topographic interference signal. The changes in properties produced by exposure induced changes in a recording medium corresponding to the topographic interference signal are measured either in situ or ex situ by an interferometric technique or ex situ by techniques such as an AFM or an SEM.

The certain and the certain other embodiments of the present invention exhibit enhanced sensitivity with respect to acquisition of information about the modulus of the complex amplitude and intensity profiles of optical system flare. The enhancement is a consequence of the use of an interferometric-technique to generate the topographic interference signal related to the complex amplitude of the optical system flare and the use of an array of diffraction sites located simultaneously in an object space of the optical system wherein the diffraction sites generate diffracted beams with randomized relative phases. The yet certain other embodiments of the present invention also exhibit an enhanced sensitivity with respect to measurement of the intensity profile of optical system flare. The enhancement for the yet certain other embodiments is a consequence of the use of techniques to enhance the effects of the intensity of the optical system flare in a recorded signal and the use of an array of diffraction sites located simultaneously in an object space of the optical system wherein the diffraction sites generate diffracted beams with randomized relative phases. The recorded signal may be either generated by a photon detector, e.g., a CCD, or exposure induced changes in a recording medium.

The topographic interference signal and flare related signals that are recorded in a recording medium are generated by exposure induced changes of chemical composition through induced chemical reactions with corresponding changes in refractive index, density and/or thickness of photoresist (resist) or photographic medium with or without post exposure treatment and by exposure induced changes in charge distributions in photorefractive media which in turn alters the refractive index by virtue of the (Pockels) electro-optic effect, i.e. the photorefractive effect. The topographic interference signals and the flare related signals generated in the non-interferometric measurements of flare that are recorded in a recording medium are measured using interferometric metrology systems and interferometric imaging metrology systems operating in the IR to VUV and EUV The yet certain other embodiments of the present invention that use a recording medium to record the flare related signals also exhibit enhanced sensitivity by the use of an anti-reflecting (AR) overcoat layer so as to make it possible to interferometrically detect changes in exposure induced changes in recording media operating in a dark field mode. In the certain, the certain other, and the yet certain other embodiments of the present invention, fluorescent screens or arrays of fluorescent spots may be used in the detection of beams, e.g., UV, VUV, as EUV beams, such as described in commonly owned U.S. Provisional Patent Application No. 60/506,715 (ZI-56) and U.S. patent application Ser. No. 11/231,544 (ZI-56) wherein both are to Henry A. Hill and entitled "Catoptric Imaging Systems Comprising Pellicle Beam-Splitters and Non-Adaptive and/or Adaptive Catoptric Surfaces." The contents of the provisional patent application and the patent application are herein incorporated in their entirety by reference.

Bleaching or changes of the imaginary part of the refractive index, changes in the real part of the refractive index, changes in the density, and changes in the thickness of a resist layer on exposure are well known phenomena which occur in many resists such as described in articles by A. Erdmann, C. Henderson, and C. G. Willson, *J. Appl. Phys.* 89, p 8163 (2001) entitled "Impact of exposure induced refractive index changes of photoresists on the photolithographic process," by H.-K. Oh, Y.-S. Sohn, M.-G. Sung, Y.-M. Lee, E.-M. Lee, S.-H. Byun, I. An, K.-S. Lee, and I. -H. Park, *Advances in Resist Technology and Processing XVI*, Proceedings of SPIE 3678, p 643 (1999) entitled "Refractive Index Change during Exposure for 193 nm Chemically Amplified Resist," and by A. Kewitsch and A. Yariv, *Appl. Phys. Lett.* 68, p 455 (1996). Erdmann, Henderson, and Willson report for example that the change on exposure of the real part of the refractive index in a series of diazonaphthoquinone-novolac (DNQ-novolac) resists can be both positive and negative and could take on values as large as 0.05. Similar changes of the imaginary part of the refractive index on exposure of resist are also reported. Changes in the density are noted for example in the cited article by Kewitsch and Yariv and changes in the thickness of resist on exposure are described for example in cited article by H.-K. Oh et al.

Exposure induced changes in photorefractive media exhibit photoconductive and electro-optic behavior, and have the ability to detect and store spatial distributions of optical intensity in the form of spatial patterns of altered refractive index. Photoinduced charges create a space-charge distribution that produces an internal electric field, which, in turn, alters the refractive index by virtue of the (Pockels) electro-optic effect. The material can be brought back to its original state (erased) by illumination with uniform light, or by heating. Important photorefractive materials include barium titanate ($BaTiO_3$), bismuth silicon oxide ($Bi_{12}SiO_{20}$), lithium niobate ($LiNbO_3$), potassium niobate ($KNbO_3$), gallium arsenide (GaAs), and strontium barium niobate (SBN) [see Chapter 39 entitled "Photorefractive Materials And Devices" by M. Cronin-Golomb and M. Klein in *Handbook Of Optics II*, Ed., M. Bass (McGraw-Hill 1995)].

Various embodiments of the present invention are distinct from prior art PDI and PS/PDI in that the primary measured quantity of the prior art is related to the pupil or frequency response function of an optical system and information about the flare is not obtained or determined as in those various embodiments of the present invention.

Various embodiments of the present invention are also distinct from prior art in that the techniques of linear displacement interferometry are used in those various embodiments of the present invention to obtain information about relative locations in three dimensions of patterns in a recording medium wherein the patterns are generated by exposure induced changes for example in refractive index, density, and/or thickness of resist on a wafer with or without post exposure treatment for interferometric and non-interferometric measurements of the intensity profile of flare of an optical system.

The conjugated quadratures of the amplitude of flare are measured in the certain and in the certain other embodiments of the present invention using interferometric techniques. The conjugated quadratures may be measured as a function of wavelength and as a function of the polarization state of a measurement beam. The information about the relative location of a pattern generated by exposure induced changes in a recording medium with or without post exposure treatment may be with reference to a second pattern on the same interface layer of a wafer, to a second pattern on a different interface layer of the wafer, to a relative reference frame established by a simultaneous measurement of an array of conjugated quadratures corresponding to an array of sites on the wafer, or to a reference frame of a lithography stage metrology system.

Various embodiments of the present invention are also distinct from prior art in that the patterns under measurement are scanned for the presence of defects that could introduce an error in the measurement of the intensity or in the acquisition of information about the complex amplitude of flare of the optical system.

Various embodiments of the present invention are also distinct from prior art in that a recording medium is used that has a sensitivity which is periodic in one or two dimensions.

UV, VUV, and EUV measurement beams can be used effectively in embodiments of the present invention for the different metrologies for the technology nodes of hp65 nm, hp45 nm, hp32 nm, and hp22 nm nodes as set out in the International Technology Roadmap for Semiconductors (ITRS), 2003 Edition.

Various embodiments of the present invention are distinct from the metrologies described in commonly owned U.S. Provisional Patent Applications No. 60/568,774 (ZI-60) entitled "Apparatus And Methods For Measurement of Critical Dimensions Of Features And Detection Of Defects In UV, VUV, And EUV lithography Masks," No. 60/569,807 (ZI-61) entitled "Apparatus And Methods For Measurement Of Critical Dimensions Of Features And Detection Of Defects In UV, VUV, And EUV Lithography Masks," No. 60/573,196 (ZI-62) entitled "Apparatus And Methods For Overlay, Alignment Mark, And Critical Dimension Metrologies Based on Optical Interferometry," and No. 60/571,967 (ZI-63) entitled "Apparatus And Methods For Measurement Of Critical Dimensions Of Features And Detection Of Defects In UV, VUV, And EUV lithography Masks" and U.S. patent application Ser. No. 11/135,605 (ZI-62) entitled "Apparatus And Methods For Overlay, Alignment Mark, And Critical Dimension Metrologies Based on Optical Interferometry" and Ser. No. 11/124,603 (ZI-63) entitled "Apparatus And Methods For Measurement Of Critical Dimensions Of Features And Detection Of Defects In UV, VUV, And EUV lithography Masks" wherein measurements are made of locations and properties of patterns or portions of patterns in processed wafers and not of topographic interference signals. Each of the four cited provisional applications and the two utility applications are by Henry A. Hill and the contents of thereof are herein incorporated in the entirety by reference.

Various embodiments of the present invention are further distinct from the metrologies described in referenced U.S. Provisional Patent Applications No. 60/568,774 (ZI-60), No. 60/569,807 (ZI-61), No. 60/573,196 (ZI-62), and No. 60/571,967 (ZI-63) and U.S. patent application Ser. No. 11/135,605 (ZI-62) and Ser. No. 11/124,603 (ZI-63) in that in embodiments of the present invention, the intensity profile of flare can be measured and in addition the intensity of flare can be measured within a short period of time, e.g., 0.1 seconds and 1 second, after exposure of a respective site on a wafer and during the exposure cycle of the wafer.

Various embodiments of the present invention are also distinct from the metrologies described in commonly owned U.S. Provisional Patent Applications No. 60/602,999 (ZI-64) entitled "Subnanometer Overlay, Critical Dimension, And Lithography Tool Projection Optic Metrology Systems Based On Measurement Of Exposure Induced changes In Photoresist on Wafers," No. 60/618,483 (ZI-65) entitled "Subnanometer Overlay, Critical Dimension, And Lithography Tool Projection Optic Metrology Systems Based On Measurement Of Exposure Induced changes In Photoresist on Wafers" and No. 60/624,707 (ZI-68) entitled "Sub-Nanometer Overlay, Critical Dimension, And Lithography Tool Projection Optic Metrology Systems Based On Measurement Of Exposure Induced Changes In Photoresist On Wafers" and U.S. patent application Ser. No. 11/208,424 (ZI-68) entitled "Sub-Nanometer Overlay, Critical Dimension, And Lithography Tool Projection Optic Metrology Systems Based On Measurement Of Exposure Induced Changes In Photoresist On Wafers" for which each are by Henry A. Hill and the contents thereof are herein incorporated in their entirety by reference. Those embodiments of the present invention are distinct with respect to referenced U.S. 60/602,999 (ZI-64), U.S. 60/618,483 (ZI-65), U.S. 60/624,707 (ZI-68), and U.S. patent Ser. No. 11/208,424 (ZI-68) with reference to the practice of using an interferometric technique to generate a topographic interference signal.

In general, in one aspect, the invention features a point diffraction interferometer for measuring flare. The interferometer includes: a source for generating a source beam; an optical system having an object plane and an image plane; an optical element including a test object located in the object plane of the optical system, the test object including an array of diffraction points for generating from the source beam an array of diffracted beams that pass through the optical system to generate a measurement beam, wherein the optical element also generates from the source beam a reference beam that is combined with the measurement beam to generate an interference pattern in the image plane of the optical system, the interference pattern representing information relating to flare of the optical system.

Other embodiments include one or more of the following features. The array of diffracted beams have randomized relative phases. The test object serves as a beam splitter to generate both the measurement beam and the reference beam, both of which pass through the optical system. The test object includes an aperture and a diffuser aligned with the aperture, wherein the aperture in combination with the diffuser generates the array of diffracted beams having randomized relative phases. The test object includes a second aperture annularly arranged around the first aperture. The second aperture generates the reference beam from the source beam. Alternatively, the test object includes a diffuser aligned with the second aperture; the first aperture generates the reference beam from the source beam; and the second aperture in combination with the diffuser generates the array of diffracted beams from the source beam. The optical element further includes a beam splitter that is positioned to receive the source beam and generate therefrom the reference beam and an input beam which is directed to the test object and from which the array of diffracted beams is produced. The point diffraction interferometer also includes a detector system positioned in the image plane of the optical system for receiving the interference pattern. The detector system includes a recording medium in which the interference pattern produces exposure-induced changes. The point diffraction interferometer further includes an aperture array located in the image plane of the optical system and onto which the interference pattern is projected. The aperture array has a fluorescent material aligned with the apertures of the array. The point diffraction interferometer also includes a detector and a second optical system that images the aperture array onto the detector.

In general, in another aspect, the invention features an apparatus for measuring flare. The apparatus includes: a source for generating a source beam; an optical system having an object plane and an image plane; an optical element including a test object located in the object plane of the optical system, the test object including an array of diffraction points for generating from the source beam an array of diffracted beams that pass through the optical system to generate a measurement beam that is projected onto the image plane as a conjugate image of the test object, wherein the conjugate image of the test object includes flare-related information for the optical system.

Other embodiments include one or more of the following features. The optical element also generates from the source beam a reference beam that is combined with the measurement beam to generate an interference pattern in an image plane of the optical system, wherein the interference pattern represents information relating to flare of the optical system. The apparatus further includes a detector system which detects the interference pattern to produce an interference signal from which flare-related information for the optical system is derived.

In general, in another aspect, the invention features a method for measuring information relating to flare of an optical system having an object plane and an image plane. The method includes: generating a source beam; positioning a test object in the object plane of the optical system, the test object including an array of diffraction points; directing at least a portion of the source beam onto the test object to generate an array of diffracted beams from the array of diffraction points; passing the array of diffracted beams through the optical system to generate a measurement beam; generating from the source beam a reference beam; and combining the reference beam with the measurement beam to produce an interference pattern in the image plane of the optical system, wherein the interference pattern represents information relating to flare of the optical system.

Other embodiments include one or more of the following features. The method further includes computing information about flare of the optical system from information derived from the interference pattern. The test object serves to generate both the measurement beam and the reference beam, and the method also includes passing the reference beam through the optical system. The test object includes an aperture and a diffuser aligned with the aperture, wherein the aperture in combination with the diffuser generates the array of diffracted beams, wherein the array of diffracted beams has randomized relative phases. The test object includes a second aperture annularly arranged around the first-mentioned aperture. The second aperture generates the reference beam from the source beam. Alternatively, the test object includes a first aperture and a second aperture annularly arranged around the first aperture, a diffuser aligned with the second aperture and wherein the first aperture generates the reference beam from the source beam and the second aperture in combination with the diffuser generates the array of diffracted beams from the source beam.

In general, in yet another aspect, the invention features a method for measuring flare-related information for an optical system having an object plane and an image plane. The method includes: generating a source beam; sequentially positioning each of a plurality of test objects in the object plane of the optical system, each of the test objects of the plurality of test objects including a diffraction point; generating a reference beam from the source beam; for each of the test objects, (a) directing at least a portion of the source beam onto the test object that is positioned in the object plane to generate a diffracted beam from the diffraction point; (b) passing the diffracted beam through the optical system to generate a measurement beam; and (c) combining the reference beam with the measurement beam to produce an interference pattern in the image plane of the optical system; and from the interference patterns for the plurality of test objects computing information related to flare produced by the optical system.

Other embodiments include one or more of the following features. Each test object of the plurality of test objects includes an array of diffracting points of which the first-mentioned diffraction point for that test object is a member and directing at least a portion of the source beam onto the test object that is positioned in the object plane generates an array of diffracted beams from the array of diffraction points. The method further includes detecting the inference pattern to produce an array of interference signals and for each test object of the plurality of test objects, taking $N_2$ measurements of the array of interference signals, where $N_2$ is an integer that is larger than 1. The method also includes selecting $N_2$ to be large enough so that that a relative error due to statistical errors in average values is less than some predetermined value. The method still further includes using the $N_2$ measurements of the array of interference signals for each test object to compute an array of averages for each test object. The method also includes using the $N_2$ measurements of the array of interference signals for the plurality of test objects to compute an average of absolute values of real and imaginary components of an array of signals derived from the interference signals. And the method might further include based at least in part on the $N_2$ measurements of the array of interference signals for the plurality of test objects, computing a modulus of complex amplitude of flare generated by the optical system.

An advantage of various embodiments of the present invention is the interferometric profile measurements of the modulus of the complex amplitude and intensity of optical system flare.

Another advantage of various embodiments of the present invention is an enhanced sensitivity for the detection of optical system generated flare.

Another advantage of various embodiments of the present invention is reduced systematic errors in measured properties of flare of an optical system.

Another advantage of various embodiments of the present invention is reduced statistical errors in measured properties of flare of an optical system.

Another advantage of various embodiments of the present invention is a reduced sensitivity of the measurement of the flare of an optical system to vibrations.

Another advantage of various embodiments of the present invention is that IR, visible, UV, VUV, and EUV measurement beams may be used.

Another advantage of various embodiments of the present invention is that measured properties of flare generated by the optical system can be used in APC.

Another advantage of various embodiments of the present invention is that properties of flare of an optical system can be measured during an exposure cycle of an in process wafer with a minimal impact on throughput of a lithographic tool.

Another advantage of various embodiments of the present invention is that sub-wavelength defects in or on a photosensitive surface or a recording medium coated wafer can be detected.

Another advantage of various embodiments of the present invention is a high throughput in defect detection of an optical system.

Another advantage of various embodiments of the present invention is that the metrology systems used to detect signals in a recording medium and which contain information about flare of an optical system can operate in both reflection and transmission modes.

Another advantage of various embodiments of the present invention is that the properties of the metrology systems used to detect signals in a recording medium and which contain information about flare of an optical system are of the non-contact type.

Another advantage of various embodiments of the present invention is that the measurements for properties of optical system flare by the metrology systems used to detect signals in a recording medium and which contain information about flare of an optical system can be made with a large working distance.

DETAILED DESCRIPTION

Figure 1A:
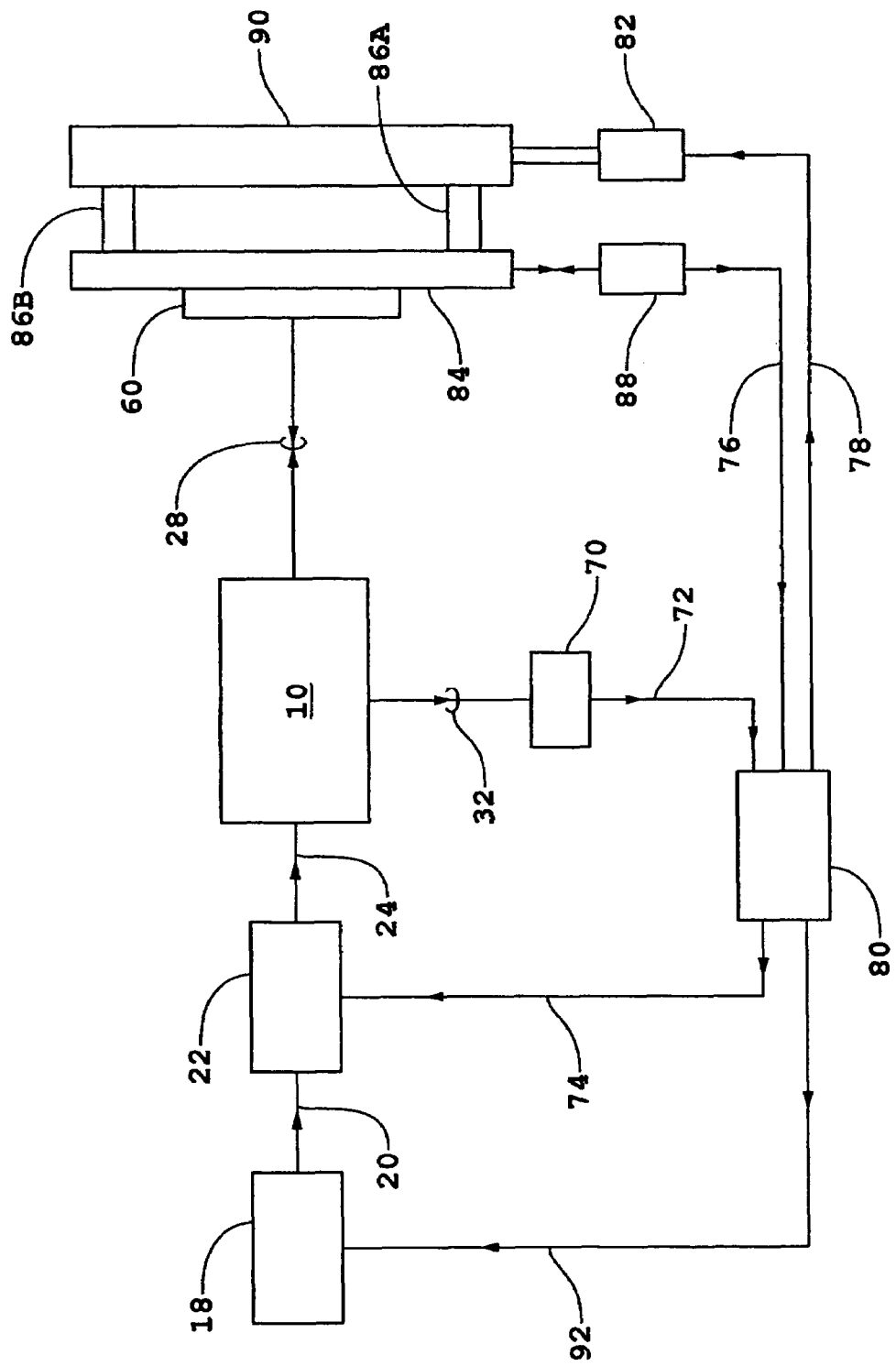
FIG. 1a is a diagram of an interferometric system.

The apparatus and methods used in various embodiments of the present invention are described in terms of an optical beam of a lithographic projection optical system without departing from the scope and spirit of implementations of the present invention. The apparatus and methods of various embodiments of the present invention that make interferometric profile measurements of the modulus of the complex amplitude and intensity of flare use a variant of PS/PDI to generate a topographical interference signal that is related to the complex amplitude of optical system flare. The optical system is used in the apparatus and methods as reference and/or measurement beam paths of an interferometer with a detector such as a photon detector or exposure induced changes in properties of a recording medium serving as the detector. The topographic interference signal is generated by imaging with the optical system an array of diffraction sites located simultaneously in an object plane of the optical system onto a detector comprising a photosensitive surface of a photon detector or a recording medium layer to form an image. The diffraction sites generate diffracted beams with randomized relative phases. The image in the recording medium layer is an undeveloped latent image generated by exposure induced changes in properties of the recording medium layer. The test objects may serve as a beam-splitter in the interferometer. The topographic interference signal is subsequently measured either as an electrical interference signal generated by the photon detector or by measuring certain of the changes in the properties of the recording medium with or without post exposure treatment.

In certain embodiments of the present invention, the test objects are constructed such that the optical beams that propagate from each of the test objects to the optical system to form images of the test objects may be represented by two corresponding beams. In the certain embodiments, one of the two corresponding beams has a wavefront structure such that the complex amplitude of the corresponding portion of the image produced by the optical system is sensitive to the optical system flare. The second of the two corresponding beams has a wavefront structure such that the complex amplitude of the corresponding portion of the image produced the optical system has a reduced sensitive to the aberrations and a relatively small sensitivity to optical system flare.

The first corresponding beam wavefront structures of the optical beams propagating from each of the test objects are the same except for sets of relative phase shifts of the arrays of diffraction sites and the second corresponding beam wavefront structures of the optical beams propagating from each of the test objects are the same except for a different set of relative phase shifts. Corresponding first and second beams are used as the measurement and reference beams, respectively, generated by the test objects serving as a beam-splitter of an interferometer with the optical system functioning as the measurement and reference beam paths in the interferometer. An example of the differences between corresponding phases of the set of relative phases of the different set of relative phases are phases mod $\pi/2$. The result is a PS/PDI with an array of diffracting sites simultaneously located in the object space of the optical system.

In certain other embodiments of the present invention, the apparatus and method of a respective embodiment is configured such that a reference beam generated by the apparatus and method does not pass through certain portions of the optical system.

In yet certain other embodiments of the present invention, non-interferometric profile measurements of the intensity of flare are based on flare related signals. For the non-interferometric profile measurements of the intensity of flare, an array of diffraction sites is located simultaneously in the object space of the optical system wherein the diffraction sites generate diffracted beams with randomized relative phases. The recorded signal may be either generated by a photon detector, e.g., a CCD, or exposure induced changes in a recording medium.

Test Objects for Interferometric Measurement of Properties of Flare

A test object for the interferometric measurement of properties of flare may be constructed as an amplitude modulation mask, a phase shift mask, an attenuated phase shift mask, or a combination of two or more of these mask types. The effects of the complex amplitude of flare are detected as a component or as components of the respective conjugated quadratures using PS/PDI or interferometric techniques and homodyne detection methods.

The presence of defects may introduce errors in the subsequent measurements made for extracting the topographic interference signal wherein the defects may be for example in the form of either an error in the profile of an associated detector surface and/or an error in the form of a particle on the detector surface. Accordingly, prior to generation of a topographic interference signal by a detector, inspections are made of the detector surface in certain embodiments of the present invention to determine whether the surface needs to be cleaned or effects of defects need to be compensated in subsequent analysis of the topographic interferometric signal as required.

Interferometric microscopy systems used to measure the topographic interferometric signals in a recording medium may comprise either an interferometric confocal or interferometric non-confocal microscopy system.

Various embodiments of the interferometric systems of the present invention that generate topographic interference signals using a photon detector will first be described followed by descriptions of those embodiments of the present invention that generate topographic interference signals in a recording medium. In the embodiments that generate topographic interference signals in a recording medium, interferometric metrology systems comprising interferometric confocal microscopy systems and interferometric non-confocal microscopy systems are used for measurement of the topographic interference signals.

In the interferometric metrology systems of the various embodiments of the present invention, an imaging system may be used in the generation of measurement beams, in the imaging of a recording medium, and/or in the generation of reference beams. The imaging systems may be used in either a confocal configuration or a non-confocal configuration.

Descriptions are first given for the general structure and fabrication of test objects. The description for the general structure and fabrication of test objects will be followed by a descriptions of procedures to obtain information about the complex amplitude, the modulus of the complex amplitude, and the intensity of flare from measured conjugated quadratures of topographic interference signals recorded either as an electrical interference signal or as exposure induced changes in a recording medium. These descriptions are followed by a description of the procedure used for non-interferometric profile measurement of the intensity of flare.

Non-Common Path Interferometric Test Object: Structure and Fabrication

Figure 3A:
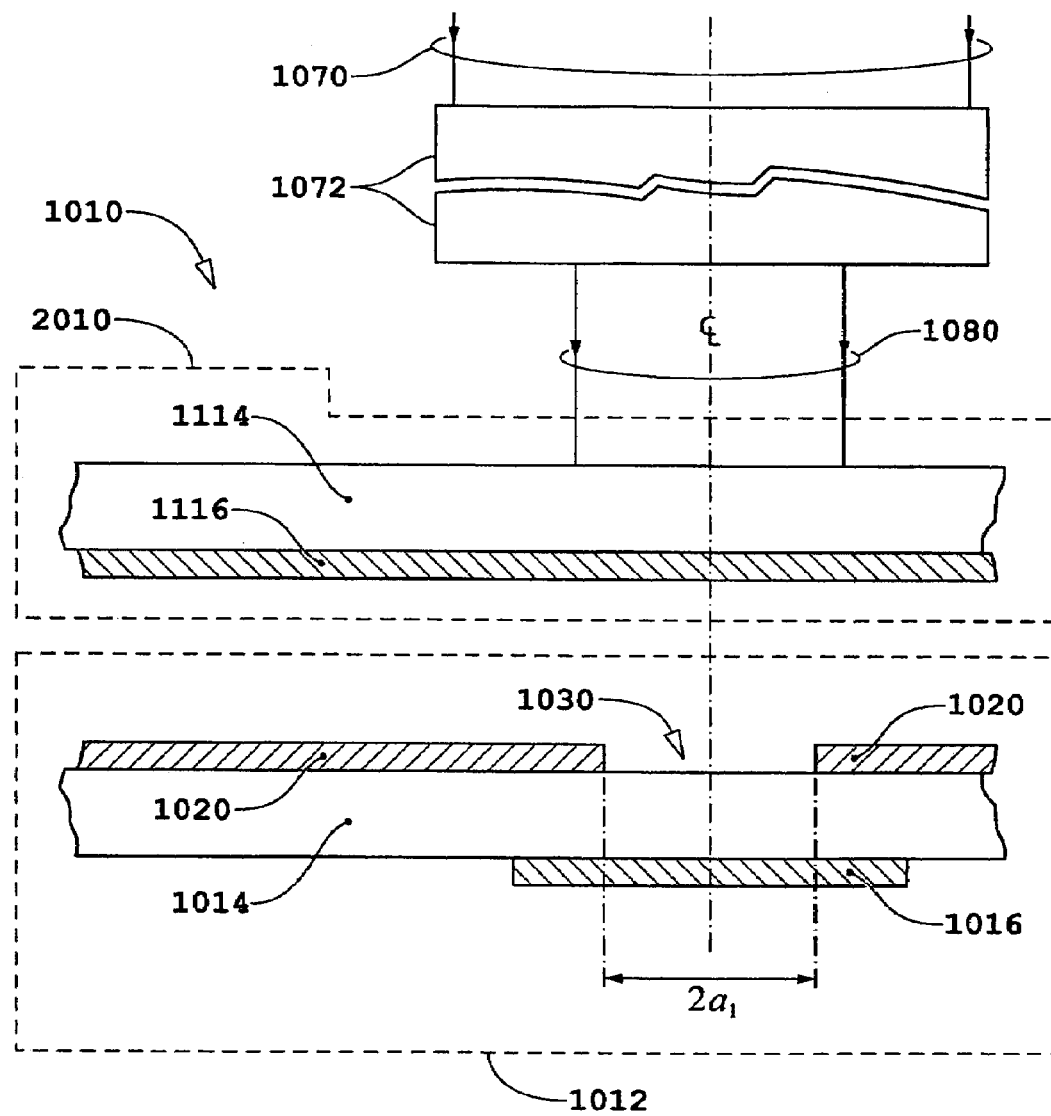
FIG. 3a is a diagram of a cross section of a test object system and an afocal system/attachment.

A cross sectional view of a test object system indicated as numeral 1010 for non-common path interferometer applications is shown diagrammatically in FIG. 3a. Test object system 1010 comprises test object 1012 and diffuser 2010 for acquisition of information about the complex amplitude of flare. Test object system 1010 generates a measurement beam for an interferometer and a corresponding reference beam 2430 is generated as a portion of beam 1420 reflected by beam-splitter 2440 such as shown in FIG. 4*c*.

Test object 1012 shown in FIG. 3*a* comprises a transparent substrate 1014, diffusing layer 1016 comprising an array of diffracting sites, and absorbing layer 1020. A first portion of a collimated beam 1080 incident on test object system 1010 is transmitted by diffuser 2010 and a portion thereof transmitted by aperture 1030 as a diffracted beam. The diffracted beam is incident on diffuser 1016 to generate a second scattered or diffracted beam herein after referred to as the first beam [see for example the discussion relevant to diffusers in Section 4.2.1 of *Laser Speckle and Related Phenomena*, Ed. J. C. Dainty, $2^{nd}$ Ed. Springer-Verlag (1984)]. The first beam comprises an array of diffracted beams with randomized relative phases generated by the diffraction sites in diffuser 1016. Properties of diffuser 1016 are further selected so that the first beam is diffracted such as to fill the aperture of a subsequently used optical system under test. The dimensions of diffuser 1016 are larger than the corresponding dimensions of aperture 1030 such that nominally all of the diffracted beam transmitted by aperture 1030 is incident on diffuser 1016. The first beam is subsequently used as the measurement beam for the interferometer system comprising the optical system.

Figure 3B:
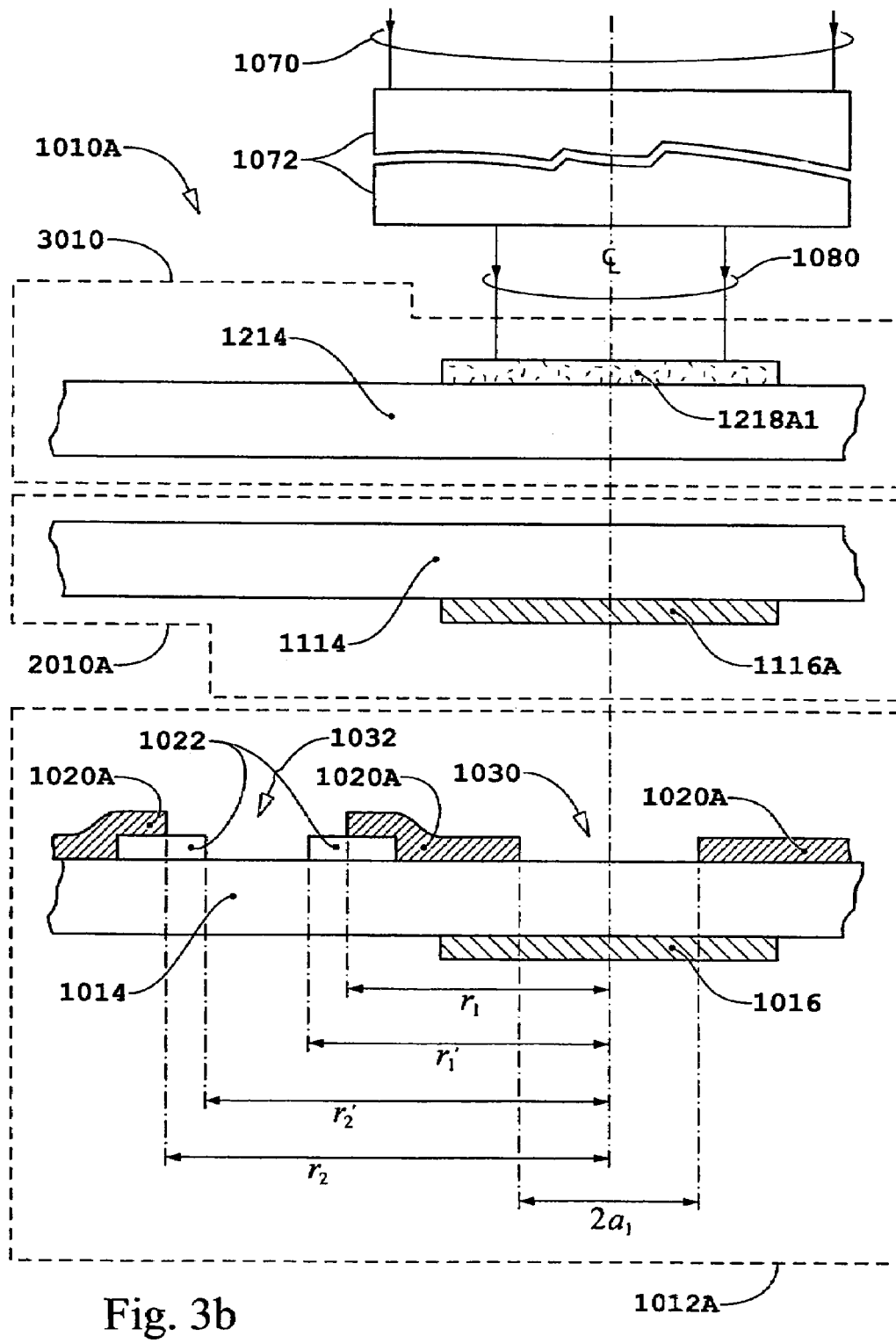
FIG. 3b is a diagram of a cross section of another test object system and an afocal system/attachment.
Figure 3C:
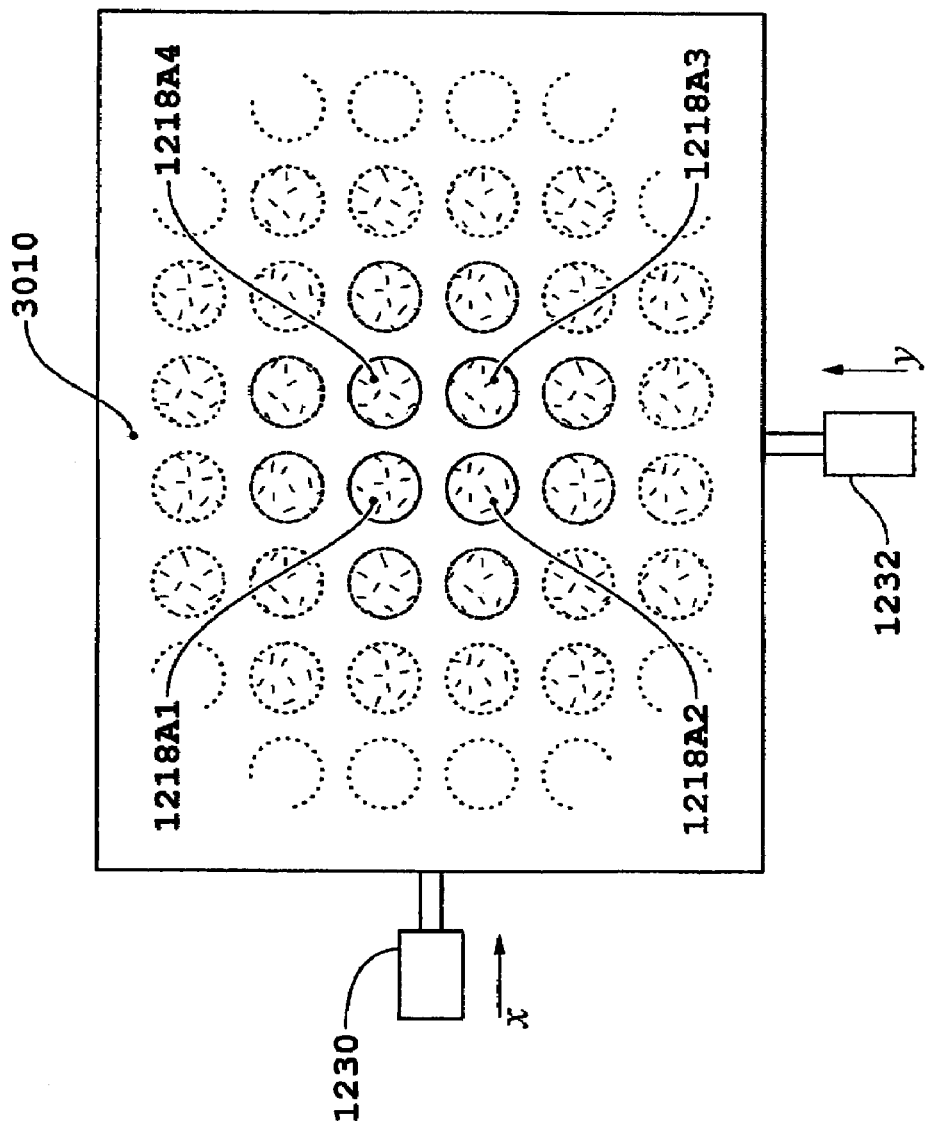
FIG. 3c is a plan view of a phase-shifting mask.
Figure 3D:
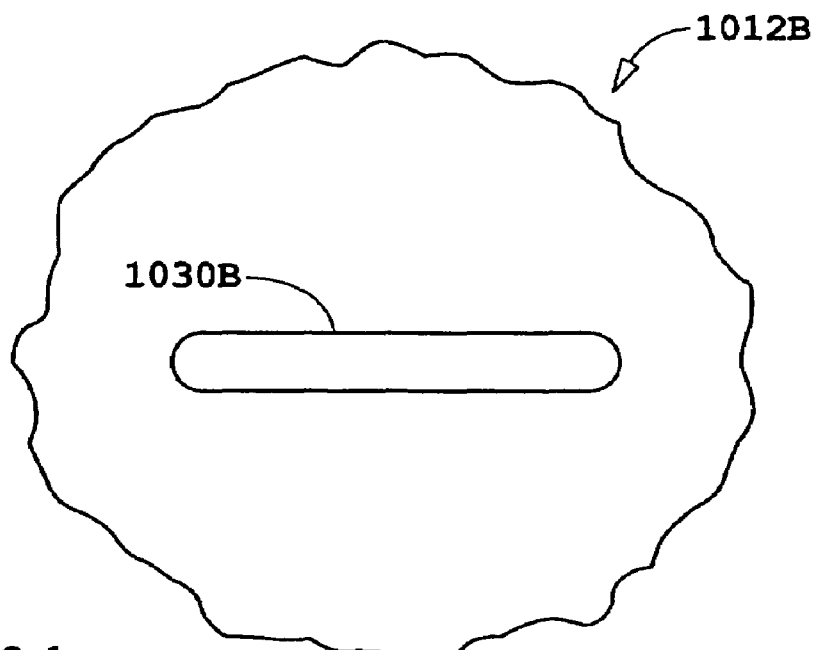
FIG. 3d is a diagram of a plan view of a test object comprising an aperture in the form of a slit.
Figure 3E:
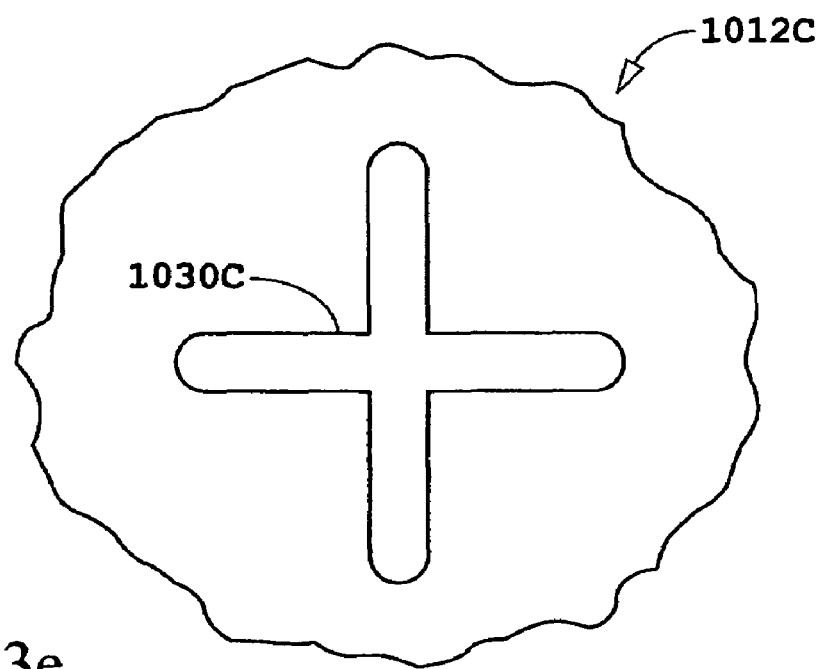
FIG. 3e is a diagram of a plan view of a test object comprising an aperture in the form of two crossed slits.

Aperture 1030 is a right circular cylinder with a cross section that may be for example a circle, square, or a slit (see FIGS. 3*d* and 3*e*). FIG. 3*d* is a cross-sectional view of a slit 1030B and FIG. 3*e* is a cross-sectional view of a pair of slits 1030C oriented to form a cross. Subsequent discussion of aperture 1030 will be in terms of a cross section in the form of a disc without departing from the scope and spirit of embodiments of the present invention.

To generate a test object with a different set of randomized relative phases, diffuser 2010 is translated laterally by transducers. The description of the transducers for translation of diffuser 2010 is the same as the corresponding description given for transducers 1230 and 1232 used to translate phase shifter 3010 shown in FIG. 3*c*.

Test objects for measuring the properties of flare interferometrically are designed such that certain properties of images formed thereof by an imaging system under test are subsequently detected as topographic interference signals. The topographic interference signals are detected for the radial domain corresponding to the area of influence of flare, i.e. MRF or LRF, for which information is desired. The radial resolution required and the signal-to-noise ratio desired for the measured properties of the flare are determined in part by the dimensions of aperture 1030. The topographic interference signal for the flare is enhanced by the use of an array of diffraction sites that generate an array of diffracted beams with randomized relative phases wherein the topographic interference signal is proportional to the square root of the area of aperture 1030, e.g., proportional to $\sqrt{\pi a_1^2}$ for a circular aperture of diameter $2a_1$, or more specifically proportional to the square root of the effective number of diffraction sites $N_1$ in diffuser 1016 determined in part by size of aperture 1030.

Afocal System: Increase Relative Amplitude of Topographic Interference Signal

An afocal system 1072 may be used in embodiments of the present invention to increase the amplitude of a beam transmitted by a test object 1010 such as shown in FIG. 3*a*. An increase in the relative amplitude of the first beam generated by test object 1012 is proportional to the ratio of the square roots of the areas of the input beam 1070 and output beam 1080 of afocal system 1072.

Afocal system 1072 may comprise afocal lenses and/or anamorphic afocal attachments [see, e.g., Chapter 2 entitled "Afocal Systems" by W. B. Wetherell in *Handbook Of Optics II*, Second Edition (McGraw-Hill)]. A first embodiment is shown diagrammatically for an afocal system such as represented by a Galilean afocal lens. However, a Keplerian afocal lens can be used. If a Keplerian afocal lens is used for one or more afocal systems, the transformation properties of corresponding relay lens systems must be changed to reflect the inverting features of the Keplerian afocal lens. The afocal systems may also comprise anamorphic afocal attachments based on cyclindrical lenses, prisms, and birefringent elements.

Figure 3F:
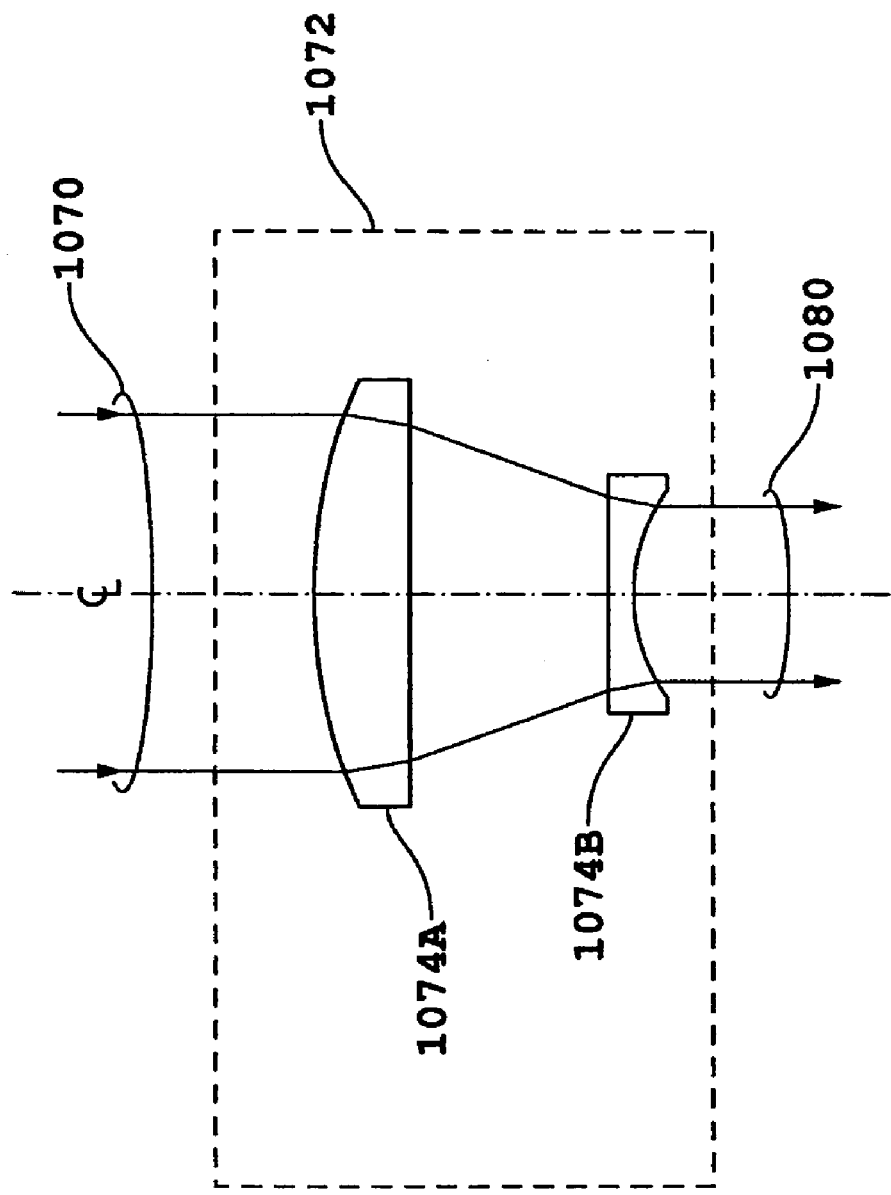
FIGS. 3f-3h are diagrams of afocal systems/attachments.
Figure 3G:
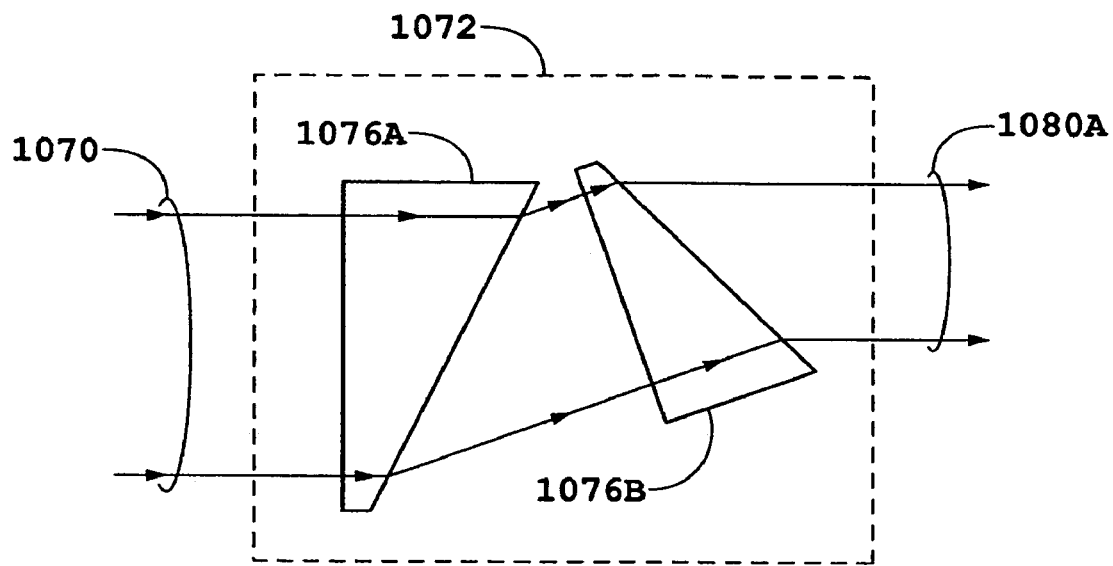
Figure 3H:
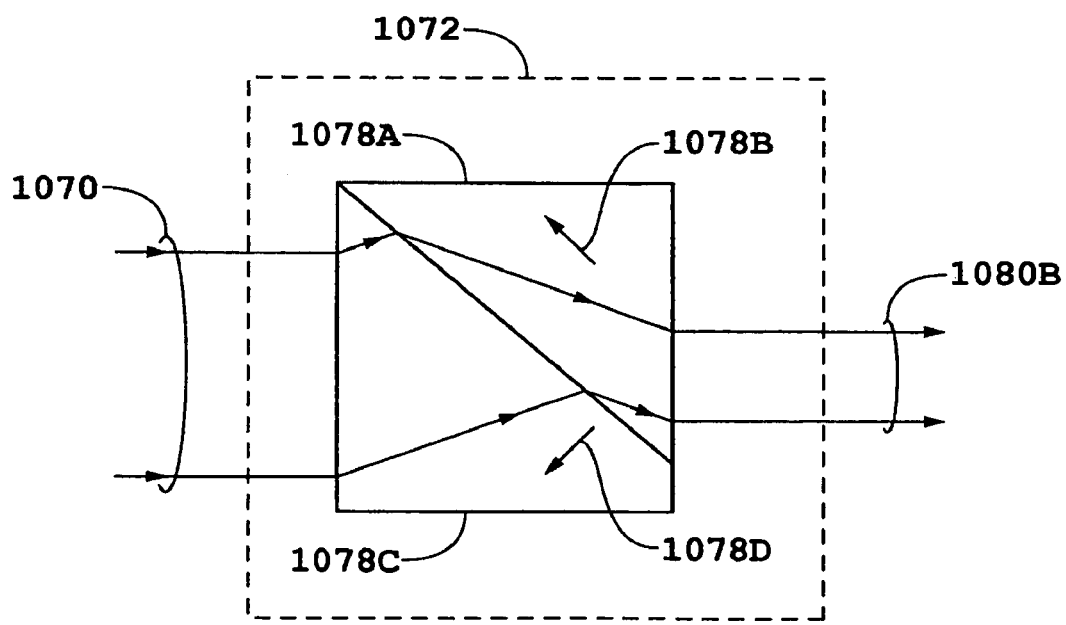

An example of a Galilean afocal lens is shown diagrammatically in FIG. 3*f* and a prismatic and birefringent anamorphic afocal attachments are shown diagrammatically in FIGS. 3*g* and 3*h*, respectively. The Galilean afocal lens shown in FIG. 3*f* comprises positive and negative lenses 1074A and 1074B, respectively, and illustrates its operation in a demagnifying mode.

A prismatic anamorphic afocal attachment, shown in FIG. 3*g*, comprises two prisms 1076A and 1076B and also illustrates its operation in a demagnifying mode in one dimension. The output beam is shown as element 1080A in FIG. 3*g* and corresponds to beam 1080 in FIG. 3*a*.

A birefringent anamorphic afocal attachment, shown in FIG. 3*h*, comprises two birefringent prisms 1078A and 1078C bonded together and illustrates its operation in a demagnifying mode in one dimension. The output beam is shown as element 1080B in FIG. 3*h* and corresponds to beam 1080 in FIG. 3*a*. The birefringent prisms may comprise, for example, uniaxial crystals such as calcite and paratellurite. The optic axes for birefringent prisms 1078A and 1078C are shown in FIG. 3*h* as elements 1078B and 1078D, respectively. Polarization of the input beam is extraordinary. The path of the input beam through the birefringent anamorphic afocal attachment and the directions for the optic axes 1078B and 1078D are shown for a system comprising positive uniaxial crystals.

The non-common path interferometer shown in FIG. 4*c* is an interferometer with a portion of the path of the reference beam external to an optical system under test. The interferometer comprises source 1418, an optical system 1410A for which information about the respective flare is to be determined and optical system 1410B which images image plane aperture array 1412 onto detector 1470. Test object system 1010 is the same test object system 1010 of FIG. 3*a* that generates the first beam therein. Source 1418 may be the same source used by optical system 1410A in an application, e.g., a lithography tool, or a different source such as source 18 in FIGS. 1*a* and 1*b*. Source 1418 is controlled by signal 2492 from electronic processor and controller 2480.

Source 1418 generates beam 1420 which is incident on beam-splitter 2440 wherein a first portion is transmitted as beam 1070 and a second portion reflected as reference beam 2430. Beam 1070 is incident on test object system 1010 to form the first beam or measurement beam 2422. Optical system 1410A is represented by a single lens 1430 in FIG. 4*c* which focuses beam 2422 as beam 2424 to a spot in a conjugate image plane at image plane aperture array 1412.

A portion of reference beam 2430 is reflected by reflector 2442 as beam 2432 and a portion thereof transmitted by phase-shifter 2450 as phase shifted reference beam 2434. Phase-shifter 2450 introduces phase shifts such as by electro-optic modulation which are subsequently used in homodyne detection methods. A portion of beam 2434 is reflected by reflector 2444 and a portion thereof reflected by reflector 2446 as phase-shifted reference beam 2438. The phase shifts are controlled by signal 2494 from electronic processor and controller 2480. Phase-shifted reference beam 2438 is incident on the conjugate image plane at image plane aperture array 1412 at the same spot beam 2424 is focused to in a conjugate image plane at image plane aperture array 1412.

Figure 1B:
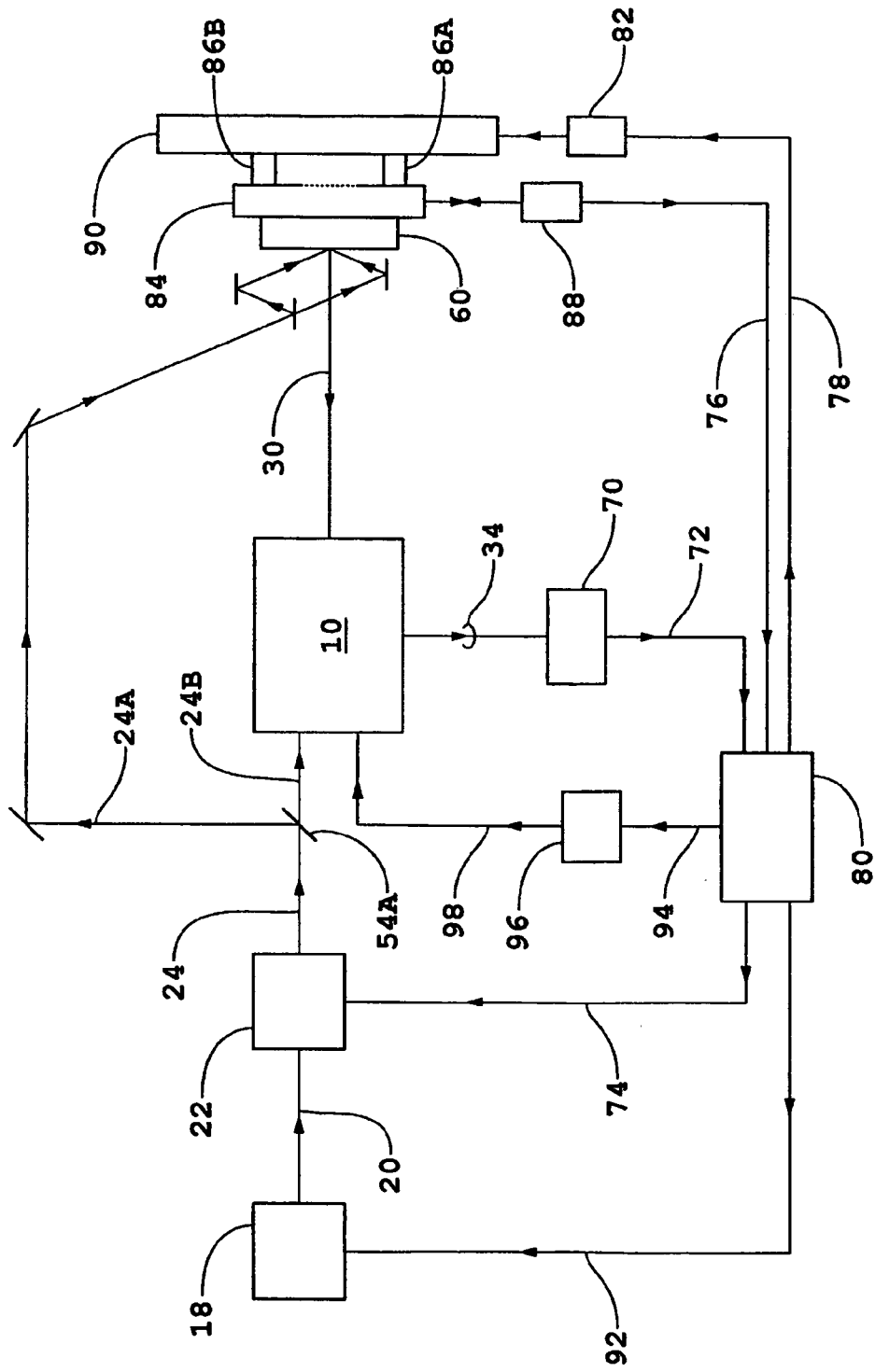
FIG. 1b is a diagram of a non-confocal interferometric system.

The phase-shifted reference beam corresponding to beam 2438 may be incident on image plane aperture array 1412 in yet other configurations such as such as shown in FIG. 1b.

Portions of beams 2424 and 2438 are either transmitted or converted to beam 2426 having a wavelength different from that of beam 1424 by image plane aperture array 1412. Beam 2426 is incident on the second optical system 1410B and focused as beam 2428 to a spot on detector 1470. If beams 2424 and 2438 do not have the same state of polarization, a polarizer (not shown in a figure) is introduced to generate a mixed beam incident on image plane array 1412.

Information about the conjugated quadratures of a topographic interference signal is obtained using a homodyne detection method from a set of measurements of exposure induced changes in a recording medium or of signals from a photon detector corresponding to a set of relative phase shifts, e.g., 0, $\pi/2$, $\pi$, and $3\pi/2$ introduced by phase-shifter 2450.

To generate a test object with a different set of randomized relative phases, diffuser 2010 comprising diffuser 1116 attached to substrate 1114 shown in FIG. 3a is translated laterally by transducers (not shown in a figure). The description of the transducers is the same as the description given for transducers 1230 and 1232 used to translate phase shifter 3010 shown in FIG. 3c.

In a variant of the system shown in FIG. 4c, the detector starting with image plane aperture array 1412 may use a recording medium.

Interferometric Test Object Structure and Fabrication: Common Path Interferometer Application A cross sectional view of a test object system 1010A for common path interferometer applications is shown diagrammatically in FIG. 3b. Test object system 1010A comprises test object 1012A, diffuser 2010A, and phase-shifter 3010 for acquisition of information about the complex amplitude of flare. Test object 1012A comprises an array of diffracting sites for acquisition of information about the complex amplitude of flare. Test object 1012A serves as a beam-splitter and generates first and second beams from an input beam 1080 which are subsequently used as measurement and reference beams, respectively, in an interferometer. Test object system 1010A shown in FIG. 4d generates a measurement beam that has the same properties as the measurement beam generated by test object system 1010 (see FIG. 3c).

Test object 1012A shown in FIG. 3b comprises a transparent substrate 1014, diffusing layer 1016 comprising an array of diffracting sites, absorbing layer 1020A, and absorbing, phase-shifting layer 1022. Test object 1012A is a variant of test object 1012 described in commonly owned U.S. Provisional Patent Applications No. 60/682,216 (ZI-69), No. 60/711,020 (ZI-73), No. 60/727,618 (ZI-75) wherein each of the provisional applications are to Henry A. Hill and each are entitled "In Situ And Ex Situ Measurement Of In Situ Lithographic Projection Optic Aberrations, Optic Axis Location, And Flare". The contents of each of the three provisional patent applications are incorporated herein in their entirety by reference.

A first portion of a collimated beam 1080 incident on test object system 1010A is transmitted by phase-shifter 3010 and diffuser 2010A and a portion thereof transmitted by aperture 1030 as a diffracted beam. The diffracted beam is incident on diffuser 1016 to generate a second scattered or diffracted beam herein after referred to as the first beam [see for example the discussion relevant to diffusers in Section 4.2.1 of Laser Speckle and Related Phenomena, Ed. J. C. Dainty, $2^{nd}$ Ed. Springer-Verlag (1984)]. The first beam comprises an array of diffracted beams with randomized relative phases generated by the diffraction sites in diffuser 1016. Properties of diffuser 1016 in FIG. 3b are the same as the properties of diffuser 1016 in FIG. 3a and the description of aperture 1030 shown in FIG. 3b is the same as corresponding portions of the description given for aperture 1030 shown in FIG. 3a. The first beam is subsequently used as the measurement beam for the interferometer system comprising the optical system.

The second beam corresponding to the beam transmitted by aperture 1032 is transmitted as an apodized second beam. The second beam will be a plane wave across aperture 1032 except for the effects of apodizing at the edges of aperture 1032. The apodizing is designed through the selection of radii $r_1$, $r_1'$, $r_2$, and $r_2'$ and the design of the attenuation and phase shift introduced by absorbing, phase-shifting layer 1022 to reduce the effects of diffraction on the wavefront of the second beam at the conjugate image plane of test object 1012A formed by the optical system.

The first and second beams are subsequently used as the measurement and reference beams, respectively, for the interferometer system comprising the optical system.

It will be evident to one skilled in the art that other constructions of the test object may be used in embodiments of the present invention without departing from the scope and spirit of implementations of embodiments of the present invention. In an example of another construction, the magnitude of the amplitude of the transmission coefficient may be varied across aperture 1032 that defines the second beam generated by test object 1012A in order to enhance the sensitivity of the topographic interference signal in regions where the amplitude of the flare of the optical system exhibits a relatively smaller value.

Test objects for measuring the properties of flare interferometrically are designed such that certain properties of images formed thereof by an imaging system under test are subsequently detected as topographic interference signals for the portion of the image plane that is a conjugate image of aperture 1032 for the optical system under test. Accordingly, aperture 1032 shown in FIG. 3b is designed for measurement of properties of flare generated by the optical system at a radius which is the conjugate image of r where $r_1'<r<r_2'$. The value of $r_1'$ is set for example by consideration of the radial domain for which properties of the optical system are adequately represented by aberrations that are measured by other techniques such as described in commonly owned US Provisional Patent Application (ZI-77) filed Apr. 5, 2006 and entitled "Apparatus And Method For In Situ And Ex Situ Measurement Of Spatial Impulse Response Functions Of An Optical System Using Phase-Shifting Point-Diffraction Interferometry". The US Provisional Patent Application is by Henry A. Hill and the contents thereof are herein incorporated in their entirety by reference. The value of $r_2'$ is set by consideration of the size of the area of influence of flare, i.e. MRF or LRF, for which information is desired. The radial resolution required for the measured properties of the flare and the signal-to-noise ratio desired in measurements of the properties of flare are determined in part by the diameter $2a_1$ of aperture 1030. The topographic interference signal for the flare will be enhanced by the use of an array of diffraction sites with randomized relative phases wherein the topographic interference signal is proportional to the square root of the area of aperture 1030, e.g., proportional to $\sqrt{\pi a_1^2}$ for a circular aperture of diameter $2a_1$, or more specifically proportional to the square root of the effective number of diffraction sites $N_1$ in diffuser 1016 determined in part by size of aperture 1030.

An afocal system 1072 shown in FIG. 3b can be used to increase the amplitude of the first beam transmitted by a test object 1010A such as described with respect to afocal system 1072 shown in FIG. 3a Relative phase shifts are introduced between the first and second beams by a phase-shifter 3010 shown in FIGS. 3b and 3c. Phase-shifter 3010 comprises a transparent substrate 1214 and a set of phase-shifters such as 4 phase-shifters 1218A1, 1218A2, 1218A3, and 1218A4. The optical thickness of phase-shifters 1218A1, 1218A2, 1218A3, and 1218A4 are selected to generate the set of relative phase shifts, e.g., 0, $\pi/2$, $\pi$, and $3\pi/2$. The radius $a_2$ of phase-shifters 1218A1, 1218A2, 1218A3, and 1218A4 is larger than the radius $a_1$ of aperture 1030 and at the same time meets the restriction that $(1+\sqrt{2})a_2 < r_1$. The separation of the phase shifters 1218A1, 1218A2, 1218A3, and 1218A4 is selected so as to not introduce any phase shifts into the second beam transmitted by aperture 1032. The location of phase-shifter 3010 relative to test object 1012A is indicated in FIG. 3b and is controlled by transducers 1230 and 1232 in the x and y directions, respectively.

The set of measurements of exposure induced changes in a recording medium or of signals from a photon detector may be either obtained sequentially with test objects of a set of test objects being placed sequentially in an object space, simultaneous with a corresponding set of test objects located simultaneously in a region of an object space and the corresponding beam from a source incident simultaneously on the set of test objects, or some combination thereof, e.g., with subsets of the set of test objects located simultaneously in a region of an object space and the corresponding beam from a source incident simultaneously on the subset of the set of test objects.

Alternatively, relative phase shifts are introduced between the first and second beams by a generating a set of test objects with different optical thicknesses of phase shifters (not shown in a figure) placed in the path of the second beam and attached to substrate 1014 shown in FIG. 3b. Information about the conjugated quadratures of a topographic interference signal is obtained in a homodyne detection method from a set of measurements of exposure induced changes in a recording medium or of signals from a photon detector corresponding to a set of relative phase shifts, e.g., 0, $\pi/2$, $\pi$, and $3\pi/2$. The set of relative phase shifts are generated in the set of corresponding test objects by selecting the set of corresponding test objects to be within a phase offset the set of relative phase shifts mod $2\pi$.

To generate a test object with a different set of randomized relative phases, diffuser 2010A comprising an array of diffusers 1116A attached to substrate 1114 shown in FIG. 3b is translated laterally by transducers (not shown in a figure). The description of the transducers is the same as the description given for transducers 1230 and 1232 used to translate phase shifter 3010 shown in FIG. 3c. The selection of the size of a single diffuser 1116A and the distribution of diffusers 1116A in diffuser 2012A is based on the same corresponding considerations made in the selection of the properties of the phase-shifters of phase-shifter 3010.

Alternative Interferometric Test Object Configuration

An alternative configuration for a test object for a non-common path interferometer is created by converting aperture 1030 and diffuser 1016 in test object 1012 in FIG. 3a to an annulus or section thereof. The converted aperture 1030 is the same as annulus or section thereof 3030 shown in FIG. 3i.

Figure 3I:
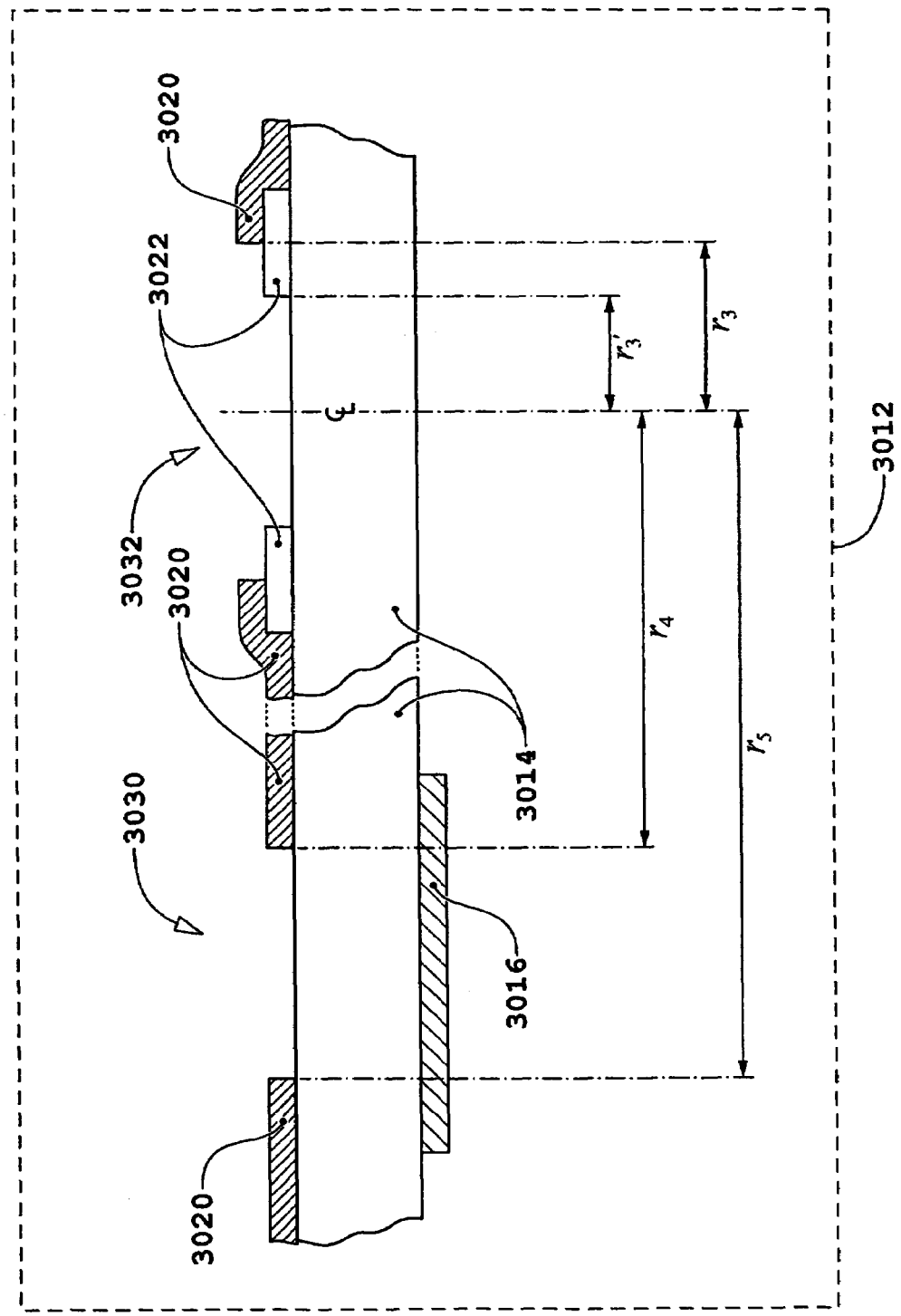
FIG. 3i is a diagram of a cross section of another test object.

Another alternative configuration for a test object 3012 for a common path interferometer is created by converting aperture 1030 and diffuser 1016 of test object 1012A and aperture 1032 of test object 1012A to an annulus or section thereof as element 3030 and a circular aperture as element 3032, respectively, such as shown in FIG. 3i. The measurement and reference beams are generated by aperture 3030 and 3032, respectively. The subsequent description of the alternative configurations for test objects is the same as corresponding portions of the descriptions given with respect to the test objects shown in FIGS. 5a, 5b, and 5c.

Attenuating Mask: Increase Amplitude of Topographic Interference Signal without Saturating Elements of Detector An attenuating mask is located at the recording media or photon photosensitive detector surface 1470 in FIGS. 4c and 4d to attenuate the image of aperture 1030 from either test object system 1010 or 1010A, respectively, by a factor, e.g., $10^4$, $10^6$, or $10^8$, such that the corresponding portion of the signal generated by the detector does not saturate during the period of time for which a corresponding topographic interference signal is recorded. The recorded portion of the signal corresponding to the attenuated image of aperture 1030 is used to normalize measured topographic interference signals for the respective integrated flux of the input beam to the optical system under test.

Topographic Interference Signal Generation and Detection: Electrical Interference Signal Continuing with reference to FIG. 4c, the apertures of image plane aperture array 1412 are imaged in a one-to-one mapping onto pixels of detector 1470. Beam 2428 is detected by detector 1470 to form electrical interference signal 2472. Signal 2472 is received by electronic processor and controller 1480. Image plane array 1412 is scanned across the image plane of optical system 1410A to obtain for a complete image in the plane of image plane array 1412 electrical interference signal 2472 corresponding to a topographic interference signal which is processed by electronic processor and controller 2480 for information about the spatial impulse response function of optical system 1410A. The processing is according to the homodyne detection method used in embodiments of the present invention such as described herein in subsection entitled "Topographic Interference Signal Generation and Detection: Exposure Induced Changes in a Recording Medium" and related subsections.

Figure 4A:
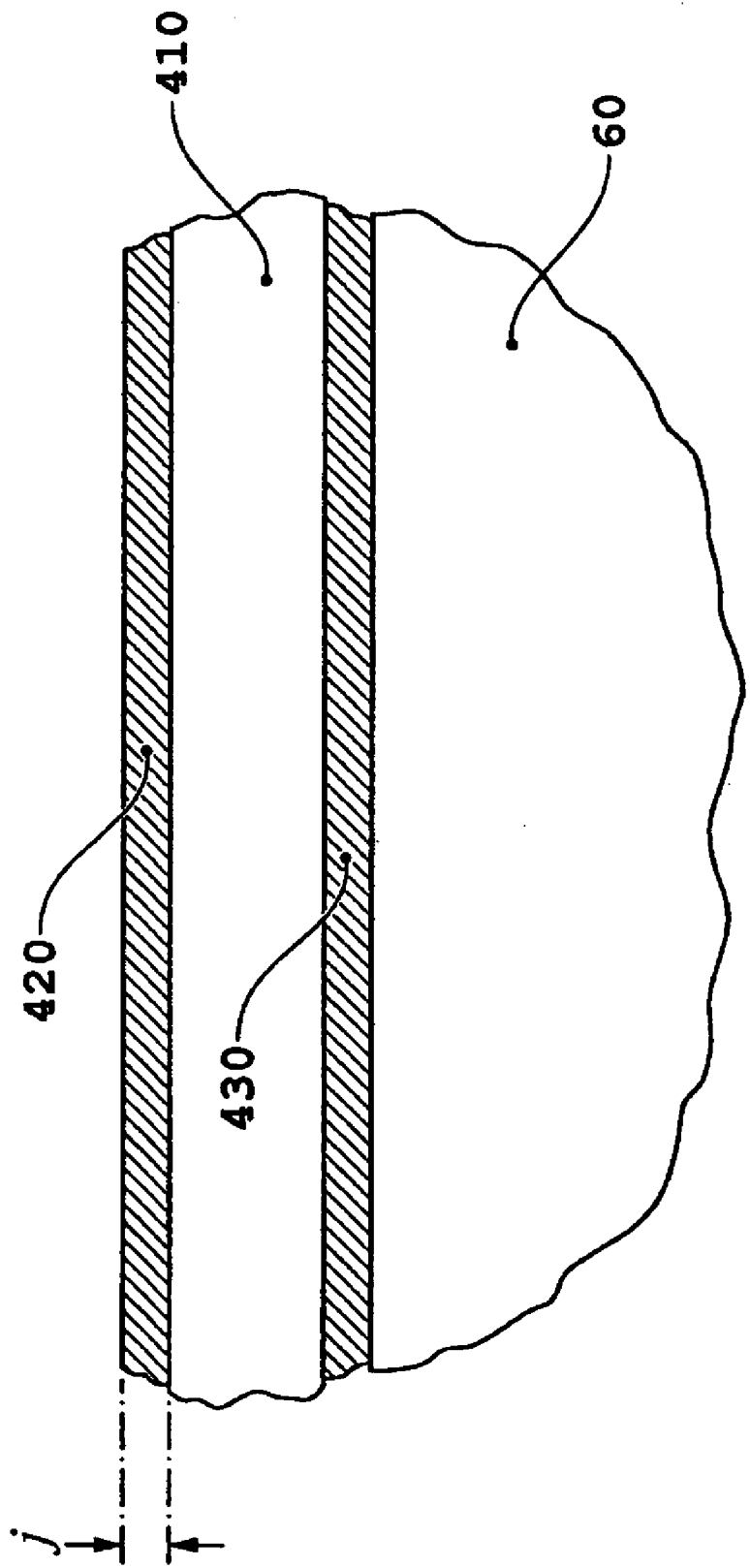
FIG. 4a is a diagram of a recording medium layer on a substrate with anti-reflecting layers.
Figure 4B:
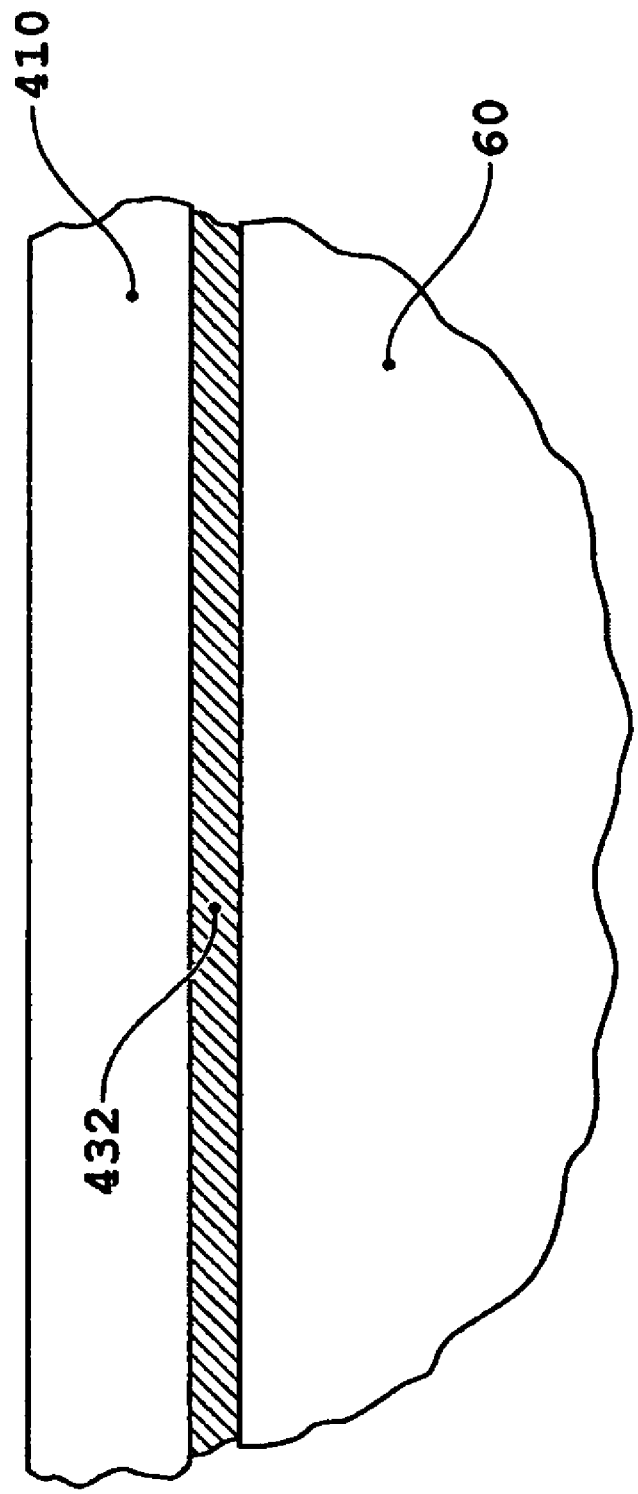
FIG. 4b is a diagram of a recording medium layer on a substrate with a reflecting layer at the interface of the recording medium layer and the substrate.
Figure 4C:
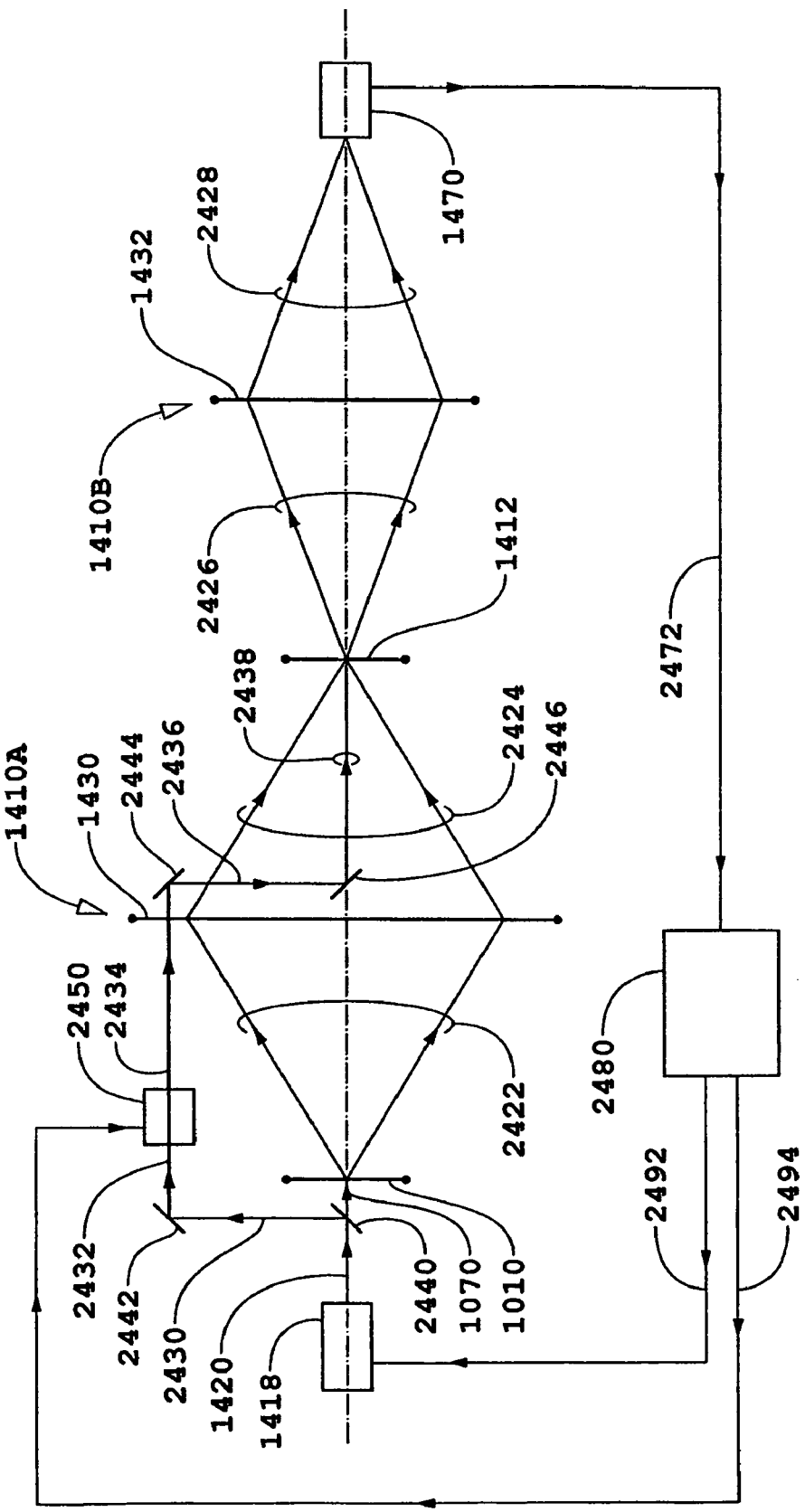
FIGS. 4c and 4d are diagrams of metrology systems for measuring the topographic interference signal with a detector comprising a photon detector.
Figure 4D:
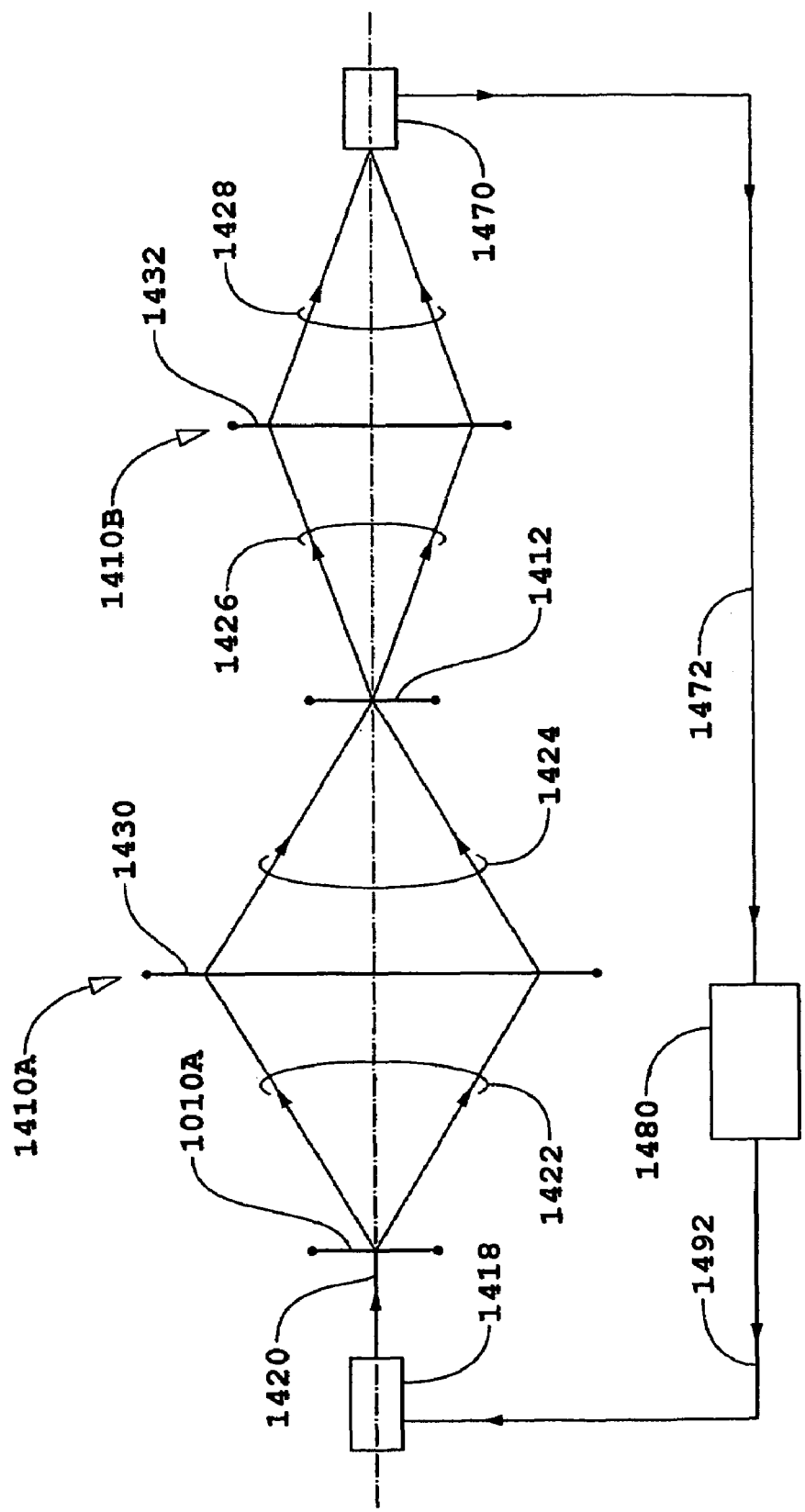
Figure 4E:
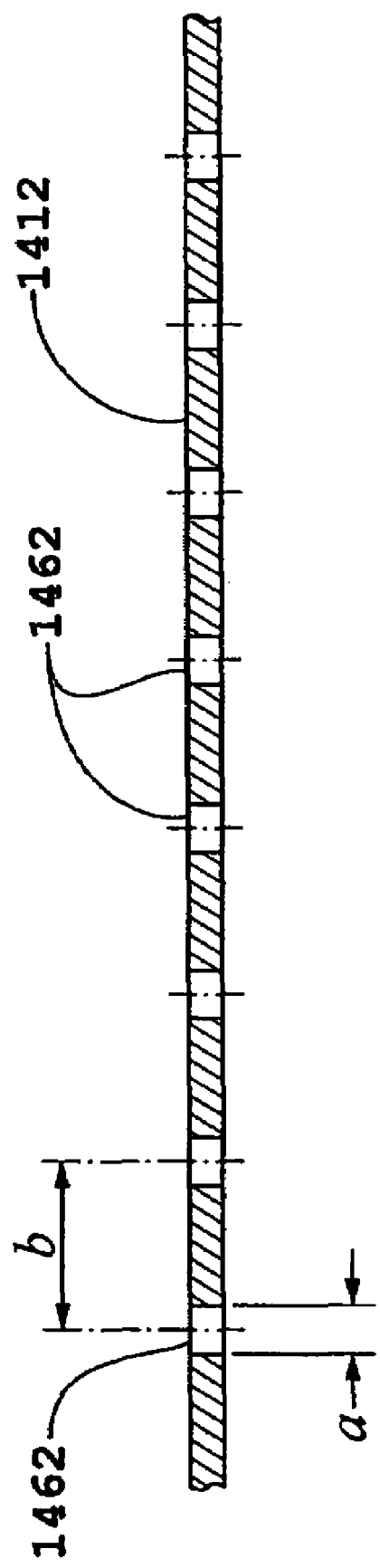
FIG. 4e is a schematic diagram of an array of apertures that may be filled with a fluorescent medium.

Image plane array 1412 is formed in certain embodiments as an array of subwavelength apertures such as shown in FIG. 4e and in certain other embodiments as an array of thin fluorescent spots. An example of a pattern of an array of thin fluorescent spots in one embodiment of the certain other embodiments is the pattern of apertures shown in FIG. 4e with apertures 1462 filed with a fluorescent medium, e.g., lumogen, to the form thin fluorescent spots. The size and spacing of the apertures are a and b, respectively. The size of the apertures a may be less than or approximately equal to the resolution of imaging system 1410A in certain end use applications or larger than the resolution in one or two dimensions in certain other end use applications such as described in commonly owned US Provisional Patent Application No. 60/485,507 (ZI-52) and U.S. patent application Ser. No. 10/886,010 (ZI-52) which are both by Henry A. Hill and entitled "Apparatus and Method for High Speed Scan for Detection and Measurement of Properties of Sub-Wavelength Defects and Artifacts in Semiconductor and Mask Metrology". The contents of both of the two referenced applications are herein incorporated in their entirety by reference. The shape of the apertures may be circular or some other shape such as slits.

Image plane array 1412 comprising the array of sub-wavelength thin fluorescent spots also serves the function of a pinhole array beam-splitter in an interferometer wherein the description is the same as the corresponding description given in cited U.S. Provisional Patent Application No. 60/442,982 (ZI-45) and U.S. patent application Ser. No. 10/765,229 (ZI-45).

Figure 4F:
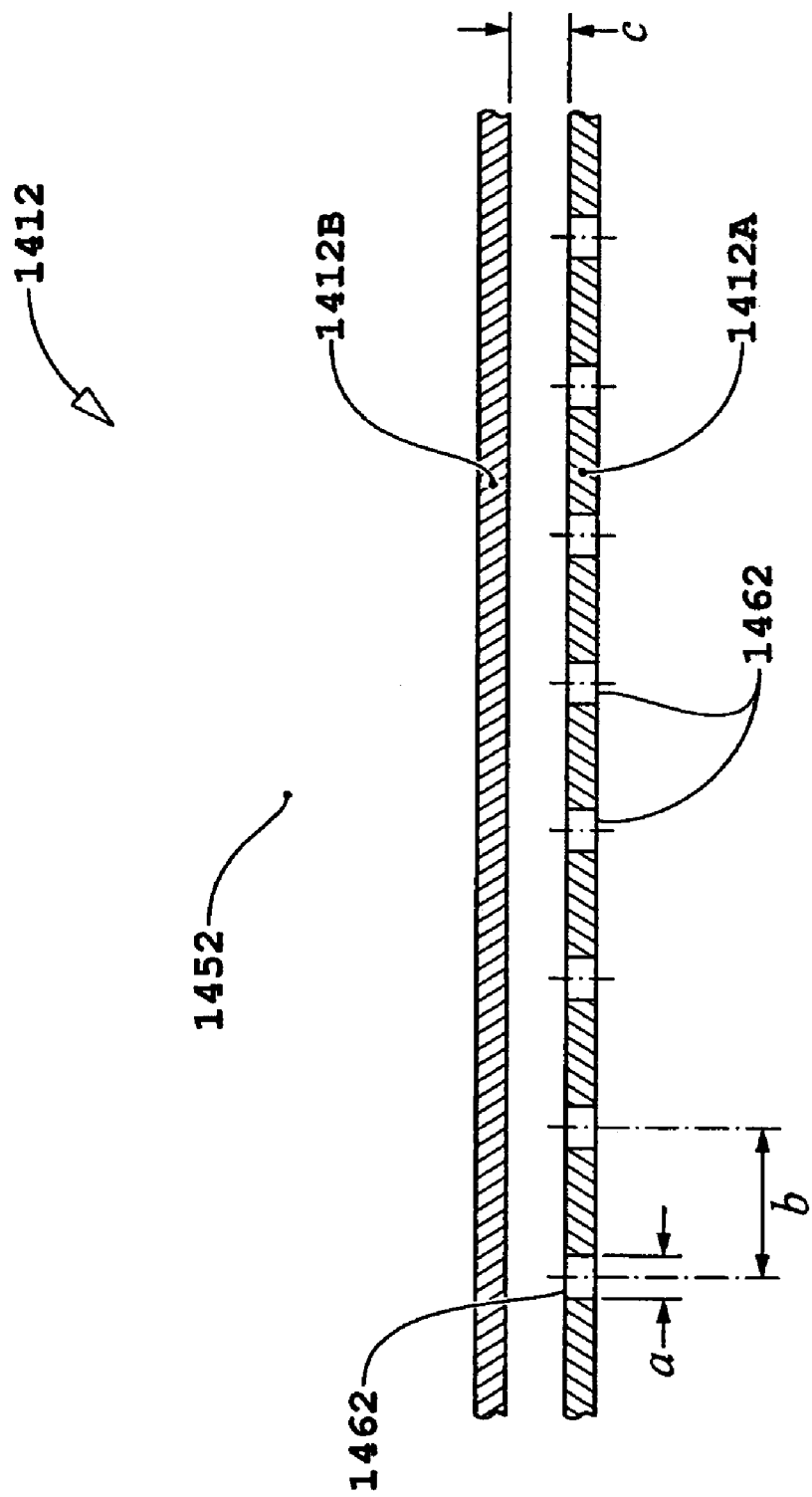
FIG. 4f is a schematic diagram of a thin fluorescent layer placed behind an array of pinholes.

Image plane array 1412 of the one embodiment of the certain other embodiments is the simplest image plane array with respect to fabrication compared to the corresponding image plane array 1412 of other of the certain other embodiments and variants thereof of the present invention. A first variant of image plane array 1412 of the one embodiment is shown schematically in FIG. 4f. Image plane array 1412 is formed with thin fluorescent layer 1412B placed behind an array of pinholes 1412A. The efficiency for detecting beams transmitted by pinhole array 1412A can be increased by manufacturing pinhole array 1412A with a reflective backside. The size of the spacing c between pinhole array 1412A and thin fluorescent layer 1412B is selected to optimize the efficiency for detection of beams transmitted by pinhole array 1412A without significantly degrading the resolution beyond that required in an end use application. The description of the shape, size a, and spacing b of the pinholes in pinhole array 1412A is the same as the corresponding portion of the description of the shape, size a, and spacing b of the apertures in interface 1412 of the certain other embodiments of the present invention.

Figure 4G:
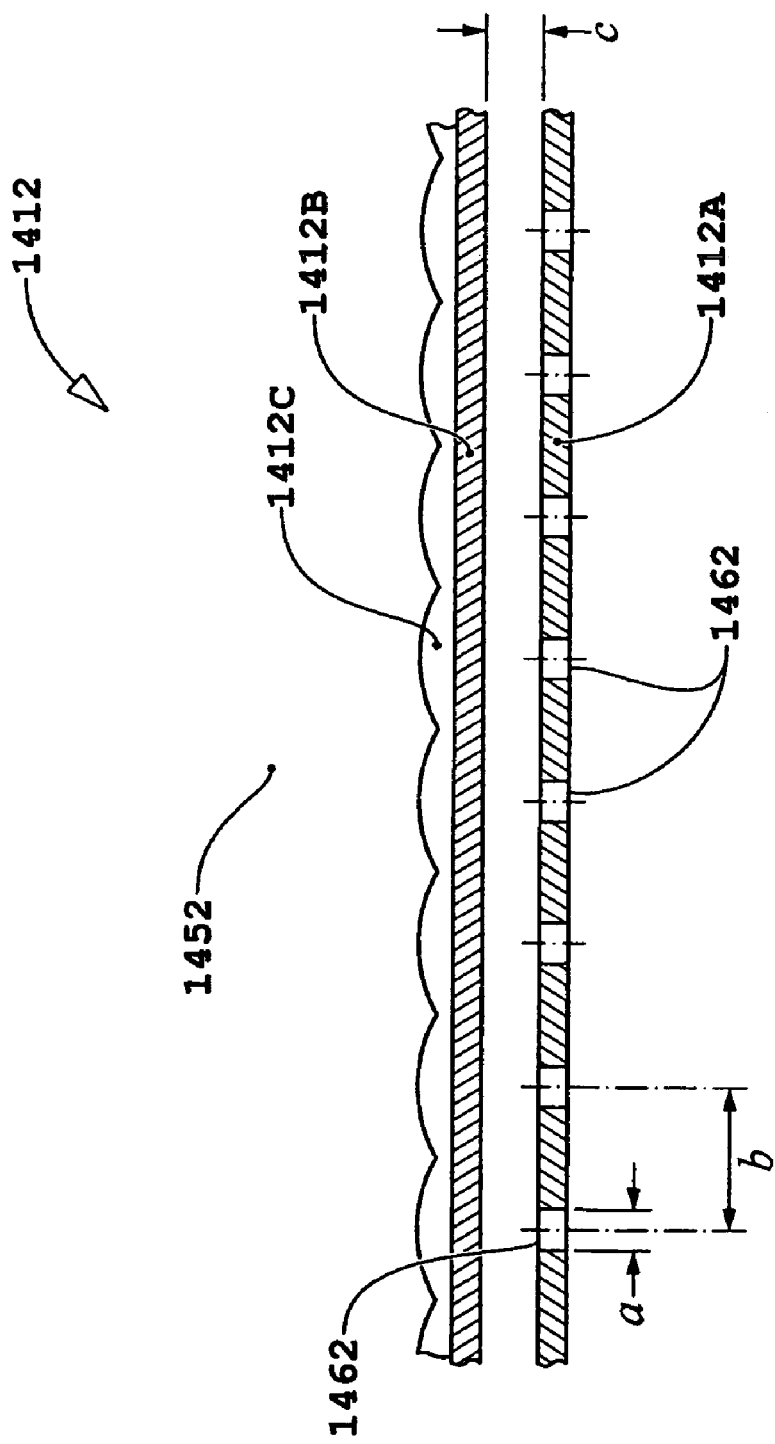
FIG. 4g is a schematic diagram of an array of microlenses placed behind a thin fluorescent layer and array of pinholes.

A second variant of image plane array 1412 of the one embodiment is shown schematically in FIG. 4g. Image plane array 1412 is formed by an array of microlenses 1412C placed behind the thin fluorescent layer 1412B and array of pinholes 1412A of the first variant of the one embodiment. The addition of the array of microlenses 1412C reduces the numerical aperture required for the second imaging system 1410B to obtain a given detection efficiency for beams transmitted by pinhole array 1412A or increases the detection efficiency for a given numerical aperture of the second imaging system 1410B.

The advantage of thin fluorescent spots of the certain other embodiments is that the fluorescent medium itself is used to define the boundary of a region to be used in generating an optical interference signal which is subsequently detected by detector 1470 with a reduced background contribution, i.e., only short wavelength light that is incident on the fluorescent spot can contribute to the generation of the optical interference signal. When an opaque screen with apertures is used to define the light to be subsequently detected, a portion of the light that is transmitted by the opaque region of the screen outside of the apertures will also be detected. This particular source of background contributions is not present when using thin fluorescent spots.

The manufacture of an array of thin fluorescent spots can be done using microlithography techniques. The description of the manufacturing of the array of thin fluorescent spots is the same as the corresponding portion of the subsequent description given in with respect to the third variant of the one embodiment of the certain other embodiments for the manufacture of thin fluorescent spots configured with a filled cone structure.

In a third variant of image plane array 1412 of the one embodiment of the certain other embodiments, image plane array 1412 is formed of an array of thin fluorescent spots wherein each spot comprises a filled cone structure to improve the detection efficiency over that of the certain other embodiments. An example of a cone structure fluorescent spot is shown schematically as element 1414A in Step 6 of FIG. 4h wherein element 1412A is an absorber, e.g., aluminum or platinum. The description of the size and spacing of the cone structures is the same as the corresponding portion of the description of the size a and spacing b of the apertures in image plane array 1412 of the one embodiment of the certain other embodiments of the present invention. The fluorescent spots in interface 1412 may also comprise filled vee groove structures to enhance detection efficiency depending on the distribution of the measurement beam spots being imaged on image plane array 1412.

Figure 4H:
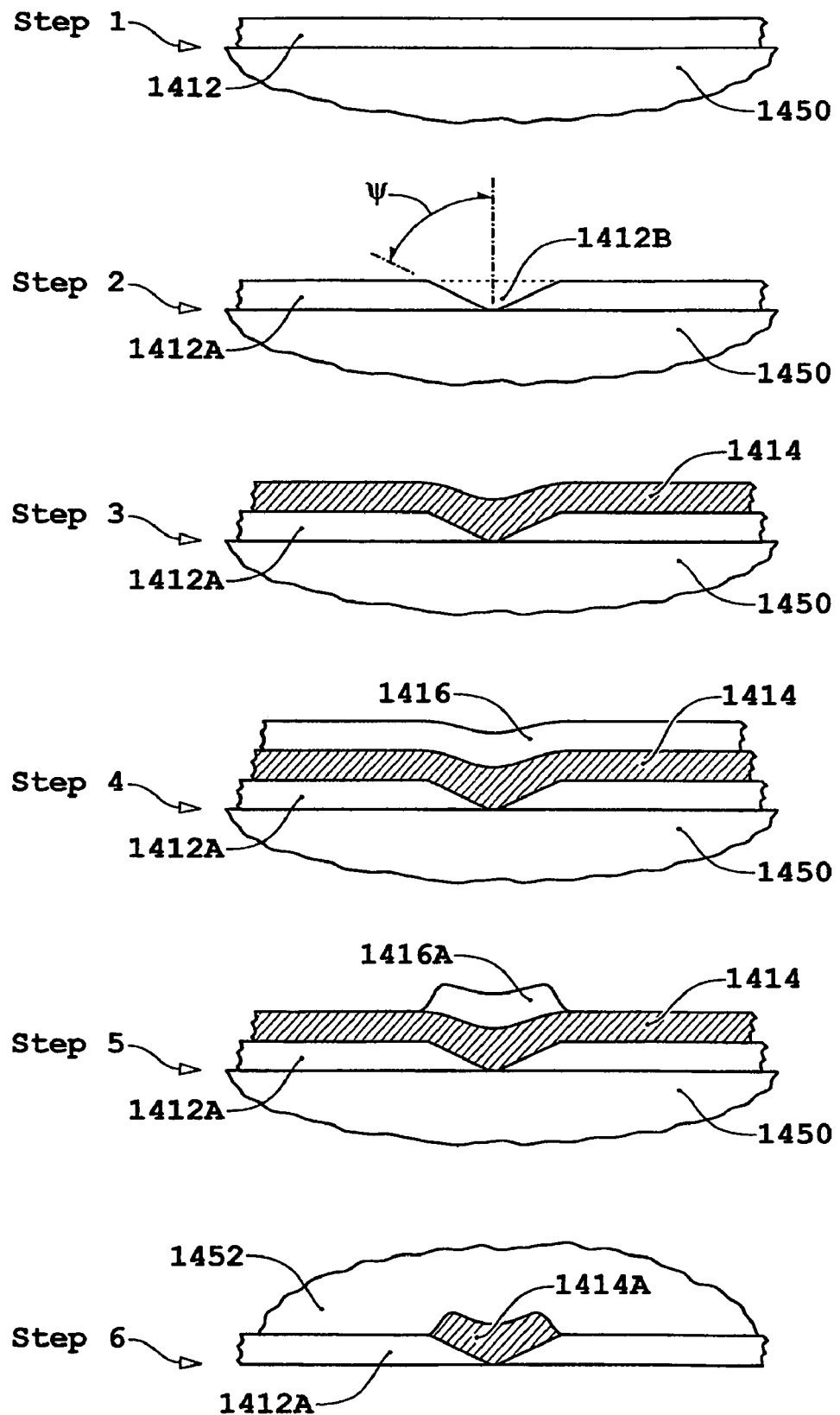
FIG. 4h is a schematic diagram of the lithography steps used in the manufacture of an array of thin fluorescent spots comprising a filled cone or vee groove structure.

The steps used in the manufacture of the array of thin fluorescent spots in the third variant of the one embodiment are set out in FIG. 4h wherein the image plane array 1412 is formed of an array of thin fluorescent spots comprising filled cone or vee groove structures. In step 1, the plane surface of a substrate 1450 is first coated with a release agent and then coated with a thin absorbing layer 1412, e.g., aluminum or platinum. The absorber medium is selected based on consideration of the reflectivity and absorption coefficient of the absorber medium at the wavelength radiated by the fluorescent medium and at the wavelengths used in imaging system 1410A, respectively. The thickness of thin absorbing layer 1412 is of the order of 10 or more thicknesses of the absorber that attenuates a beam by a factor of 1/e at the wavelength used in imaging system 1410A. In step 2, thin absorbing layer 1412 is etched to form absorbing layer 1412A with a focused ion beam (FIB) to generate the cone or vee groove shaped aperture 1412B. A typical half angle $\Psi$ of the cone or vee groove structure (see Step 2 of FIG. 4h) is 60 or 70 degrees that corresponds to numerical apertures of 0.866 and 0.940, respectively.

The half angle $\Psi$ is selected such that a portion of the fluorescent light radiated by the fluorescent spot 1414A outside of the numerical aperture of the second imaging system 1410B is reflected/scattered into the numerical aperture of the second imaging system 1410B so as to effectively increase the detection efficiency for short wavelength light incident on the fluorescent spot 1414A without degrading significantly the resolution of the second imaging system 1410B. The choice of thickness of thin absorbing layer 1412 is also based on consideration of the thickness that will contribute to generation of an increased detection efficiency. The thickness may be for example 0.5 or 1 micron. The detection efficiency can be increased by a factor of $\square$ 4 over that obtained in the one embodiment of the certain other embodiments of the present invention. A typical magnitude of the degrading of the resolution of the second imaging system 1410B is of the order of 20%.

Continuing with the description of the Steps of FIG. 4h, absorbing layer 1412A and the array of filled cone or vee groove shaped apertures 1412B are coated in Step 3 with a thin fluorescent layer 1414, e.g., lumogen. In Step 4 of FIG. 4h, thin fluorescent layer 1414 is coated with a thin layer of a negative photoresist 1416. In Step 5, photoresist layer 1416 is patterned by either contact printing or by a lithography tool, developed, and the unexposed portion of layer 1416 dissolved leaving photoresist spots 1416A. In Step 6, the substrate comprising photoresist spots 1416A and thin fluorescent layer 1414 are etched so as to remove the thin fluorescent media not covered by the photoresist spots 1416A leaving thin fluorescent spots 1414A caped with photoresist spots. The photoresist caps may be removed as shown in Step 6 of FIG. 4h. The substrate comprising the array of thin fluorescent spots 1414A with or without the photoresist spots (the photoresist spots are removed if not transparent at the wavelength of the radiation emitted by the fluorescent spots 1414A) is bonded to convex lens 1452 and lifted off of or separated from substrate 1450. In lieu of using a release agent, substrate 1450 may alternatively be removed by etching.

The advantage of thin fluorescent spots configured as filled cones or vee grooves shaped structures is that the fluorescent medium itself is used to help define the boundary of a region to be used in generating the optical interference signal, used to improve detection efficiency, and to reduce background contributions, i.e., only short wavelength light that is incident on the fluorescent spot can contribute to the generation of the optical interference signal. When an opaque screen with apertures is used to define the light to be subsequently detected, a portion of the light that is transmitted by the opaque region of the screen outside of the apertures will also be detected. This particular source of background contributions is not present when using thin fluorescent spots configured as cones or vee grooves.

Topographic Interference Signal Generation and Detection: Exposure Induced Changes in a Recording Medium The exposure induced changes in the recording medium with or without post exposure treatment may be subsequently measured interferometrically in situ either during or following the exposure cycle of a recording medium wafer or upon removal from the lithographic tool for example by an optical interferometric microscopy system. Other techniques may also be used such as an AFM to measure ex situ the latent image. In addition, techniques such as optical interferometry, AFM or SEM may be used to measure properties of the topographic interference signal in developed images upon removal from the lithography tool.

Recorded Exposure Induced Changes in a Recording Medium

The recorded exposure induced change E in the recording medium is described in terms of use in a common path interferometer without limiting the scope or spirit of embodiments of the present invention. The recorded exposure induced change E can be expressed within a scale factor as $$E = E(J') + \left(\frac{dE}{dJ}\right)_{J'} 2|A_0|^2 |T_{10}|^{1/2} |T_1|^{1/2} |\overline{U}_2||\overline{U}_1|\cos[\phi + (\varphi_1 - \varphi_2)] + \quad (1)$$
$$\frac{1}{2!}\left(\frac{d^2 E}{dJ^2}\right)_{J'} [2|A_0|^2 |T_{10}|^{1/2} |T_1|^{1/2} |\overline{U}_2||\overline{U}_1|]^2 \cos^2[\phi + (\varphi_1 - \varphi_2)] + \frac{1}{3!}$$
$$\left(\frac{d^3 E}{dJ^3}\right)_{J'} [2|A_0|^2 |T_{10}|^{1/2} |T_1|^{1/2} |\overline{U}_2||\overline{U}_1|]^3 \cos^3[\phi + (\varphi_1 - \varphi_2)] + \ldots,$$

$$J' = |A_0|^2 (T_1|\overline{U}_1|^2 + T_{10}|\overline{U}_2|^2), \quad (2)$$

where $T_1$ and $T_{10}$ are the transmission coefficients for paths associated with apertures 1030 and 1032, respectively, (see FIG. 3b), $A_0$ is the amplitude of an input beam, $\overline{U}_1$ and $\overline{U}_2$ are the spatial response functions of the first and second beams, respectively, at a location in the recording medium wherein spatial response functions $\overline{U}_1$ and $\overline{U}_2$ correspond to the integrals of the spatial impulse response functions of the optical system over the complex amplitudes of the first and second beams in the object space, $\phi$ is the relative phase of the measurement and reference beams generated by the optical system at the location in the recording medium, and E(J) is the exposure induced change in the recording medium at the location generated by an integrated flux J. For a linear recording medium, the second and higher order derivative terms of E(J) with respect to J in Eq. (1) are zero.

Attention is paid to the magnitude and functional dependence of E(J) on the integrated flux J in the selection of a particular recording medium and in the optimum value of the integrated flux J used in generation of a topographic interference signal S.

Topographic interference signal S generated by exposure induced changes in the recording medium is given within a scale factor [see Eq. (1)] as $$S = \left(\frac{dE}{dJ}\right)_{J'} [2|A_0|^2 |T_1|^{1/2} |T_{10}|^{1/2} |\overline{U}_2||\overline{U}_1|]\cos[\phi + (\varphi_1 - \varphi_2)] + \quad (3)$$
$$\frac{1}{2!}\left(\frac{d^2 E}{dJ^2}\right)_{J'} [2|A_0|^2 |T_1|^{1/2} |T_{10}|^{1/2} |\overline{U}_2||\overline{U}_1|]^2 \cos^2[\phi + (\varphi_1 - \varphi_2)] + \frac{1}{3!}$$
$$\left(\frac{d^3 E}{dJ^3}\right)_{J'} [2|A_0|^2 |T_1|^{1/2} |T_{10}|^{1/2} |\overline{U}_2||\overline{U}_1|]^3 \cos^3[\phi + (\varphi_1 - \varphi_2)] + \ldots.$$

Non-linear properties of the recording medium and a dependence of $T_1$ on $(\phi_1 - \phi_2)$ generate terms in topographic interference signal S with phases that are harmonics of phase $[\phi + (\phi_1 - \phi_2)]$, phase $(\phi_1 - \phi_2)$, and/or combinations thereof [see Eq. (3)]. Such harmonic terms are treated herein as cyclic error terms in the topographic interference signal S. The effects of the cyclic error terms are managed in various embodiments of the present invention by a series of steps such as described herein in the subsection entitled "Management of Cyclic Errors: Reduction, Elimination, and/or Compensation."

The apodizing at the edges of aperture 1032 is introduced in order to reduce the effects of Fresnel diffraction at the site where the topographic interference signal is measured and at an adjacent region of the site if required in transverse differential interferometric measurements of exposure induced changes in the recording medium. In the particular design presented for aperture 1032, the apodizing is introduced by absorbing-attenuating layer 1022 by selecting the transmission and the phase shift of absorbing-attenuating layer 1022 and the corresponding radial dimensions $r_1'-r_1$ and $r_2-r_2'$ (see FIG. 3a). Other forms of apodizing may be used without departing from the scope and spirit of implementations of the present invention.

Management of Cyclic Errors Encountered with Exposure Induced Changes in Recording Medium: Reduction Elimination, and/or Compensation Effects of the cyclic errors such as represented in Eq. (3) are managed in various embodiments of the present invention through a series of procedures. The series of procedures reduce, eliminate, and/or compensate effects of the cyclic errors. The cyclic errors that are generated as a result of certain properties of $T_1$ of the test object are reduced or eliminated in a first procedure through the reduction or elimination of the source the corresponding cyclic errors. The even harmonics cyclic errors generated by non-linear properties of the recording medium are eliminated in a second procedure through the design of the homodyne detection method used to obtain information about conjugated quadratures corresponding to a topographic interference signal S. In a third procedure, third and higher odd harmonic cyclic errors generated by the non-linear properties of the recording medium are reduced by the design of certain scaling factors. In the fourth procedure, properties of the third harmonic cyclic error generated by the non-linear properties of the recording medium are obtained from the properties of the corresponding first harmonic term in topographic interference signal S and used in conjunction with measured non-linear properties of the recording medium to compensate for the effects of the third harmonic cyclic errors.

First Procedure: Reduction or Elimination of a Potential Primary Source of Cyclic Errors Generated with Exposure Induced Changes in Recording Medium A primary source of cyclic errors is a set of test objects that have been constructed such that the respective set of $T_1$ exhibit a dependence on $(\phi_1-\phi_2)$ [see Eq. (1)]. The potential primary source is reduced or eliminated in the first procedure through the design of a set of test objects used to obtain conjugated quadratures information about topographic interference signal S. In particular, the potential primary source is reduced or eliminated in the first procedure by the selection of $|T_1|^{1/2}$ and $|T_{10}|^{1/2}$ for each of the respective test objects of the set of test objects such that $T_1$ and $T_{10}$ are the same for each of the test objects of the set of test objects.

The values of transmission coefficients $T_1$ and $T_{10}$ are designed to be the same for each of the test objects of the set of test objects so as to obtain the condition that $J'/|A_0|^2$ is the same for each test object of the set of test objects [see Eq. (2)]. When the condition of the first step is met, the contribution of the E(J') term in Eq. (1) is easily eliminated in a homodyne detection method subsequently used to obtain conjugated quadratures information about measured values of the topographic signal S in conjunction with the reduction or elimination of the potential primary source.

The information about the conjugated quadratures of topographic interference signal S is obtained in a homodyne detection method from a set of measurements of E corresponding to a set of relative phase shifts $(\phi_1-\phi_2)$, e.g., $\pi/4$, $3\pi/4$, $5\pi/4$, and $7\pi/4$. The set of relative phase shifts $(\phi_1-\phi_2)$ are generated in the set of corresponding test objects by selecting the $(\phi_1-\phi_2)$ of the set of corresponding test objects to be within a phase offset the set of relative phase shifts mod $2\pi$.

Second Procedure: Elimination of Even Harmonic Cyclic Errors Generated with Exposure Induced Changes in Recording Medium Application of the first procedure reduces or eliminates the contribution of the E(J') term in Eq. (1) in addition to the elimination of the potential primary source of the cyclic errors that are harmonics of $(\phi_1-\phi_2)$ including the first harmonic of phase $(\phi_1-\phi_2)$ in processing measured values of E(J) for information about the conjugated quadratures of a topographic signal S. The remaining cyclic errors are harmonics of phase $(\phi+\phi_1-\phi_2)$.

In the second procedure, the cyclic errors that are even harmonics of phase $(\phi+\phi_1-\phi_2)$ are reduced or eliminated in the processing of measured values of E(J) for information about the conjugated quadratures of a topographic signal S. The second procedure comprises selecting the product $|T_1|^{1/2}$ $|T_{10}|^{1/2}$ to equal some fixed value less than 1 for a corresponding set of test objects having a corresponding set of phase shifts $(\phi_1-\phi_2)$ such as $\pi/4$, $3\pi/4$, $5\pi/4$, and $7\pi/4$ and by the selection of a homodyne detection method.

The selection of the homodyne detection method is based on consideration of the condition that the cyclic error contributions that are even harmonics of $(\phi+\phi_1-\phi_2)$ be eliminated when the product $|T_1|^{1/2}|T_{10}|^{1/2}$ is equal to some fixed value for the corresponding set of test objects. An example of a homodyne detection method that meets the condition of the second procedure is based on the measurement of four values of E(J) for information about the conjugated quadratures of a topographic signal S with the corresponding set of phase shifts that are mod $\pi/2$. The set of phase shifts 0, $\pi/2$, $\pi$, and $3\pi/2$ and the set of phase shifts $\pi/4$, $3\pi/4$, $5\pi/4$, and $7\pi/4$ are two examples of sets of phase shifts that meet the condition of the second procedure [see Eq. (3)].

The topographic interference signal with the even harmonic cyclic errors eliminated by the second procedure is referenced hereinafter as $S_o$.

Third Procedure: Amplitude Reduction of Odd Harmonic Cyclic Errors Generated with Exposure Induced Changes in Recording Medium The magnitudes of the third and higher odd harmonic cyclic errors that are harmonics of phase $(\phi+\phi_1-\phi_2)$ are reduced in the third procedure through the selection of a scaling factor. That scaling factor is $|T_1||T_{10}|$ which appears in the ratio of the amplitudes of two contiguous cyclic error terms that are odd harmonics of phase $(\phi+\phi_1-\phi_2)$ [see Eq. (3)]. For the scale factor $|T_1||T_{10}|$ less than one, the effects of the higher odd harmonics of phase $(\phi+\phi_1-\phi_2)$ decrease rapidly with harmonic order.

Fourth Procedure: Compensation of Odd Harmonic Cyclic Errors Generated with Exposure Induced Changes in Recording Medium In the fourth procedure, properties of the third harmonic cyclic error generated by non-linear properties of the recording medium are obtained from the corresponding first harmonic term in topographic interference signal S and used in conjunction with measured non-linear properties of the recording medium to compensate for effects of the third harmonic cyclic error.

The cube of topographic interference signal S given by Eq. (3) with the even harmonic cyclic errors eliminated by the second procedure, i.e., $S_o$, is $$S_0^3 = \left[\left(\frac{dE}{dJ}\right)_{J'}\right]^3 [2|A_0|^2|T_1|^{1/2}|T_{10}|^{1/2}|\overline{U}_2||\overline{U}_1|]^3 \cos^3[\phi + (\varphi_1 - \varphi_2)] + \qquad (4)$$

$$\frac{3}{3!}\left[\left(\frac{dE}{dJ}\right)_{J'}\right]^2\left(\frac{d^3E}{dJ^3}\right)_{J'} [2|A_0|^2|T_1|^{1/2}|T_{10}|^{1/2}|\overline{U}_2||\overline{U}_1|]^5$$

$$\cos^5[\phi + (\varphi_1 - \varphi_2)] + \dots.$$

The non-linear properties of the recording medium represented by $d''E(j)/dJ''$ are measured independently of the measurement of the set of measurements of E(J) used to obtain values of topographic interference signal $S_o$. The measured non-linear properties are next used with Eq. (4) to obtain the following compensating signal $$\frac{1}{3!}S_o^3\left[\left(\frac{dE}{dJ}\right)_{J'}\right]^{-3}\left(\frac{d^3E}{dJ^3}\right)_{J'} = +\frac{1}{3!} \qquad (5)$$

$$\left(\frac{d^3E}{dJ^3}\right)_{J'} [2|A_0|^2|T_1|^{1/2}|T_{10}|^{1/2}|\overline{U}_2||\overline{U}_1|]^3 \cos^3[\phi + (\varphi_1 - \varphi_2)] +$$

$$\frac{1}{3!}\frac{3}{3!}\left[\left(\frac{dE}{dJ}\right)_{J'}\right]^{-1}\left[\left(\frac{d^3E}{dJ^3}\right)_{J'}\right]^2 \times$$

$$[2|A_0|^2|T_1|^{1/2}|T_{10}|^{1/2}|\overline{U}_2||\overline{U}_1|]^5 \cos^5[\phi + (\varphi_1 - \varphi_2)] + \dots.$$

The third order compensating term given by Eq. (5) is subtracted from topographic signal $S_o$ given by Eq. (3) with the even harmonic cyclic error terms eliminated by the second procedure to obtain compensated topographic signal $S_c$ with the result $$S_c = S_o - \frac{1}{3!} S_o^3 \left[ \left( \frac{dE}{dJ} \right)_{J'} \right]^{-3} \left( \frac{d^3 E}{dJ^3} \right)_{J'} \quad (6)$$

$$= \left( \frac{dE}{dJ} \right)_{J'} [2|A_0|^2 |T_1|^{1/2} |T_{10}|^{1/2} |\overline{U}_2||\overline{U}_1|] \cos[\phi + (\varphi_1 - \varphi_2)] +$$

$$\left\{ \frac{1}{5!} \left( \frac{d^5 E}{dJ^5} \right)_{J'} - \frac{1}{3!} \frac{3}{3!} \left[ \left( \frac{dE}{dJ} \right)_{J'} \right]^{-1} \left[ \left( \frac{d^3 E}{dJ^3} \right)_{J'} \right]^2 \right\} \times$$

$$[2|A_0|^2 |T_1|^{1/2} |T_{10}|^{1/2} |\overline{U}_2||\overline{U}_1|]^5 \cos^5[\phi + (\varphi_1 - \varphi_2)] + \ldots.$$

With scaling factor $|T_1||T_{10}|$ such as used in the third procedure, and other factors in Eq. (6), the magnitude of the remaining fifth harmonic cyclic error in $S_c$ has an amplitude $\lesssim 1/2000$ of the amplitude of the first harmonic signal term in $S_c$. A cyclic error with a relative amplitude of $\lesssim 1/2000$ will generate an error in the relative phase of the respective conjugated quadratures of $S_c$ that is $\lesssim 0.5$ mrad which corresponds to subnanometer metrology.

It will be evident to one skilled in the art that the technique of the fourth procedure can also be used to generate compensating signals for fifth and higher odd harmonic cyclic errors as well as even harmonic cyclic errors without departing from the scope or spirit of the fourth procedure used in embodiments of the present invention.

It will also be evident to one skilled in the art that a subset of the four procedures may be used in the management of cyclic errors without departing from the scope or spirit of the management of cyclic errors described herein for various embodiments of the present invention.

Further description of homodyne methods that may be used to obtain the measured conjugated quadratures of compensated topographic interference signal $S_c$ is given in commonly owned U.S. Pat. No. 5,760,901 (ZI-05) entitled "Method and Apparatus for Confocal Interference Microscopy with Background Amplitude Reduction and Compensation" and U.S. Pat. No. 6,445,453 B1 (ZI-14) entitled "Scanning Interferometric Near-Field Confocal Microscopy;" U.S. patent application Ser. No. 10/765,368 (ZI-47) entitled "Apparatus and Method for Joint Measurements of Conjugated Quadratures of Fields of Reflected/Scattered Beams by an Object in Interferometry" and Ser. No. 10/816,180 (ZI-50) entitled "Apparatus and Method for Joint Measurement of Fields of Scattered/Reflected Orthogonally Polarized Beams by an Object in Interferometry;" U.S. Provisional Application No. 60/602,046 (ZI-57) and U.S. patent application Ser. No. 11/204,758 (ZI-57) wherein both are entitled "Apparatus and Method for Joint And Time Delayed Measurements of Components of Conjugated Quadratures of Fields of Reflected/Scattered and Transmitted/Scattered Beams by an Object in Interferometry," and U.S. Provisional Application No. 60/611,564 (ZI-58) and U.S. patent application Ser. No. 11/229,314 (ZI-58) wherein both are entitled "Catoptric Imaging Systems Comprising Pellicle and/or Aperture-Array Beam-Splitters and Non-Adaptive and/or Adaptive Catoptric Surfaces." The two patents, the first of the two provisional patent applications, and the first three of the four patent applications are all by Henry A. Hill and the contents thereof are incorporated herein in their entirety by reference.

Interferometry Applied to Measurement of Flare

Information about the spatial profiles of the modulus of the complex amplitude and intensity of optical system flare is obtained by two different techniques in various embodiments of the present invention. One technique is based on interferometrically measured properties of conjugated quadratures corresponding to the complex amplitude of the flare. The second technique is based on a non-interferometric profile measurement of the intensity of the flare in which the non-interferometric measurement is based on flare related signals other than topographic interference signals. The application of interferometry to the measurement flare is described herein in this section with the second technique subsequently described in the section entitled "Non-Interferometric Measurement of the Intensity Profile of Flare."

Figure 6A:
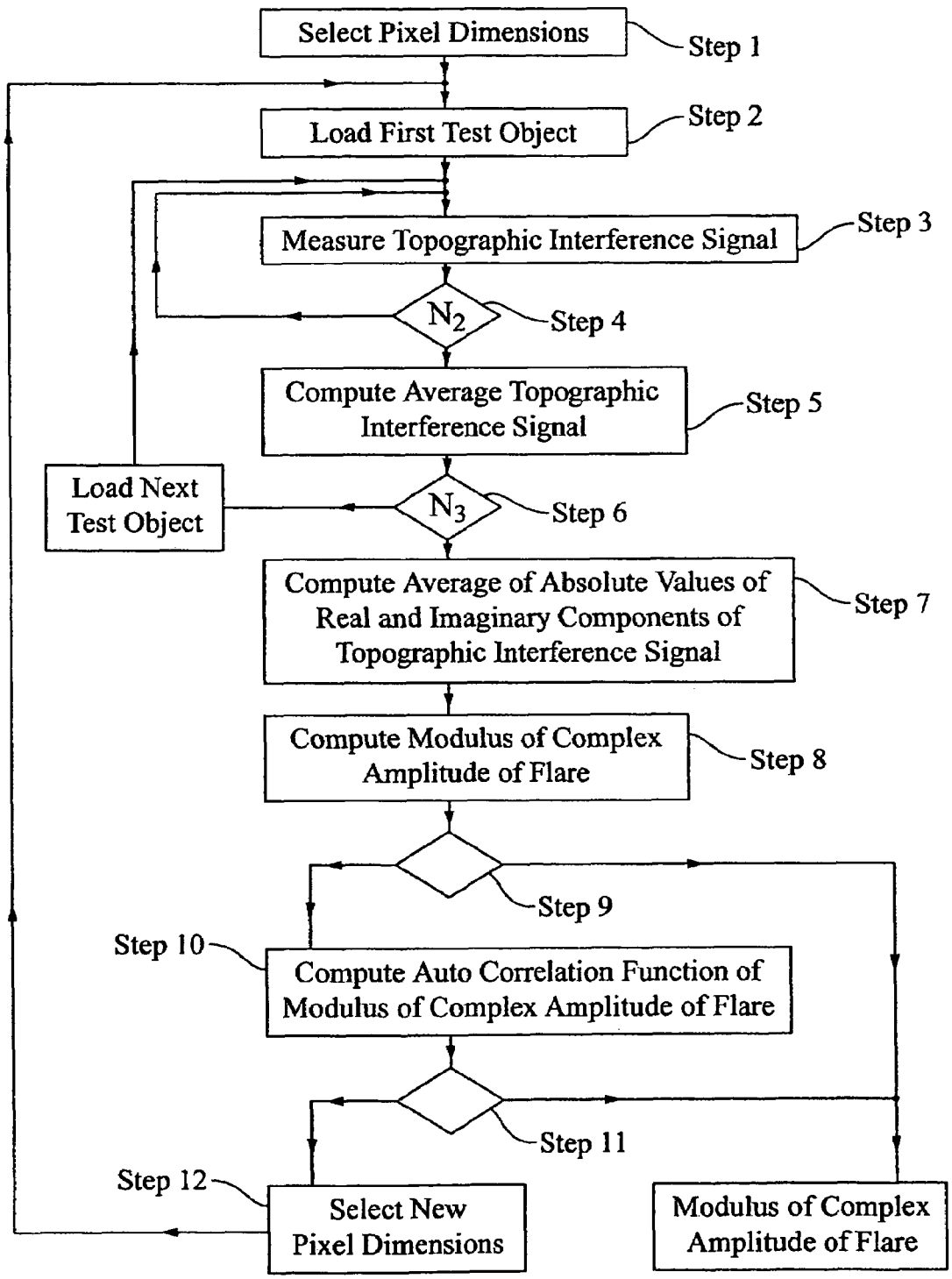
FIG. 6a is a flow diagram of steps used in making interferometric profile measurements of the modulus of the complex amplitude of flare.
Figure 6B:
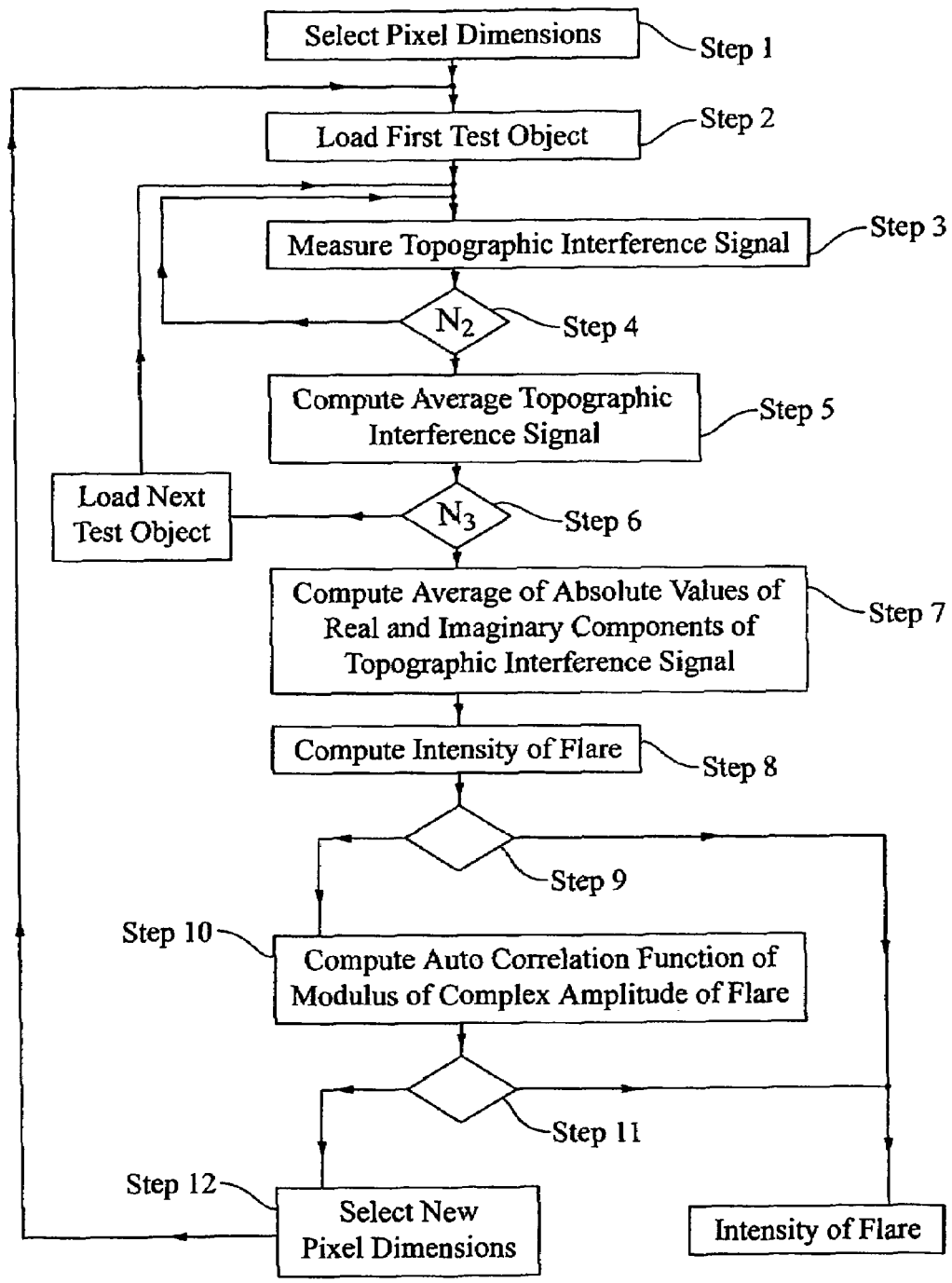
FIG. 6b is a flow diagram of steps used in making interferometric profile measurements of intensity of flare.

The application of interferometry to the spatial profile measurement of the modulus of the complex amplitude of flare is described with reference to FIG. 6a and the application of interferometry to the spatial profile measurement of the intensity of flare is described with reference to FIG. 6b.

Interferometric Profile Measurement of the Modulus of the Complex Amplitude of Flare The application of interferometry to the spatial profile measurement of the modulus of the complex amplitude of flare is described with reference to FIG. 6a in terms of the following steps.

Schedule of Steps I

Step 1: Select values for two corresponding characteristic linear dimensions of the aperture of a detector "pixel" for either a photon detector or a recording medium serving as a detector wherein the term pixel refers to the effective aperture of an element of the detector in the image plane that is conjugate to the object plane of the optical system under test;

Step 2: Load the first test object in the interferometer;

Step 3: The conjugated quadratures of the topographic interference signal are measured for a first test object comprising an array of $N_1$ diffraction sites which generate diffracted beams that have a set randomized relative phases;

Step 4: Repeat Step 2 ($N_2$–1) times for the same test object to reduce the statistical errors associated with measurement of the real and imaginary components of the respective complex amplitude profile of flare;

Step 5: Compute the average of the set of $N_2$ measured conjugated quadratures of the topographic interference signal;

Step 6: Repeat Steps 3, 4, and 5 are for each of a set of ($N_3$–1) additional independent test objects wherein the classification as independent is made with respect to the respective sets of relative randomized phases of beams diffracted by diffraction sites of the set of test objects, i.e., the respective sets of randomized phases are randomized with respect to each other;

Step 7: Compute the average of the absolute values of the set of $N_3$ average values of the conjugated quadratures of the topographic interference signal;

Step 8: Compute the modulus of the topographic interference signal by adding the average values of the absolute values of the set of $N_3$ average values of the conjugated quadratures of the topographic interference signal obtained in Step 7.

Step 9: Compute the modulus of the complex amplitude of flare from the modulus of the topographic interference signal obtained in Step 8;

Step 10: If an increase in spatial resolution and/or in statistical accuracy is desired beyond that achieved through Step 9, the autocorrelation function for the modulus of the complex amplitude of the flare is determined from the measured properties of the modulus of the complex amplitude of the flare obtained in Step 9;

Step 11*a*: If the widths of the autocorrelation function corresponding to the two corresponding characteristic linear dimensions of a pixel (see Step 1) are larger than the two respective characteristic linear dimensions of a pixel used in the Steps I leading up to Step 11*a*, the two characteristic linear dimensions of the detector pixel are set equal to ≅½ of the respective widths of the autocorrelation function obtained in Step 10; or Step 11*b*: If the widths of the autocorrelation function corresponding to the two corresponding characteristic linear dimensions of a pixel (see Step 1) are approximately equal to the two respective characteristic linear dimensions of a pixel used in the Steps 11 leading up to Step 11*a* and Step 11*b* and if an increase in spatial resolution is desired, the two characteristic linear dimensions of the detector pixel are set equal to a fraction, e.g., ¼ or ⅛, of the respective widths of the autocorrelation function obtained in Step 10;

Step 12: Step 2 through Step 9 are repeated to obtain a respective measured profile for the modulus of the complex amplitude of the flare.

Step 13: If the path to Step 12 which includes Step 11*b* and if a further increase in spatial resolution is desired beyond that achieved through Step 12, Step 10, Step 11*b*, and Step 12 are repeated one or more times as required or until the maximum spatial resolution is achieved as indicated by properties of the autocorrelation function of measured profiles of the modulus of the amplitude of flare.

Step 1 in the Schedule of Steps I is initiated using for example considerations such as statistical accuracy and spatial resolution to be obtained in the measurements of modulus of the complex amplitude profile of flare. In general, preferred values for the two characteristic linear dimensions of the aperture of a detector pixel is ≅½ of the respective widths of the autocorrelation function of the modulus of the complex amplitude of flare such as may be subsequently measured in Step 10. The specification in Step 1 with respect to the two characteristic linear dimensions is based in part on the sampling theorem so as not to lose spatial information about the modulus of the complex amplitude profile of flare.

In addition, the contributions of the flare from different portions of a pixel add coherently when the sampling theorem specification is met so that the topographic interference signal is proportional to the area of the pixel and not the square root of the area of the pixel which would be the case if the portions were to add incoherently. For an increase of the two characteristic linear dimensions of the aperture of the detector pixel beyond the corresponding widths of the intrinsic autocorrelation function of the amplitude of the flare, the corresponding increase in the topographic interference signal is proportional to the square root of the area of the pixel.

If the resolution for which the measured properties of the modulus of the complex amplitude of the flare obtained in Step 9 is sufficient, no further Steps of the Schedule of Steps 1 need be pursued. However, if it desired in an end use application to have a spatial resolution better than the spatial resolution set by the selection of the two characteristic linear dimensions of the aperture of a detector pixel of Step 1, Step 10 is undertaken to determine whether this is a relevant option: if the spatial resolution corresponding to the respective widths of the autocorrelation function obtained in Step 10 are greater than the respective spatial resolution set by the two characteristic linear dimensions of a pixel, no further gain in spatial resolution can be obtained by changing the characteristic linear dimensions of the detector pixel although an increase in statistical accuracy can be obtained.

However, if the spatial resolution corresponding to the respective widths of the autocorrelation function obtained in Step 10 is approximately equal to the respective spatial resolution set by the two characteristic linear dimensions of a detector pixel, an improvement in spatial resolution may be achieved by reducing the two characteristic linear dimensions of the aperture of a detector pixel set in Step 1 to a fraction, e.g., ¼, or ⅛, of the respective widths of the autocorrelation function obtained in Step 10.

In Step 3, measured signal $S_{i,j}$ from either a photon detector or measured changes in a recording medium for a given pixel of a detector follows the usual phase-shifting interferometry equation, i.e., $$S_{i,j} = |A_{R,j}|^2 + |A_{B,j}|^2 + |A_{f,j}|^2 + 2|A_{R,j}||A_{f,j}|\cos(\phi_j + \phi_i) + \ldots \tag{7}$$

where $|A_{R,j}|$, $|A_{B,j}|$, and $|A_{f,j}|$ are the modulii of the amplitudes of the reference, background, and flare beams, respectively, for measurement index j; $\phi_j$ is the phase of the complex flare amplitude $A_{f,j}$ relative to the complex reference amplitude $A_{R,j}$; and $\phi_i$ with index i is the phase shift introduced between the reference and measurement beams by the interferometer for i=1, 2, 3 or larger depending on the homodyne detection method employed.

As a result of the fabrication of a test object comprising an array of diffraction sites with a set of randomized relative phases, the recorded complex amplitude of the flare is statistically proportional to $\sqrt{N_1}$ times the amplitude of the flare generated by an individual diffraction site.

The conjugated quadratures $F_{1,j}$ and $F_{2,j}$ of the topographic interference signal and respective standard deviations are given for the case of i=1, 2, 3 and 4 with the corresponding values of $\phi_i$ equal to 0, $\pi/2$, $\pi$, $3\pi/2$, respectively, as $$F_{1,j} = S_{1,j} - S_{3,j} \tag{8}$$
$$= 4|A_{R,j}||A_{f,j}|\cos\varphi_j + (SE)_1 \pm \sqrt{2}\,|A_{R,j}|$$
$$\left[1 + \left(\frac{|A_{B,j}|}{|A_{R,j}|}\right)^2 + \left(\frac{|A_{f,j}|}{|A_{R,j}|}\right)^2\right]^{1/2}$$
$$= 4|A_{R,j}|\mathrm{Re}A_{f,j} + (SE)_1 \pm \sqrt{2}\,|A_{R,j}|$$
$$\left[1 + \left(\frac{|A_{B,j}|}{|A_{R,j}|}\right)^2 + \left(\frac{|A_{f,j}|}{|A_{R,j}|}\right)^2\right]^{1/2},$$

$$F_{2,j} = S_{2,j} - S_{4,j} \tag{9}$$
$$= 4|A_{R,j}||A_{f,j}|\sin\varphi_j + (SE)_2 \pm \sqrt{2}\,|A_{R,j}|$$
$$\left[1 + \left(\frac{|A_{B,j}|}{|A_{R,j}|}\right)^2 + \left(\frac{|A_{f,j}|}{|A_{R,j}|}\right)^2\right]^{1/2}$$
$$= 4|A_{R,j}|\mathrm{Im}A_{f,j} + (SE)_2 \pm \sqrt{2}\,|A_{R,j}|$$
$$\left[1 + \left(\frac{|A_{B,j}|}{|A_{R,j}|}\right)^2 + \left(\frac{|A_{f,j}|}{|A_{R,j}|}\right)^2\right]^{1/2},$$

where $\mathrm{Re}\,A_{f,j}$ and $\mathrm{Im}\,A_{f,j}$ are the real and imaginary components, respectively, of complex amplitude $A_{f,j}$ and $(SE)_1$ and $(SE)_2$ are systematic errors in $F_{1,j}$ and $F_{2,j}$, respectively.

With reference to Step 5, average values $\langle F_{1,j}\rangle$ and $\langle F_{2,j}\rangle$ of the conjugated quadratures $F_{1,j}$ and $F_{2,j}$ and respective standard deviations $\sigma_{\langle F_{1,j}\rangle}$ and $\sigma_{\langle F_{2,j}\rangle}$ from $N_2$ measurements are, given by the equations $$\langle F_{1,j} \rangle = \tag{10}$$
$$4|A_{R,j}|\text{Re}A_{f,j} + (SE)_1 \pm \left(\frac{2}{N_2}\right)^{1/2}|A_{R,j}|\left[1 + \left(\frac{|A_{B,j}|}{|A_{R,j}|}\right)^2 + \left(\frac{|A_{f,j}|}{|A_{R,j}|}\right)^2\right]^{1/2},$$

$$\langle F_{2,j} \rangle = \tag{11}$$
$$4|A_{R,j}|\text{Im}A_{f,j} + (SE)_2 \pm \left(\frac{2}{N_2}\right)^{1/2}|A_{R,j}|\left[1 + \left(\frac{|A_{B,j}|}{|A_{R,j}|}\right)^2 + \left(\frac{|A_{f,j}|}{|A_{R,j}|}\right)^2\right]^{1/2}.$$

The value of $N_2$ is selected such that the relative error for effect of the statistical errors in average values $\langle F_{1,j} \rangle$ and $\langle F_{2,j} \rangle$ used in computing the modulus of a complex amplitude is less than some predetermined value, e.g., ⅓ [see Eqs (17) and (18)].

With reference to Step 7, average values of the absolute values of $\langle F_{1,j} \rangle$ and $\langle F_{2,j} \rangle$ are computed with the following approximations:

$$|\langle F_{1,j} \rangle| \cong \langle F_{1,j} \rangle \text{sign}\langle F_{1,j} \rangle, \tag{12}$$

$$|\langle F_{2,j} \rangle| \cong \langle F_{2,j} \rangle \text{sign}\langle F_{2,j} \rangle, \tag{13}$$

where $\text{sign}\langle F_{1,j} \rangle$ and $\text{sign}\langle F_{2,j} \rangle$ are the signs of $\langle F_{1,j} \rangle$ and $\langle F_{2,j} \rangle$, respectively. The approximation signs in the relationships expressed by Eqs (12) and (13) reduce to equality signs when the statistical errors of $\langle F_{1,j} \rangle$ and $\langle F_{2,j} \rangle$ go to zero. Corrections for the effects of the statistical errors are made in Step 9 in the computation of the modulus of the complex amplitude of flare.

The average values $\langle\langle F_{1,j} \rangle \text{sign}\langle F_{1,j} \rangle\rangle$ and $\langle\langle F_{2,j} \rangle \text{sign}\langle F_{2,j} \rangle\rangle$ are computed in Step 7 for the absolute values of the conjugated quadratures of the interference topographic signal for $N_3$ measurements. The results are $$\langle\langle F_{1,j} \rangle \text{sign}\langle F_{1,j} \rangle\rangle = +4|A_{R,j}|\frac{1}{N_3}\sum_{p=1}^{N_3}[\text{Re}A_{f,j}\text{sign}\langle F_{1,j} \rangle]_p + \tag{14}$$
$$\frac{(SE)_1}{N_3}\sum_{p=1}^{N_3}[\text{sign}\langle F_{1,j} \rangle]_p \pm$$
$$\left(\frac{2}{N_2 N_3}\right)^{1/2}|A_{R,j}|\left[1 + \left(\frac{|A_{B,j}|}{|A_{R,j}|}\right)^2 + \left(\frac{|A_{f,j}|}{|A_{R,j}|}\right)^2\right]^{1/2},$$

$$\langle\langle F_{2,j} \rangle \text{sign}\langle F_{2,j} \rangle\rangle = +4|A_{R,j}|\frac{1}{N_3}\sum_{p=1}^{N_3}[\text{Im}A_{f,j}\text{sign}\langle F_{2,j} \rangle]_p + \tag{15}$$
$$\frac{(SE)_2}{N_3}\sum_{p=1}^{N_3}[\text{sign}\langle F_{2,j} \rangle]_p \pm$$
$$\left(\frac{2}{N_2 N_3}\right)^{1/2}|A_{R,j}|\left[1 + \left(\frac{|A_{B,j}|}{|A_{R,j}|}\right)^2 + \left(\frac{|A_{f,j}|}{|A_{R,j}|}\right)^2\right]^{1/2}.$$

In Step 8, the modulus of the topographic interference signal is computed by adding the average values of the absolute values of the set of $N_3$ average values of the conjugated quadratures of the topographic interference signal obtained in Step 7. The relationship between the average with respect to a randomly distributed θ of the modulus of a complex amplitude with real and imaginary components, cos θ and sin θ, respectively, which is 1 and the sum of the absolute values of the complex amplitudes |cos θ| and |sin θ| is $$\langle|\cos\theta|\rangle + \langle|\sin\theta|\rangle = \frac{4}{\pi} \pm \left[\frac{(2+\pi)\pi - 16}{\pi^2}\right] \cong \frac{4}{\pi} \pm \frac{1}{8}. \tag{16}$$

The value of $N_3$ is selected such that the relative effect of the statistical error obtained in computing the average modulus is less than or of the same size as the relative effect of the approximation used in computing the modulus [see Eq. (16)].

The correction for the effects of statistical errors in the computation of the absolute values of the conjugated quadratures is given to first order effects by the equations $$\langle F_{1,j} \rangle \text{sign}\langle F_{1,j} \rangle = |\langle F_{1,j} \rangle|\left(1 - \frac{\sigma_{\langle F_{1,j} \rangle}}{|\langle F_{1,j} \rangle|}\right), \tag{17}$$

$$\langle F_{2,j} \rangle \text{sign}\langle F_{2,j} \rangle = |\langle F_{2,j} \rangle|\left(1 - \frac{\sigma_{\langle F_{2,j} \rangle}}{|\langle F_{2,j} \rangle|}\right). \tag{18}$$

The modulus of the complex amplitude of flare is computed in Step 9 from the modulus of the topographic interference signal obtained in Step 8 using measured values of the topographic interference signal corresponding to attenuated images of the measurement beam source 1030 as a measure of the integrated flux and making corrections for the approximation used in computing the modulus [see Eq. (16)] and making corrections for effects of statistical errors in the computation of the absolute values of the conjugated quadratures [see Eqs. (17) and (18)].

An advantage of Step 8 is with respect to treatment of systematic errors. The procedure in Step 8 computes the modulus of the topographic interference signal by adding the average values of the absolute values of the set of $N_3$ average values of the conjugated quadratures of the topographic interference signal obtained in Step 7. The procedure of adding the absolute values of the conjugated quadratures of the topographic interference signal in Step 8 corresponds to a heterodyne technique with respect to treatment of the systematic error: the heterodyne technique converts a systematic error at "DC" in a frequency space to a broadband modulated systematic error at nonzero frequencies in the frequency space. As a consequence, the average value of the modulated systematic error is zero:

$$\frac{1}{N_3}\sum_{p=1}^{N_3}[\text{sign}\langle F_{1,j} \rangle]_p = 0 \pm \frac{1}{\sqrt{N_3}}, \tag{19}$$

$$\frac{1}{N_3}\sum_{p=1}^{N_3}[\text{sign}\langle F_{2,j} \rangle]_p = 0 \pm \frac{1}{\sqrt{N_3}}. \tag{20}$$

Therefore, the contribution of the systematic errors are on the average reduced to zero. The result with respect to the systematic error is an important advantage of the procedure to obtain the modulus of the complex amplitude of flare.

Interferometric Profile Measurement of the Intensity of Flare

The application of interferometry to the spatial profile measurement of the intensity of flare comprises many of the same steps of the Schedule of Steps I as described in the preceding Section entitled "Interferometric Profile Measurement of the Modulus of the Complex Amplitude of Flare". The application is described with reference to FIG. 6b in terms of the following steps.

Schedule of Steps II

Step 1: Select values for two corresponding characteristic linear dimensions of the aperture of a detector "pixel" for either a photon detector or a recording medium serving as a detector wherein the term pixel refers to the effective aperture of an element of the detector in the image plane that is conjugate to the object plane of the optical system under test;

Step 2: Load the first test object in the interferometer;

Step 3: The conjugated quadratures of the topographic interference signal are measured for a first test object comprising an array of $N_1$ diffraction sites that generate diffracted beams that have a set randomized relative phases;

Step 4: Repeat Step 2 ($N_2$–1) times for the same test object to reduce the statistical errors associated with measurement of the real and imaginary components of the respective complex amplitude profile of flare;

Step 5: Compute the average of the set of $N_2$ measured conjugated quadratures of the topographic interference signal;

Step 6: Repeat Steps 3, 4, and 5 are for each of a set of ($N_3$–1) additional independent test objects wherein the classification as independent is made with respect to the respective sets of relative randomized phases of beams diffracted by diffraction sites of the set of test objects, i.e., the respective sets of randomized phases are randomized with respect to each other;

Step 7: Compute the average of the square of the values of the set of $N_3$ average values of the conjugated quadratures of the topographic interference signal;

Step 8: The square of the modulus of the topographic interference signal is obtained as the sum of the average of the square of the values of the set of $N_3$ average values of the conjugated quadratures of the topographic interference signal;

Step 9: Compute the intensity of flare from the square of the modulus of the topographic interference signal obtained in Step 8;

Step 10: If an increase in spatial resolution and/or in statistical accuracy is desired beyond that achieved through Step 9, the autocorrelation function for the intensity of the flare is determined from the measured properties of the intensity of the flare obtained in Step 9;

Step 11a: If the widths of the autocorrelation function corresponding to the two corresponding characteristic linear dimensions of a pixel (see Step 1) are larger than the two respective characteristic linear dimensions of a pixel used in the Steps II leading up to Step 11a, the two characteristic linear dimensions of the detector pixel are set equal to ≅½ of the respective widths of the autocorrelation function obtained in Step 10; or Step 11b: If the widths of the autocorrelation function corresponding to the two corresponding characteristic linear dimensions of a pixel (see Step 1) are approximately equal to the two respective characteristic linear dimensions of a pixel used in the Steps II leading up to Step 11a and Step 11b and if an increase in spatial resolution is desired, the two characteristic linear dimensions of the detector pixel are set equal to a fraction, e.g., ¼ or ⅛, of the respective widths of the autocorrelation function obtained in Step 10;

Step 12: Step 2 through Step 9 are repeated to obtain a respective measured profile for the intensity of the flare.

Step 13: If the path to Step 12 which includes Step 11b and if a further increase in spatial resolution is desired beyond that achieved through Step 12, Step 10, Step 11b, and Step 12 are repeated one or more times as required or until the maximum spatial resolution is achieved as indicated by properties of the autocorrelation function of measured profiles of the intensity of flare.

The remaining description of the steps of the Schedule of Steps II is the same as the corresponding portion of the description of the steps of the Schedule of Steps I accept with respect to step 8.

Procedure to Enhance Detection Efficiency of Topographic Interferometric Signal

The detection efficiency of the effects of flare generated by an optical system may be increased in various embodiments of the present invention by using an anti-reflecting (AR) layer 420 at the top surface of recording layer 410 such as shown diagrammatically in FIG. 4a. Layer 430 may also be an AR layer to reduce the effects of an exposing beam making multiple passes through the recording layer 410 and thus in conjunction with AR layer 420 improves the resolution that can be achieved in recording information in recording layer 410. AR layers 420 and 430 also eliminate the portion of the amplitude of measurement beam components of a respective interferometer that would otherwise be generated as reflected measurement beam components by AR layers 420 and 430. The elimination of the portion of the amplitude of the measurement beam components effectively converts the respective interferometer to an interferometer operating in a dark field mode at the wavelength of the exposure beam or actinic wavelength.

The description of and advantages of an interferometer operating in a dark field mode are the same as corresponding portions of the description given for differential interferometer systems given in cited commonly owned U.S. Pat. No. 5,760,901 (ZI-05); in commonly owned U.S. Provisional Patent Applications No. 60/447,254 (ZI-40) entitled "Transverse Differential Interferometric Confocal Microscopy" and No. 60/448,360 (ZI-41) entitled "Longitudinal Differential Interferometric Confocal Microscopy for Surface Profiling" and for dark field interferometer systems given in commonly owned U.S. Provisional Patent Application No. 60/448,250 (ZI-42) entitled "Thin Film Metrology Using Interferometric Confocal Microscopy;" and in commonly owned U.S. patent application Ser. No. 10/778,371 (ZI-40) entitled "Transverse Differential Interferometric Confocal Microscopy," Ser. No. 10/782,057 (ZI-41) entitled "Longitudinal Differential Interferometric Confocal Microscopy for Surface Profiling," and Ser. No. 10/782,058 (ZI-42) entitled "Method And Apparatus For Dark Field Interferometric Confocal Microscopy" wherein each is by Henry A. Hill. The contents of the six applications are herein incorporated in their entirety by reference.

AR layers 420 and 430 can also be configured with different optical thicknesses of a non-absorbing type medium to enable enhancement of the detection efficiency of the topographic interferometric signal and still serve the purpose of AR layers to reduce the effects of an exposing beam making multiple passes through the recording layer 410. The optical thicknesses of AR layers 420 and 430 are designed to be >1, e.g., □ 4 and □ 2, respectively, so that there are two arrays of wavelengths at which the reflectivity of the respective interfaces are at low extremum values. The array of wavelengths for each of AR layers 420 and 430 include the actinic wavelength, i.e., the wavelength of the exposure beam. The optical thickness of AR layer 420 is also designed to be larger than the optical thickness of AR layer 430 such that the array of wavelengths for AR layer 430 is a subset of the array of wavelengths of AR layer 420, e.g., the elements of the array of wavelengths for AR layer 430 correspond to every second element of the array of wavelengths for AR layer 420. At the wavelengths of the remaining elements of the array of wavelengths for AR layer 420, the reflectivity of AR layer 430 is a relative large non-zero extremum.

The enhancement is enabled by selecting the wavelength of interferometer 10 to coincide with one of the wavelengths of the remaining elements of the array of wavelengths for AR layer 420. Operating at one of the wavelengths of the remaining elements, the measurement beam of a respective interferometer is transmitted by AR layer 420 and makes a first pass through recording layer 410, a portion thereof is reflected with a relative large amplitude by AR layer 430 and the reflected portion thereof makes a second pass through recording layer 410, and the second pass beam is transmitted by AR layer 420. Thus the effect of exposure induced changes on the index of refraction of recording layer 410 can be measured with the respective interferometer effectively operating in a transmission mode with respect to recording layer 410 and with a reduced background signal generated by AR layer 420.

Procedure to Enhance Detection Efficiency of Flare: Reflecting Layer

The detection efficiency of flare may be increased in various embodiments of the present invention by using a reflecting layer 432 at the interface between substrate 60 and recording layer 410 such as shown diagrammatically in FIG. 4b. Reflecting layer 432 increases the optical path in recording layer 410 of portions of a beam incident on recording layer 410 resulting increased exposure of recording layer 410. There is a reduced spatial resolution with respect to information recorded in recording layer 410 that accompanies the increase in detection efficiency. However, the reduction in spatial resolution is not a problem with respect to the non-coherent component of flare which generally exhibits only low spatial frequencies.

The apparatus described in various embodiments of the present invention comprise examples of either a pinhole confocal interference microscopy system or a slit confocal interference microscopy system. The background reduction capacity of a confocal microscopy system is one of its most important attributes and results from the strong optical sectioning property of confocal microscopy. This is of a completely different nature from the restricted depth of field in conventional microscopy, the difference being that in a conventional microscope out-of-focus information is merely blurred, whilst in the confocal system it is actually detected much less strongly: light scattered at some place axially separated from the focal plane is defocused at the detector plane and hence fails to pass efficiently through a mask placed there [cf. C. J. R. Sheppard and C. J. Cogswell, "Three-dimensional Imaging In Confocal Microscopy", *Confocal Microscopy*, edited by T. Wilson, (Academic Press, London), pp. 143-169 (1990)].

There are two useful modes of the non-fluorescent confocal scanning microscope [C. J. R. Sheppard, "Scanning Optical Microscopy", in: *Advances in Optical and Electron Microscopy*, 10, (Academic, London, 1987); C. J. R. Sheppard and A. Choudhury, *Optica Acta*, 24(10), pp. 1051-1073 (1977)]: the reflection-mode and the transmission-mode. In practice, it is easy to achieve with the confocal microscope the optical sectioning by scanning the object along the axial direction [such as described in cited U.S. Pat. No. 5,760,901 (ZI-05); C. J. R. Sheppard and C. J. Cogswell, *J. Microscopy*, 159(Pt 2), pp. 179-194 (1990); C. J. R. Sheppard and T. Wilson, *Optics Lett.*, 3, pp. 115-117 (1978); C. J. R. Sheppard, D. K. Hamilton, and I. J. Cox, *Proc. R. Soc. Lond., A* 387, pp. 171-186 (1983)] and thus form three-dimensional images.

The information represented by the three-dimensional images of the exposure induced changes in the recording medium 410 obtained in various embodiments of the present invention is derived from arrays of measured conjugated quadratures of scattered/reflected measurement beams. The phases of the arrays of measured conjugated quadratures contains information about the locations of changes in the exposure induced changes in the recording medium in the axial direction of interferometer 10 such as described in cited U.S. Pat. No. 5,760,901 (ZI-05). The axial direction may be normal to the surface of substrate 60 (see FIG. 2a herein) or at some oblique angle [see FIG. 1b of referenced U.S. Provisional Patent Application No. 60/624,707 (ZI-68) and U.S. patent application Ser. No. 11/208,424 (ZI-68)].

The information about the profile of the exposure induced changes in the recording medium in the axial direction of interferometer 10 is obtained directly from the phases of the measured arrays of conjugated quadratures. The spatial wavelength of structure in the exposure induced changes in the axial direction that can be measured is greater than or of the order of $\lambda/2$ depending on the numerical aperture of interferometer 10.

The background may also be reduced in various embodiments of the present invention by the use of phase shift arrays located in the pupil of the interferometer such as described in cited U.S. Pat. No. 5,760,901 (ZI-05).

Non-Interferometric Measurement of the Intensity Profile of Flare

Test Objects for Non-Interferometric Measuring Intensity Profile of Flare

Figure 5A:
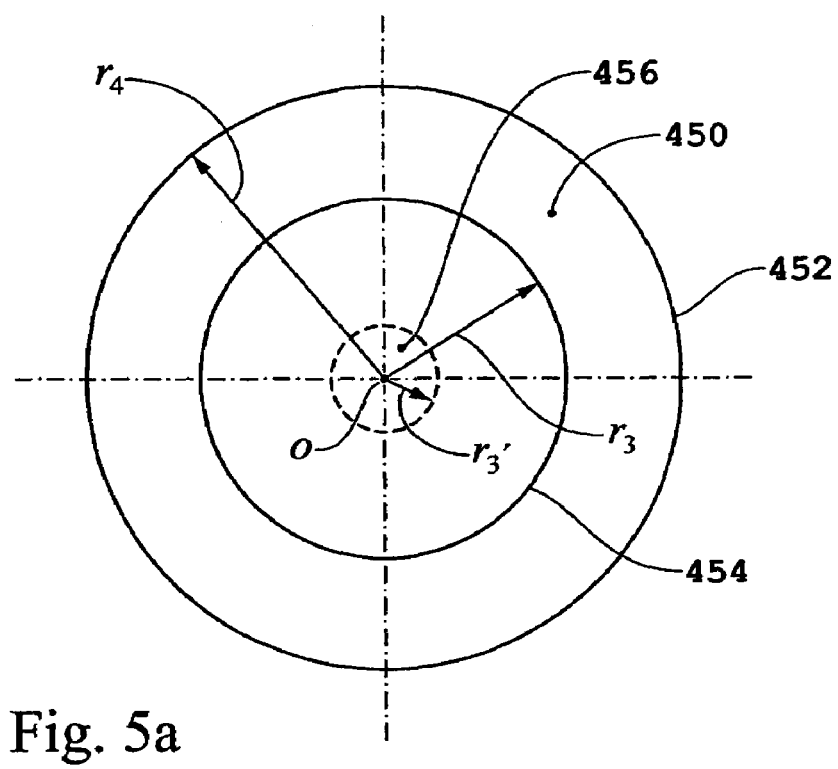
FIG. 5a is a diagram of a test object for measuring axial symmetric components of flare.
Figure 5B:
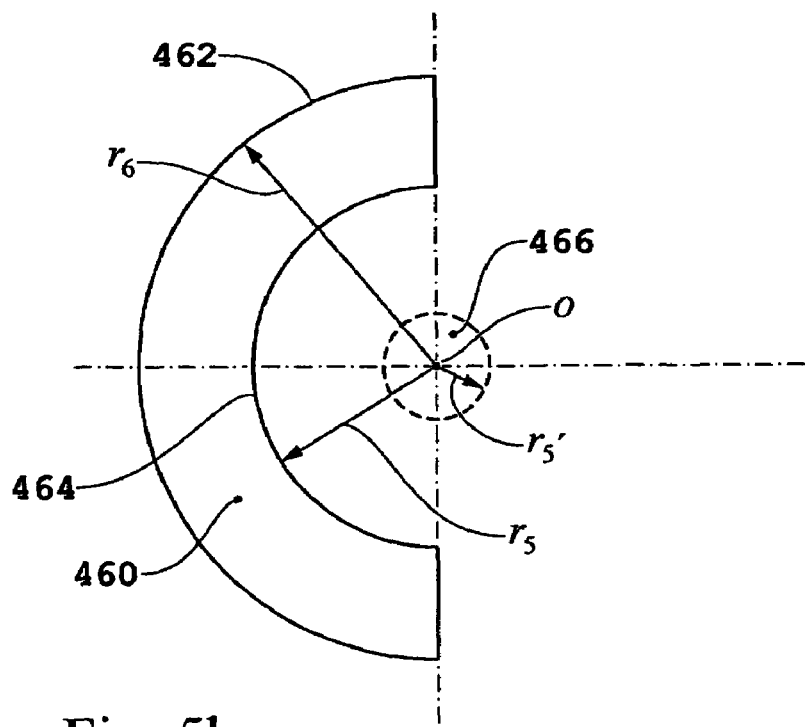
FIG. 5b is a diagram of a test object for measuring non-axial symmetric components of flare.
Figure 5C:
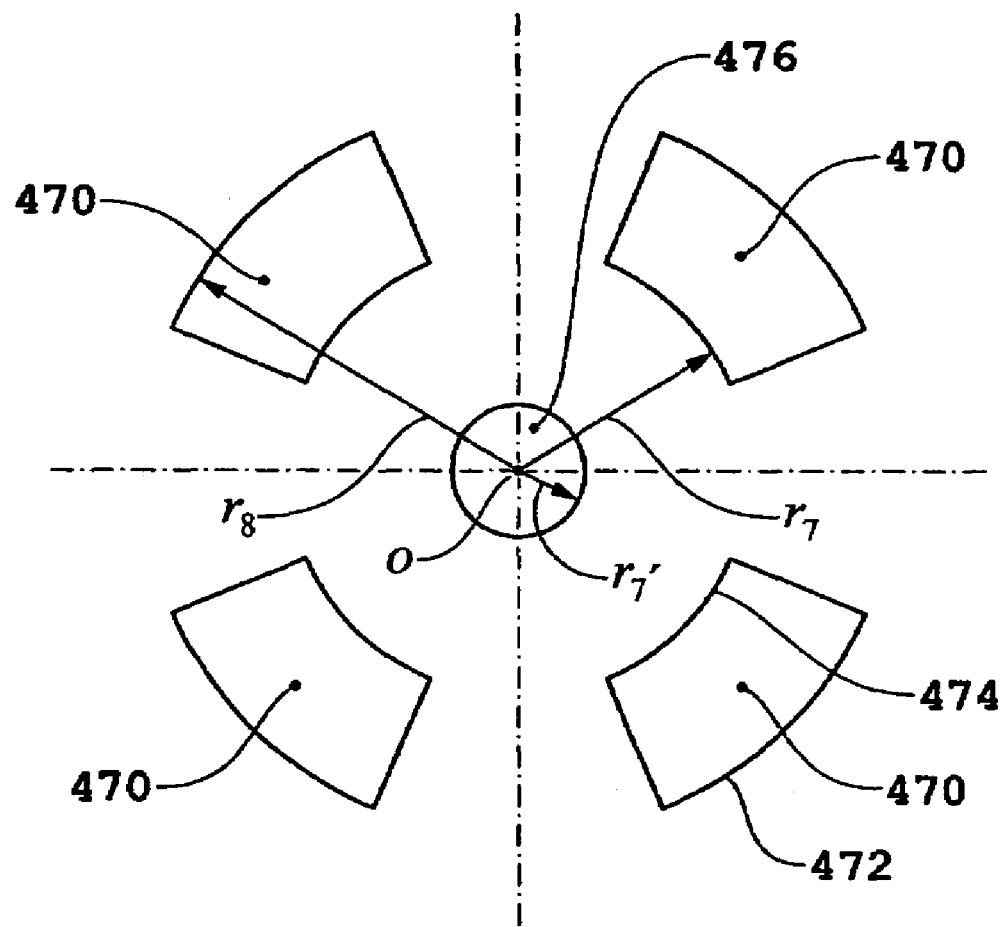
FIG. 5c is a diagram of a test object for measuring non-axial symmetric components of flare.

Test objects for non-interferometric measurements of flare are designed to generate images in a detector such as a recording medium or photon detector with the desired coherency a of the exposure beam that are conjugate images of the apertures 450, 460, and 470 shown in FIGS. 5a, 5b, and 5c, respectively. Apertures 450, 460, and 470 each comprise two-dimensional diffusers 458, 468, and 478, respectively, wherein the properties of the diffusers comprising an array of diffracting sites are selected so that each component of the diffracted beam is diffracted such as to fill the aperture of a subsequently used optical system under test [see for example the referenced discussion in Section 4.2.1 of *Laser Speckle and Related Phenomena*, Ed. J. C. Dainty, $2^{nd}$ Ed. Springer-Verlag (1984)]. The intensity of the flare is measured in areas that are conjugate images of areas indicated as numerals 456, 466, and 476 in FIGS. 5a, 5b, and 5c, respectively. The shape of aperture 450 shown in FIG. 5a is designed for measurement of the axial symmetric component of flare generated by flare of the optical system under test at a radius r where $r_3 \leq r \leq r_4$. The ratio $2(r_4-r_3)/(r_4+r_3)$ determines the radial resolution to which the flare intensity profile is measured as well as impacting on the signal-to-noise ratio to which the profile is measured. An example for the ratio is $$2\left(\frac{r_4 - r_3}{r_4 + r_3}\right) \leq \frac{1}{4}. \tag{21}$$

If higher radial resolution is desired then that determined by Eq. (21), the right hand side of Eq. (21) can be adjusted according with concomitant changes in the accuracy to which the flare is measured in a given exposure and measurement period.

The accuracy to which properties of flare are measured is increased by the use of apertures such as 450, 460, and 470 shown in FIGS. 5a, 5b, and 5c with the condition given by Eq. (21) and by measuring the flare induced signal at spots in the detector plane that are conjugate images of elements 456, 466, and 476 in the FIGS. 5a, 5b, and 5c. Ratios similar to that expressed by Eq. (21) also exist for the apertures shown in FIGS. 5b and 5c, i.e.

$$2\left(\frac{r_{m+1} - r_m}{r_{m+1} + r_m}\right) \leq \frac{1}{4} \quad (22)$$

where m=5 and 7 for FIGS. 5b and 5c, respectively.

The radii $r_m'$ of the detecting areas for m=3, 5, and 7 in FIGS. 5a, 5b, and 5c, respectively, are also selected such that $$r_m' \cong r_{m+1} - r_m. \quad (23)$$

The shapes for apertures 460 and 470 permit the detection and measurement of properties of flare that are not axial symmetric. It will be evident to one skilled in the art how to design other aperture geometries to generate and measure other spatial properties of the flare.

The regions defined by the conjugate images of the apertures 450, 460, and 470 are exposed to the extent required to generate flare intensity signals in the detecting areas that are conjugate to elements 456, 466, and 476 in the FIGS. 5a, 5b, and 5c that are measurable with the required accuracy.

Figure 5D:
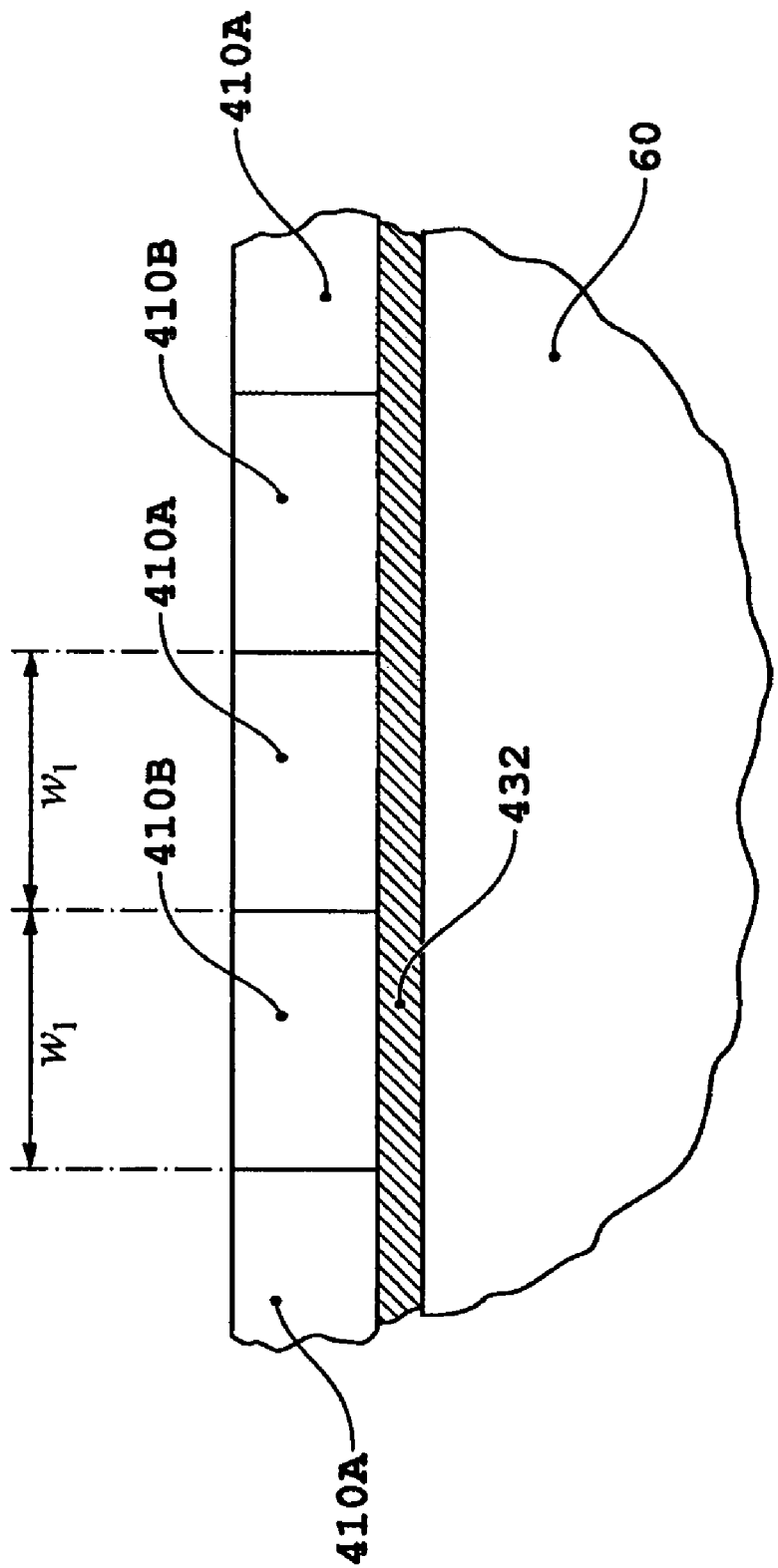
FIG. 5d is a diagram of patterned recording medium layer or photosensitive surface for use in a spatial heterodyne technique.

Procedure to Enhance Non-Interferometric Detection Efficiency of Flare: Spatial Heterodyne Technique The detection efficiency of flare may be increased in various embodiments of the present invention by several orders of magnitude, e.g. 100 or 10,000, by the use of a spatial heterodyne technique wherein a spatially patterned recording medium is used for recording elements which are conjugates of elements 456, 466, and 476 shown in FIGS. 5a, 5b, and 5c, respectively. A cross-section of a recording or photosensitive element such as 456 is shown schematically in FIG. 5d. The recording element comprises an array of recording or photosensitive elements 410A and an array of non-recording or non-photosensitive elements 410B with dimensions $w_1$ and $w_2$, respectively. The periodic array may be in the form of an array of slits or a two-dimensional array of recording elements. The writing to and the recording of flare information is analogous to recording in an optical disk.

The spatial heterodyne technique may also be implemented in various embodiments of the present invention by converting AR layer 420 shown in FIG. 4a to an array of non-AR coated and AR coated portions with dimensions $w_1$ and $w_2$, respectively, by converting AR layer 430 shown in FIG. 4a to an array of non-AR coated and AR coated portions with dimensions $w_1$ and $w_2$, respectively, or by converting reflecting layer 432 shown in FIG. 4b to an array of non-reflecting and reflecting portions with dimensions $w_1$ and $w_2$, respectively. Also the spatial heterodyne technique may also be implemented in various embodiments of the present invention by converting AR layer 420 shown in FIG. 4a to an array of non-AR or absorber coated and absorber coated portions with dimensions $w_1$ and $w_2$, respectively.

The spatial heterodyne technique transfers the information about non-coherent component of flare that comprises primarily a low spatial frequency to a high spatial frequency where the signal-to-noise ratio for detection of the information is generally higher. The dimensions $w_1$ and $w_2$ are selected to be of the order of or larger than the spatial resolution of the interferometric metrology system subsequently used to measure the exposure induced changes in the recording medium and less than the scale of the structure of the flare is to be measured. The spatial heterodyne technique is designed to take advantage of the properties of differential interferometric metrology systems such as described in referenced U.S. Provisional Patent Applications No. 60/447,254 (ZI-40), No. 60/448,360 (ZI-41), No. 60/448,250 (ZI-42), and No. 60/485,507 (ZI-52) and U.S. patent application Ser. No. 10/778,371 (ZI-40), Ser. No. 10/782,057 (ZI-41), Ser. No. 10/782,058 (ZI-42), and Ser. No. 10/886,010 (ZI-52).

The enhancement for detection of the information about non-coherent component of flare will $$\leq 2 \frac{r_m'}{w_1 + w_2} \quad (24)$$

for a two-dimensional array of recording elements that are square in cross-section and $$\leq \left(2 \frac{r_m'}{w_1 + w_2}\right)^{1/2} \text{ to } \leq 2 \frac{r_m'}{w_1 + w_2} \quad (25)$$

for a one-dimensional array of recording elements depending on the signal-to-noise ratio for detection of the low spatial frequency component in the non-spatially modulated dimension. For the example of $w_1 = w_2 = 0.5$ μm and $r_m' = 5$ mm for a two-dimensional array of recording elements, the enhancement factor given by Eq. (24) is $\leq 10^4$. For the example of $w_1 = w_2 = 0.5$ μm and $r_m' = 5$ mm for a two dimensional array of recording elements, the enhancement factor given by Eq. (24) is $\leq 100$ to 10,000.

The spatial heterodyne technique may also be used in various embodiments of the present invention to enhance sensitivity for detection of the coherent component of flare and the effects of optical aberrations on the interference term in exposure induced changes in a recording medium. The spatial heterodyne technique may be particularly valuable when using a metrology tool to detect the coherent component of flare and the effects of optical aberrations on the interference term in exposure induced changes in a recording medium when the resolution of the metrology is comparable to the spatial wavelength of the high frequency spatial components of the exposure induced chances. Instead of using a first imaging system of a confocal imaging system to project a pattern on a substrate, the spatial heterodyne technique is used to translate high spatial frequency information in the recording medium to a lower spatial frequency that can be detected efficiently by an otherwise diffraction imaging system.

Interferometric Metrology Systems

The changes in properties of the recording medium that are exposure induced can be measured for example by measuring the changes in reflective of the changes in the top surface profile or topographic profile of the recording medium. FIG. 1a is a schematic diagram of an interferometric metrology system used to make measurements of conjugated quadratures of fields of beams scattered/reflected by a substrate.

The description of the interferometric metrology system shown in FIG. 1a is the same as the corresponding portion of the description given for the interferometer system shown in FIG. 1a of referenced U.S. patent application Ser. No. 10/778,371 (ZI-40).

FIG. 1b is a schematic diagram of an interferometric non-confocal metrology system used to make measurements of conjugated quadratures of fields of beams scattered/reflected by a substrate or used in flare interferometry. The description of the interferometric metrology system shown in FIG. 1b is the same as the corresponding portion of the description given for the non-confocal interferometer system shown in FIG. 1a of commonly owned U.S. patent application Ser. No. 10/954,625 (ZI-55) entitled "Method And Apparatus For Enhanced Resolution of High Spatial Frequency Components of Images using Standing Wave Beams in Non-Interferometric and Interferometric Microscopy" by Henry A. Hill of which the contents are herein incorporated in their entirety by reference.

Figure 2A:
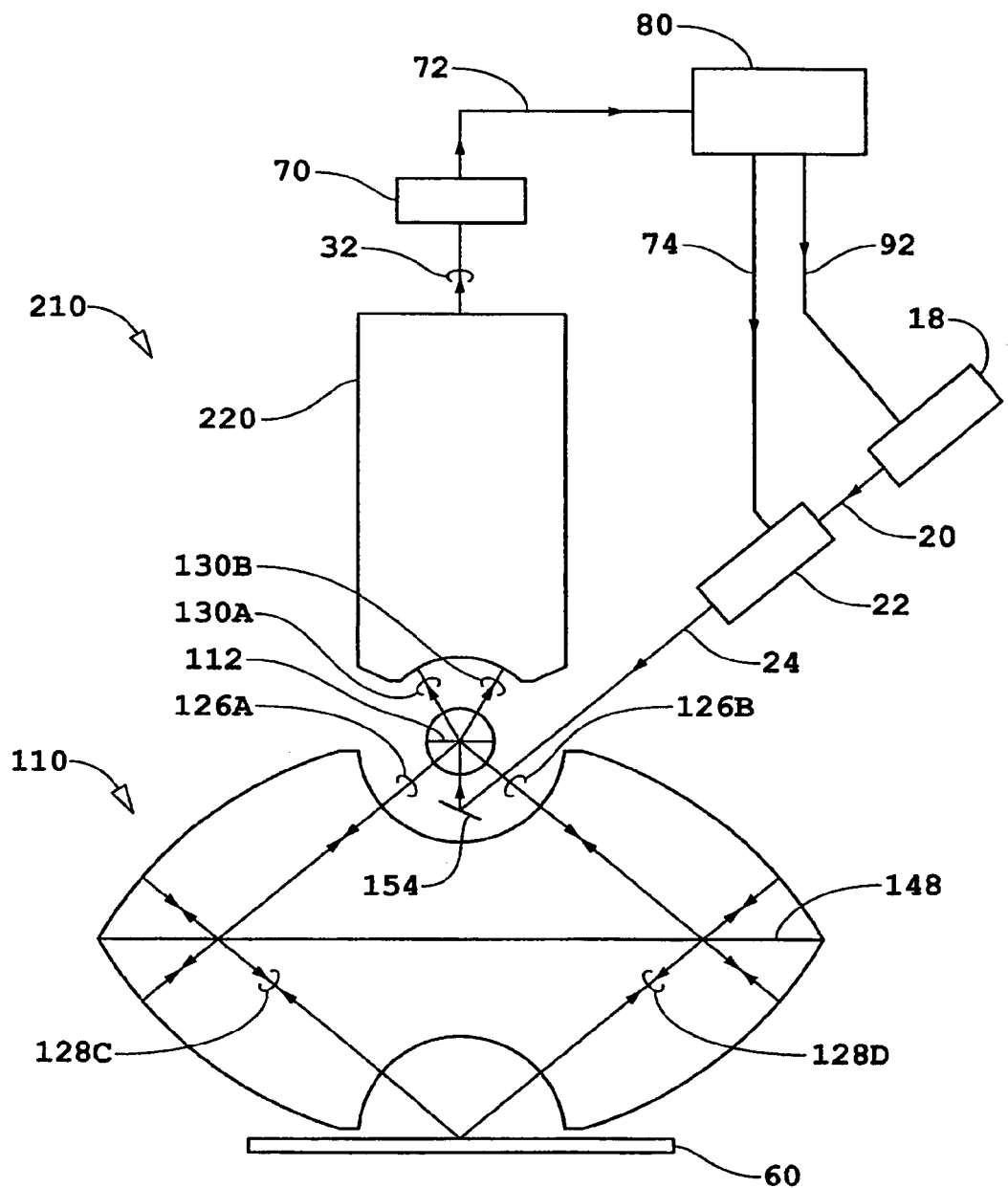
FIG. 2a is a schematic diagram of a confocal interferometric metrology system.

FIG. 2a is a schematic diagram of a confocal microscope system used in various embodiments of the present invention for measuring properties of recording media that have exposure induced changes in properties. The description of the confocal microscope system shown in FIG. 2a is the same as the corresponding portion of the description given for the interferometer system shown in FIG. 2a of cited U.S. patent application Ser. No. 10/778,371 (ZI-40).

Figure 2B:
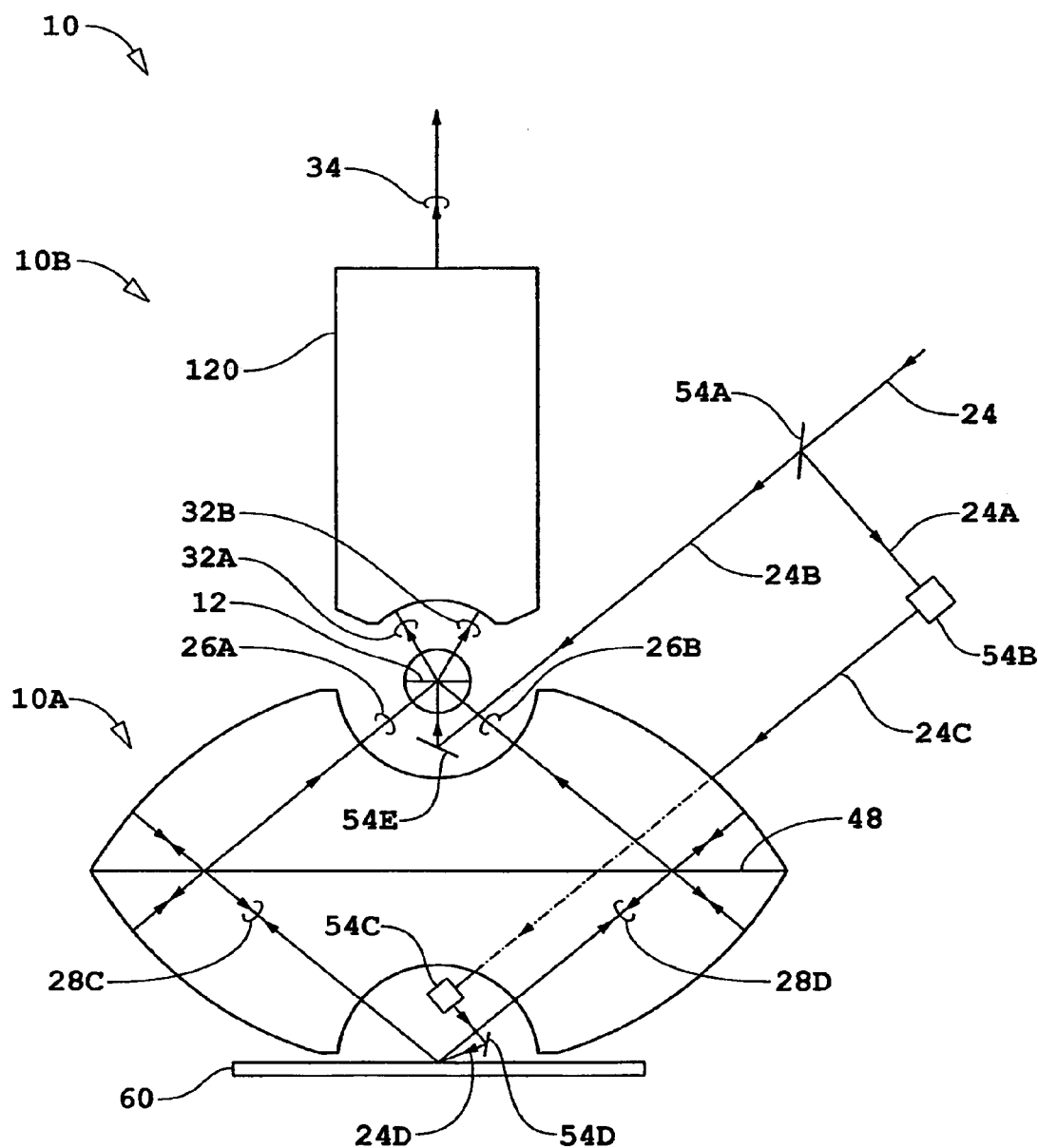
FIG. 2b is a schematic diagram of a non-confocal interferometric metrology system.

FIG. 2b a schematic diagram of a non-confocal microscope system used in various embodiments of the present invention for measuring properties of recording media that have exposure induced changes in properties. The description of the confocal microscope system shown in FIG. 2b is the same as the corresponding portion of the description given for the interferometer system shown in FIG. 1b of referenced U.S. patent application Ser. No. 10/948,959 (ZI-56).

Other interferometric metrology systems such as described in commonly owned U.S. Provisional Patent Application No. 60/670,218 (ZI-66) entitled "In Situ And Ex Situ Measurement Of In Situ Lithographic Projection Optic Aberrations And Optic Axis Location" and U.S. patent application Ser. No. 10/886,157 (ZI-53) entitled "Apparatus and Method for Ellipsometric Measurements with High Spatial Resolution" and Ser. No. 10/938,408 (ZI-54) entitled "Method And Apparatus For Enhanced Resolution of High Spatial Frequency Components of Images using Standing Wave Beams in Non-Interferometric and Interferometric Microscopy;" in referenced U.S. Provisional Patent Applications No. 60/568,774 (ZI-60), No. 60/569,807 (ZI-61), No. 60/573,196 (ZI-62), No. 60/571,967 (ZI-63), No. 60/602,999 (ZI-64), No. 60/618,483 (ZI-65), No. 60/624,707 (ZI-68), and in U.S. patent application Ser. No. 10/886,010 (ZI-52), Ser. No. 10/954,625 (ZI-55), Ser. No. 10/948,959 (ZI-56), Ser. No. 11/135,605 (ZI-62), Ser. No. 11/124,603 (ZI-63), and Ser. No. 11/208,424 (ZI-68) may be used in various embodiments of the present invention without departing from the scope and spirit of implementations of embodiments of the present invention. U.S. Provisional Patent Application No. 60/670,218 (ZI-66) and U.S. patent application Ser. No. 10/886,157 (ZI-53) and Ser. No. 10/938,408 (ZI-54) are by Henry A. Hill and the contents of each of which are herein incorporated in their entirety by reference.

An example of a lithography tool 800 using an optical system optic axis and/or optical system aberration metrology system 830 is shown in FIG. 6. The metrology system is used to precisely locate the optical system optic axis and/or measure the optical system aberrations within an exposure system. The description of the lithography tool 800 shown in FIG. 6 is the same as the corresponding portion of the description given for the lithography tool 800 shown in FIG. 7a of referenced U.S. patent application Ser. No. 11/135,605 (ZI-62).

Figure 7:
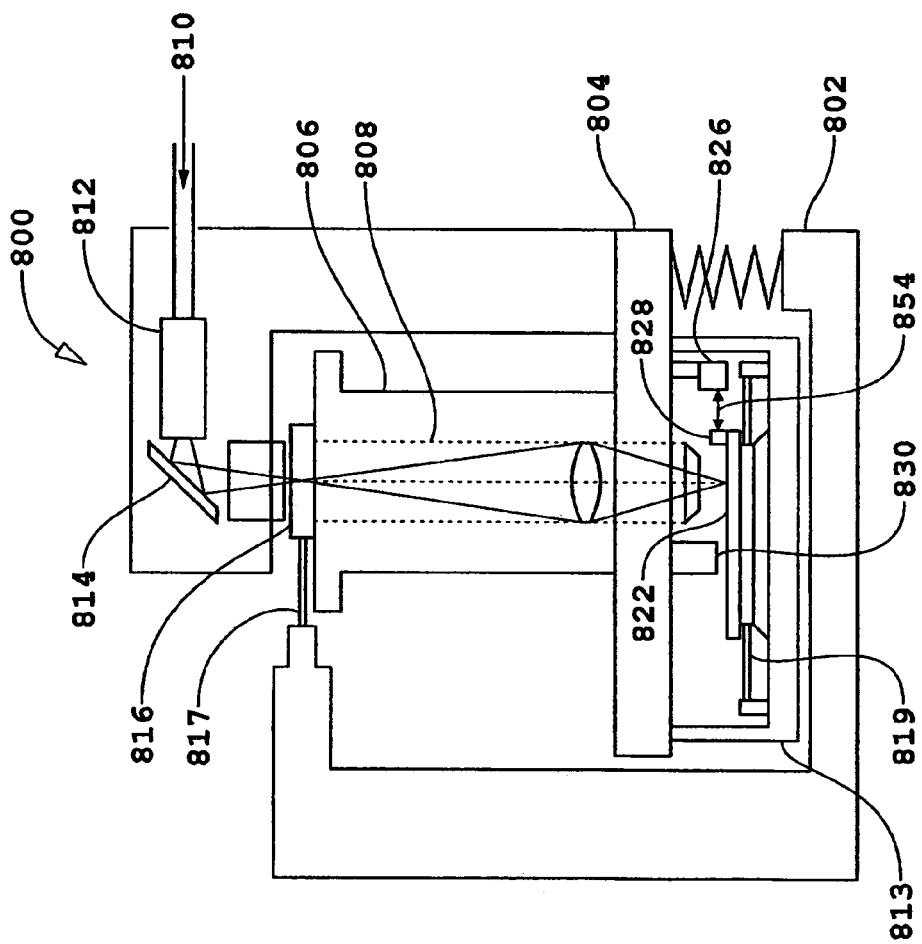
FIG. 7 is a diagram of lithography tool using a metrology system for measuring flare.
Figure 8:
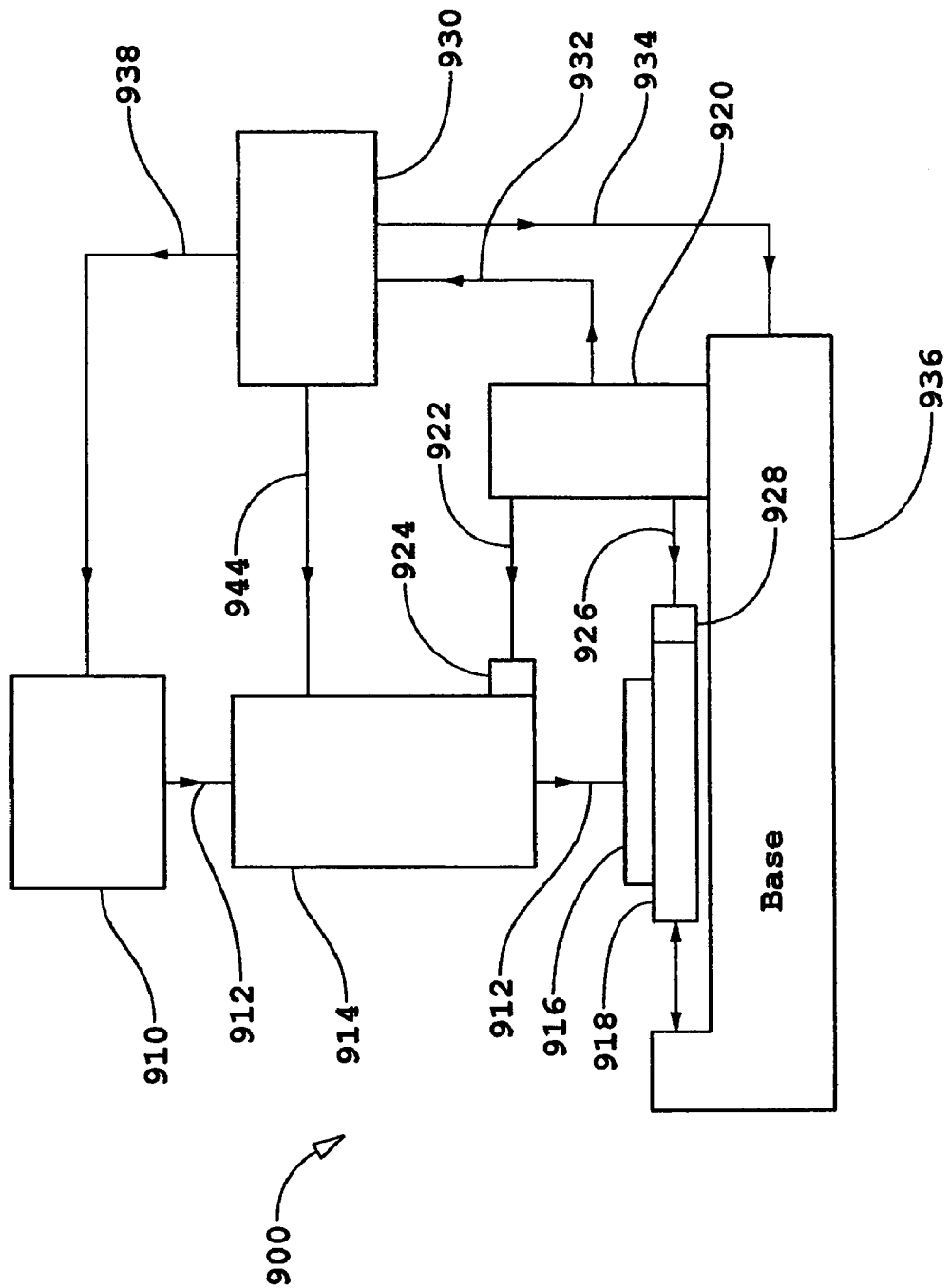
FIG. 8 is a schematic diagram of a wafer inspection system using a metrology system for measuring flare.

A schematic of a wafer inspection system 900 using an optical system optic axis and/or optical system aberration metrology system (not shown) is shown in FIG. 7. The wafer inspection system is used to precisely locate the optical system optic axis and/or measure the optical system aberrations as recorded in exposure induced changes in a recording medium ex situ with or without post exposure treatment. The description of wafer inspection system 900 shown in FIG. 7 is the same as the corresponding portion of the description given for the wafer inspection system 900 shown in FIG. 8 of referenced U.S. patent application Ser. No. 11/135,605 (ZI-62).

Other embodiments are within the following claims.

What is claimed is:

1. A point diffraction interferometer for measuring flare, said interferometer comprising:
   a source for generating a source beam;
   an optical system having an object plane and an image plane;
   an optical element including a test object located in the object plane of the optical system, said test object including an array of diffraction points for generating from the source beam an array of diffracted beams that pass through the optical system to generate a measurement beam, wherein the optical element also generates from the source beam a reference beam that is combined with the measurement beam to generate an interference pattern in the image plane of the optical system, said interference pattern representing information relating to flare of the optical system.

2. The point diffraction interferometer of claim 1, wherein the array of diffracted beams have randomized relative phases.

3. The point diffraction interferometer of claim 1, wherein the test object serves as a beam splitter to generate both the measurement beam and the reference beam, both of which pass through the optical system.

4. The point diffraction interferometer of claim 2, wherein the test object includes an aperture and a diffuser aligned with the aperture, wherein the aperture in combination with the diffuser generates the array of diffracted beams having randomized relative phases.

5. The point diffraction interferometer of claim 4, wherein the test object includes a second aperture annularly arranged around the first aperture.

6. The point diffraction interferometer of claim 5, wherein the second aperture generates the reference beam from the source beam.

7. The point diffraction interferometer of claim 2, wherein the test object includes a first aperture and a second aperture annularly arranged around the first aperture.

8. The point diffraction interferometer of claim 7, wherein the test object further comprises a diffuser aligned with the second aperture.

9. The point diffraction interferometer of claim 8, wherein the first aperture generates the reference beam from the source beam.

10. The point diffraction interferometer of claim 8, wherein the second aperture in combination with the diffuser generates the array of diffracted beams from the source beam.

11. The point diffraction interferometer of claim 1, wherein the optical element further includes a beam splitter that is positioned to receive the source beam and generate therefrom the reference beam and an input beam which is directed to the test object and from which the array of diffracted beams is produced.

12. The point diffraction interferometer of claim 1, further comprising a detector system positioned in the image plane of the optical system for receiving the interference pattern.

13. The point diffraction interferometer of claim 12, wherein the detector system comprises a recording medium in which the interference pattern produces exposure-induced changes.

14. The point diffraction interferometer of claim 1, further comprising an aperture array located in the image plane of the optical system and onto which the interference pattern is projected.

15. The point diffraction interferometer of claim 14, wherein the aperture array further comprises a fluorescent material aligned with the apertures of the array.

16. The point diffraction interferometer of claim 14, further comprising a detector and a second optical system that images the aperture array onto the detector.

17. An apparatus for measuring flare, said apparatus comprising:
a source for generating a source beam;
an optical system having an object plane and an image plane;
an optical element including a test object located in the object plane of the optical system, said test object including an array of diffraction points for generating from the source beam an array of diffracted beams that pass through the optical system to generate a measurement beam that is projected onto the image plane as a conjugate image of the test object, wherein the conjugate image of the test object includes flare-related information for the optical system.

18. The apparatus of claim 17, wherein the optical element also generates from the source beam a reference beam that is combined with the measurement beam to generate an interference pattern in an image plane of the optical system, said interference pattern representing information relating to flare of the optical system.

19. The apparatus of claim 18, further comprising a detector system which detects the interference pattern to produce an interference signal from which flare-related information for the optical system is derived.

20. A method for measuring information relating to flare of an optical system having an object plane and an image plane, said method comprising:
generating a source beam;
positioning a test object in the object plane of the optical system, said test object including an array of diffraction points;
directing at least a portion of the source beam onto the test object to generate an array of diffracted beams from the array of diffraction points;
passing the array of diffracted beams through the optical system to generate a measurement beam;
generating from the source beam a reference beam; and
combining the reference beam with the measurement beam to produce an interference pattern in the image plane of the optical system, said interference pattern representing information relating to flare of the optical system.

21. The method of claim 20, further comprising computing information about flare of the optical system from information derived from the interference pattern.

22. The method of claim 20, wherein the test object serves to generate both the measurement beam and the reference beam, and further comprising passing the reference beam through the optical system.

23. The method of claim 20, wherein the test object includes an aperture and a diffuser aligned with the aperture, wherein the aperture in combination with the diffuser generates the array of diffracted beams, said array of diffracted beams having randomized relative phases.

24. The method of claim 23, wherein the test object includes a second aperture annularly arranged around the first-mentioned aperture.

25. The method of claim 24, wherein the second aperture generates the reference beam from the source beam.

26. The method of claim 20, wherein the test object includes a first aperture and a second aperture annularly arranged around the first aperture.

27. The method of claim 26, wherein the test object further comprises a diffuser aligned with the second aperture and wherein the first aperture generates the reference beam from the source beam and the second aperture in combination with the diffuser generates the array of diffracted beams from the source beam.

28. A method for measuring flare-related information for an optical system having an object plane and an image plane, said method comprising:
generating a source beam;
sequentially positioning each of a plurality of test objects in the object plane of the optical system, each of said test objects of the plurality of test objects including a diffraction point;
generating a reference beam from the source beam;
for each of the test objects, (a) directing at least a portion of the source beam onto the test object that is positioned in the object plane to generate a diffracted beam from the diffraction point;
(b) passing the diffracted beam through the optical system to generate a measurement beam; and
(c) combining the reference beam with the measurement beam to produce an interference pattern in the image plane of the optical system; and
from the interference patterns for the plurality of test objects computing information related to flare produced by the optical system.

29. The method of claim 28, wherein each test object of the plurality of test objects includes an array of diffracting points of which the first-mentioned diffraction point for that test object is a member and directing at least a portion of the source beam onto the test object that is positioned in the object plane generates an array of diffracted beams from the array of diffraction points.

30. The method of claim 28, further comprising detecting the inference pattern to produce an array of interference signals.

31. The method of claim 30, further comprising for each test object of the plurality of test objects, taking $N_2$ measurements of the array of interference signals, where $N_2$ is an integer that is larger than 1.

32. The method of claim 31, further comprising selecting $N_2$ to be large enough so that that a relative error due to statistical errors in average values is less than some predetermined value.

33. The method of claim 31, further comprising using the $N_2$ measurements of the array of interference signals for each test object to compute an array of averages for each test object.

34. The method of claim 31, further comprising using the $N_2$ measurements of the array of interference signals for the plurality of test objects to compute an average of absolute values of real and imaginary components of an array of signals derived from the interference signals.

35. The method of claim 31, further comprising based at least in part on the $N_2$ measurements of the array of interference signals for the plurality of test objects, computing a modulus of complex amplitude of flare generated by the optical system.

* * * * *